(12) United States Patent
Williams et al.

(10) Patent No.: US 7,276,431 B2
(45) Date of Patent: Oct. 2, 2007

(54) METHOD OF FABRICATING ISOLATED SEMICONDUCTOR DEVICES IN EPI-LESS SUBSTRATE

(75) Inventors: Richard K. Williams, Cupertino, CA (US); Michael E. Cornell, Campbell, CA (US); Wai Tien Chan, Regentville (HK)

(73) Assignees: Advanced Analogic Technologies, Inc., Sunnyvale, CA (US); Advanced Analogic Technologies (Hong Kong) Limited, Hong Kong (CN)

( * ) Notice: Subject to any disclaimer, the term of this patent is extended or adjusted under 35 U.S.C. 154(b) by 20 days.

(21) Appl. No.: 11/067,212

(22) Filed: Feb. 25, 2005

(65) Prior Publication Data

US 2005/0142724 A1    Jun. 30, 2005

Related U.S. Application Data

(63) Continuation of application No. 10/218,668, filed on Aug. 14, 2002, now Pat. No. 6,900,091.

(51) Int. Cl.
*H01L 21/04* (2006.01)
*H01L 21/336* (2006.01)

(52) U.S. Cl. .................. 438/510; 438/511; 438/199; 438/302; 438/305; 438/306; 438/307; 438/217; 438/224; 438/512; 438/513; 438/514; 438/515; 438/516; 438/517; 438/518; 438/519; 438/520; 438/521; 438/522; 438/523; 257/492; 257/493; 257/E21.087

(58) Field of Classification Search ........ 438/510–569, 438/199, 302, 305–307, 217, 224; 257/492–493
See application file for complete search history.

(56) References Cited

U.S. PATENT DOCUMENTS 3,891,469 A    6/1975    Moriyama et al. .......... 438/447

(Continued)

FOREIGN PATENT DOCUMENTS

EP    1357598    10/2003

(Continued)

OTHER PUBLICATIONS

Contiero et al., "LDMOS Implemenatation By Large Tilt Implant In 0.6 μm BCD5 Process, Flash Memory Compatible," IEEE (1996) pp. 75-78.

(Continued)

*Primary Examiner*—Michael Lebentritt
*Assistant Examiner*—Mohsen Ahmadi
(74) *Attorney, Agent, or Firm*—David E. Steuber

(57) ABSTRACT

An structure for electrically isolating a semiconductor device is formed by implanting dopant into a semiconductor substrate that does not include an epitaxial layer. Following the implant the structure is exposed to a very limited thermal budget so that dopant does not diffuse significantly. As a result, the dimensions of the isolation structure are limited and defined, thereby allowing a higher packing density than obtainable using conventional processes which include the growth of an epitaxial layer and diffusion of the dopants. In one group of embodiments, the isolation structure includes a deep layer and a sidewall which together form a cup-shaped structure surrounding an enclosed region in which the isolated semiconductor device may be formed. The sidewalls may be formed by a series of pulsed implants at different energies, thereby creating a stack of overlapping implanted regions.

1 Claim, 67 Drawing Sheets

U.S. PATENT DOCUMENTS

| | | | |
|---|---|---|---|
| 4,466,178 A | 8/1984 | Soclof | 438/337 |
| 4,987,093 A | 1/1991 | Teng et al. | 438/450 |
| 5,019,520 A | 5/1991 | Komori et al. | 438/289 |
| 5,055,417 A | 10/1991 | Akcasu | 428/133 |
| 5,108,783 A | 4/1992 | Tanigawa et al. | 437/63 |
| 5,160,996 A | 11/1992 | Odanaka | 257/375 |
| 5,286,995 A | 2/1994 | Malhi | 257/549 |
| 5,420,061 A | 5/1995 | Manning | 438/218 |
| 5,478,759 A | 12/1995 | Mametani et al. | 438/228 |
| 5,478,761 A | 12/1995 | Komori et al. | 438/228 |
| 5,501,993 A | 3/1996 | Borland | 438/228 |
| 5,569,620 A | 10/1996 | Linn et al. | 437/62 |
| 5,573,963 A | 11/1996 | Sung | 438/217 |
| 5,643,822 A | 7/1997 | Furukawa et al. | 438/421 |
| 5,668,755 A | 9/1997 | Hidaka | 365/182 |
| 5,693,505 A | 12/1997 | Kobayashi | 438/217 |
| 5,698,458 A | 12/1997 | Hsue et al. | 438/451 |
| 5,798,295 A | 8/1998 | Hoover et al. | 438/533 |
| 5,811,334 A | 9/1998 | Buller et al. | 438/264 |
| 5,817,546 A | 10/1998 | Ferla et al. | 438/138 |
| 5,898,007 A | 4/1999 | Lee | 438/514 |
| 5,930,642 A | 7/1999 | Moore et al. | 438/407 |
| 5,966,599 A | 10/1999 | Walker et al. | 438/228 |
| 6,017,787 A | 1/2000 | Chittipeddi et al. | 438/228 |
| 6,054,374 A | 4/2000 | Gardner et al. | 438/528 |
| 6,072,216 A | 6/2000 | Williams et al. | 257/339 |
| 6,096,625 A | 8/2000 | Daniel et al. | 438/473 |
| 6,177,333 B1 | 1/2001 | Rhodes | 438/433 |
| 6,184,557 B1 | 2/2001 | Poplevine et al. | 257/358 |
| 6,251,757 B1 | 6/2001 | Yu | 438/528 |
| 6,297,119 B1 * | 10/2001 | Tsutsui et al. | 438/322 |
| 6,359,317 B1 | 3/2002 | Carroll et al. | 257/370 |
| 6,365,447 B1 | 4/2002 | H'ebert et al. | 438/203 |
| 6,391,700 B1 | 5/2002 | Tsay | 438/224 |
| 6,391,754 B1 | 5/2002 | Paranjpe | 438/592 |
| 6,406,974 B1 * | 6/2002 | Wu et al. | 438/420 |
| 6,413,827 B2 | 7/2002 | Farrar | 438/296 |
| 6,476,457 B2 | 11/2002 | Oh | 257/492 |
| 6,495,896 B1 * | 12/2002 | Yaegashi et al. | 257/500 |
| 6,501,131 B1 | 12/2002 | Divakaruni et al. | 257/344 |
| 6,586,297 B1 | 7/2003 | U'Ren et al. | 438/235 |
| 6,599,782 B1 | 7/2003 | Kikuchi | 438/147 |
| 6,617,217 B2 | 9/2003 | Nandakumar et al. | 438/298 |
| 6,630,699 B1 | 10/2003 | Wylie | 257/288 |
| 6,885,080 B2 | 4/2005 | Chen et al. | 257/510 |
| 6,897,520 B2 | 5/2005 | Vora | 257/316 |
| 6,900,091 B2 | 5/2005 | Williams et al. | |
| 2002/0098638 A1 * | 7/2002 | Yaegashi et al. | 438/217 |
| 2004/0259318 A1 | 12/2004 | Williams et al. | 438/294 |
| 2005/0014324 A1 | 1/2005 | Williams et al. | |
| 2005/0014329 A1 | 1/2005 | Williams et al. | |
| 2005/0142791 A1 | 6/2005 | Williams et al. | |
| 2005/0142792 A1 | 6/2005 | Williams et al. | |
| 2005/0158939 A1 | 7/2005 | Williams et al. | |
| 2006/0223257 A1 | 10/2006 | Williams et al. | 438/202 |

FOREIGN PATENT DOCUMENTS

| | | |
|---|---|---|
| GB | 2320812 | 7/1998 |
| JP | 2000 11436 A | 4/2000 |
| WO | WO 02/052649 | 7/2002 |
| WO | WO 03/054950 | 7/2003 |

OTHER PUBLICATIONS

Kurol et al., "Bipolar Transistor with a Buried Layer Formed by High-Energy Ion Implantation for Subhalf-Micron Bipolar-Complementary Metal Oxide Semiconductor LSls," Jpn. J. Appl. Phys., vol. 33 (1994) No. 1B, Jan. 1994, pp. 541-545.

* cited by examiner

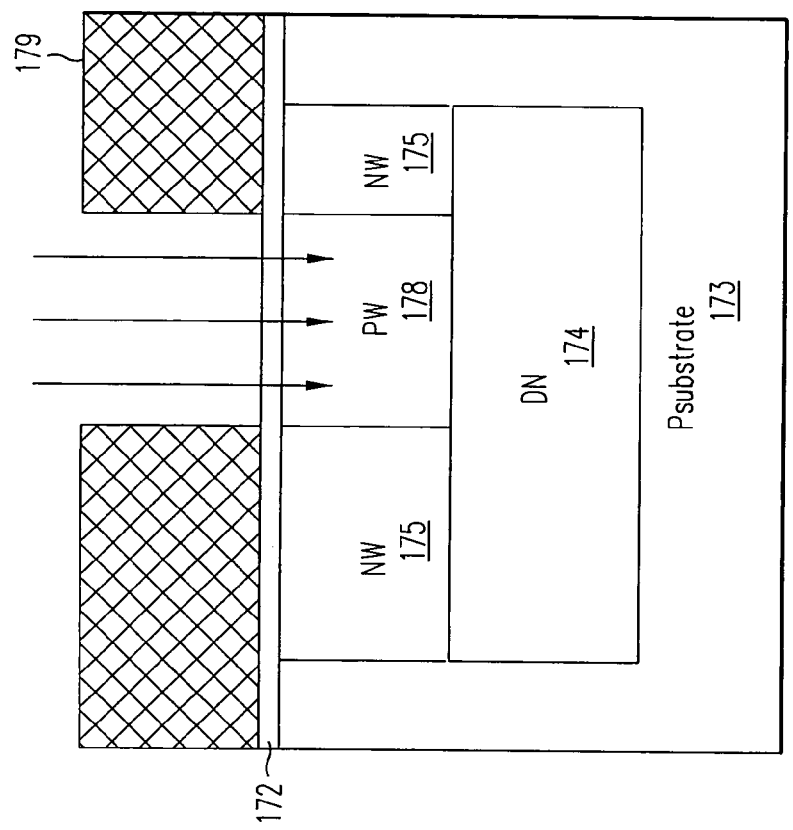
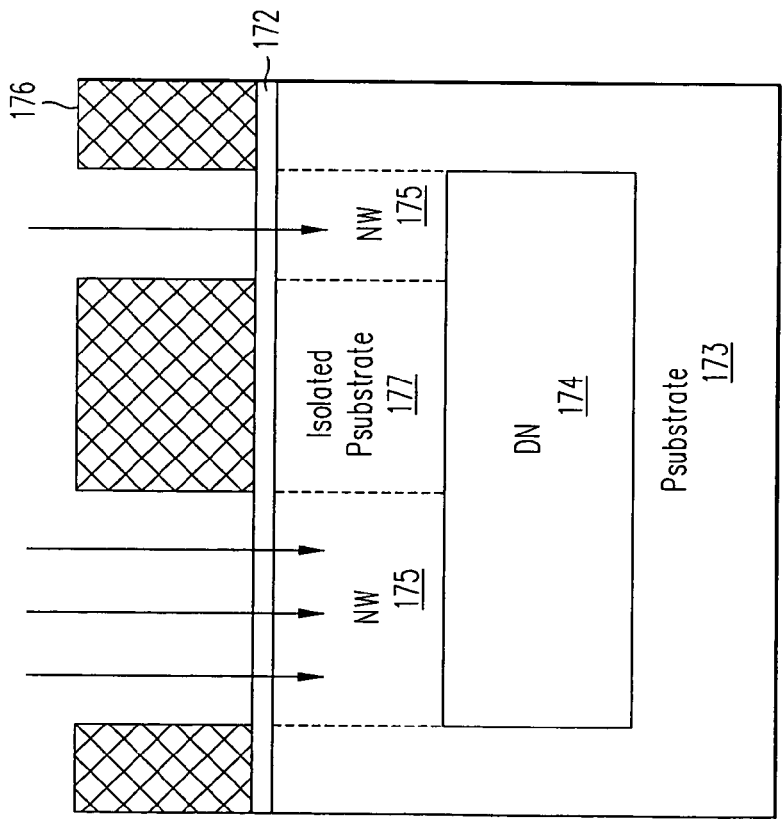
FIG. 8E
FIG. 8D

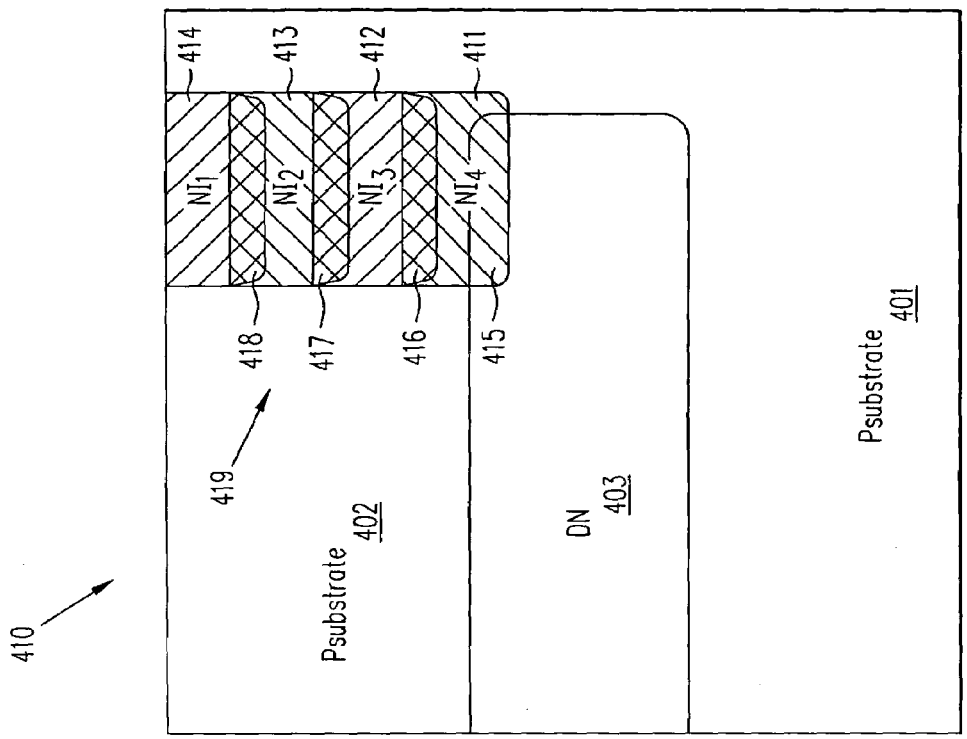
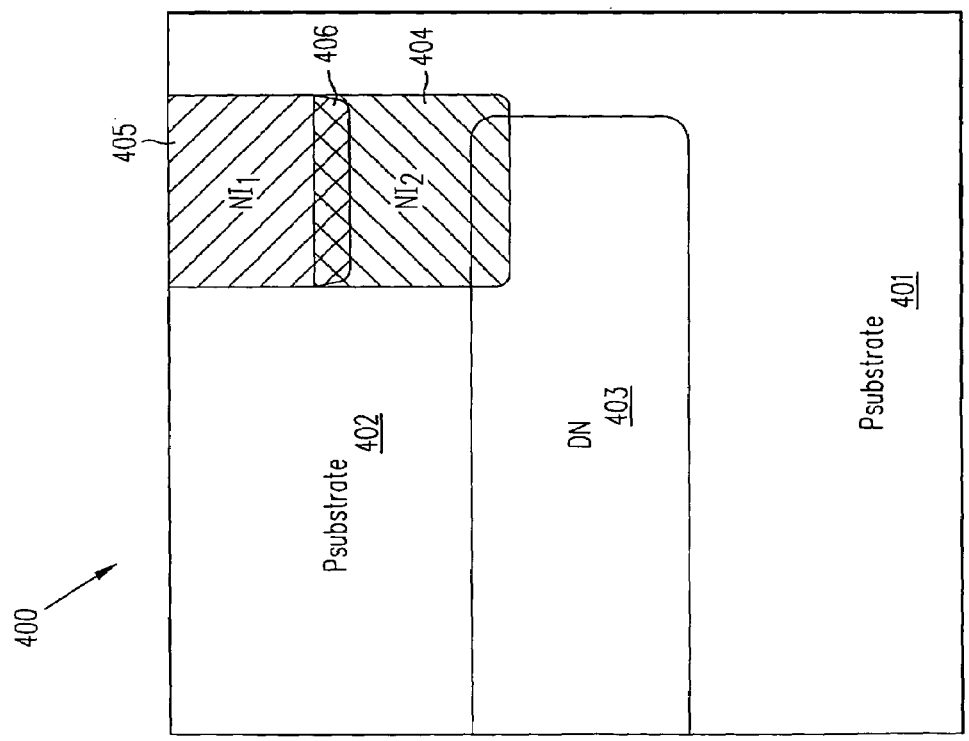
FIG. 18B
FIG. 18A

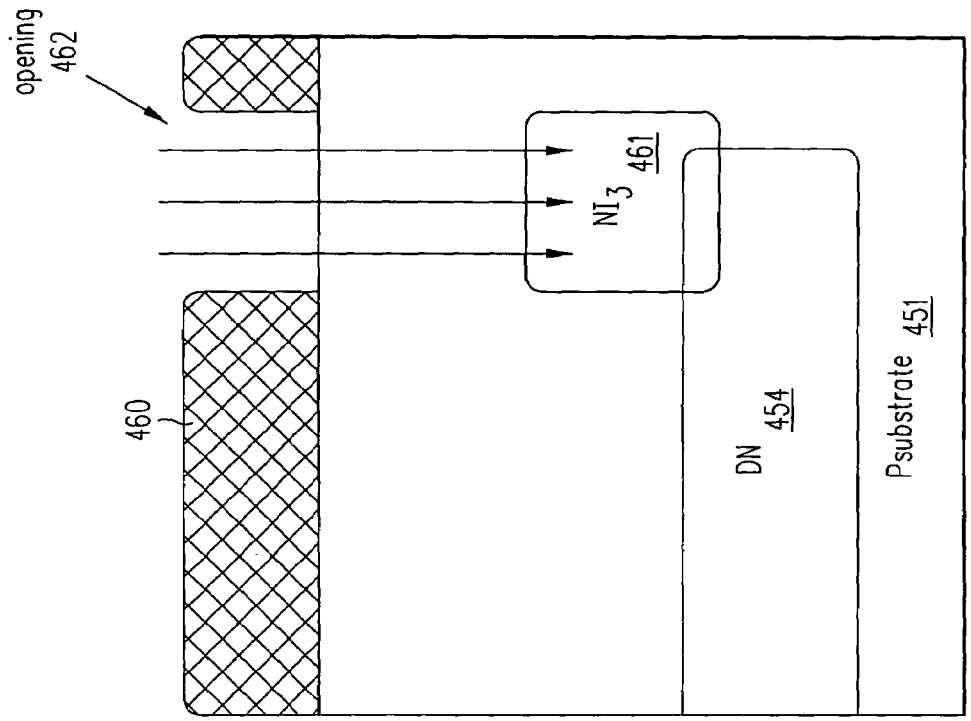
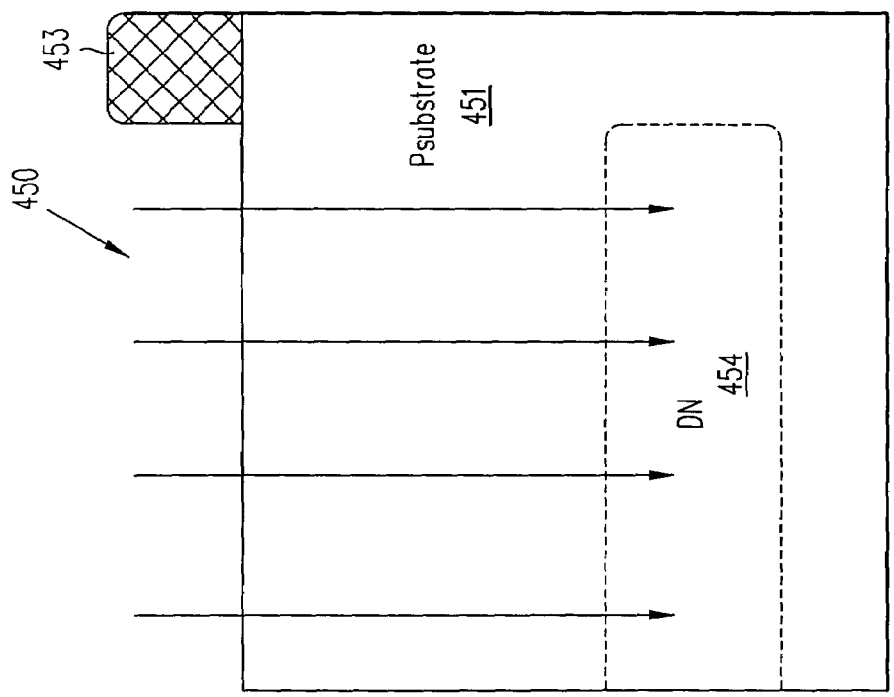

METHOD OF FABRICATING ISOLATED SEMICONDUCTOR DEVICES IN EPI-LESS SUBSTRATE

This application is a continuation of Application Ser. No. 10/218,668, filed Aug. 14, 2002 now U.S. Pat. No. 6,900,091.

FIELD OF THE INVENTION

This invention relates to semiconductor device technology and in particular to complementary metal-oxide-silicon (MOS) devices that are electrically isolated from each other and from the substrate in which they are formed.

BACKGROUND OF THE INVENTION

In the development of complementary MOS (CMOS) devices, there has been a continual effort to fit more devices into a given area of a semiconductor wafer. FIGS. 1–5 illustrate several stages of that development.

FIG. 1A illustrates a standard CMOS structure that would normally be used in devices having a feature size of 1.2 μm or larger. CMOS 10 includes a P-channel MOSFET 10a and an N-channel MOSFET 10b and is formed in a P substrate 11. Typically, many other NMOSFETs and PMOSFETs would be formed in P substrate 11. P-channel MOSFET 10a is formed in an N-well 14, which is formed by a conventional implant and extended diffusion process. Thus N-well 14 is implanted into a relatively shallow depth of substrate 11 and expands both vertically and horizontally when exposed to a thermal process.

MOSFETs 10a and 10b are both lateral devices and include gates 12a, 12b, respectively, that are separated from the substrate 11 by a gate oxide layer 16. PMOSFET 10a includes a P+ source region 13a, a P+ drain region 13b and an N+ contact region 13c, which is used to make contact with N-well 14. NMOSFET 10b includes an N+ source region 14a, an N+ drain region 14b and a P+ contact region 14c, which is used to make contact with P substrate 11, which is the body of NMOSFET 10b, via a metal contact 18. The channel regions under the gates 12a, 12b may or may not contain a threshold adjustment implant.

Metal contact 18 is tied to the most negative voltage in the system, which is normally ground. Therefore, CMOS 10 cannot operate at voltages very far above ground. Moreover, NMOSFET 10b shares a common body terminal with any other NMOSFET in CMOS 10, and any currents or noise that are injected into substrate 11 are coupled to NMOSFET 10b and any other NMOSFETs in the device, since the NMOSFETs are not isolated.

In CMOS 10, the doping concentration of substrate 11 must be designed to set the electrical characteristics of NMOSFET 10b. This limitation is ameliorated in CMOS 20, shown in FIG. 1B, where NMOSFET 10b is formed in a P-well 21. The main purpose of forming NMOSFET 10b in P-well 21, however, is to control the breakdown and punch-through characteristics of NMOSFET 10b. Since there is no PN junction between P substrate 11 and P-well 21, NMOSFET 10b still shares the same body with any other NMOSFET in CMOS 20 and any other substrate-connected device, since the body terminal of NMOSFET 10b is electrically common with P-substrate 11 and since N+ regions 14a and 14b cannot be biased to large voltages above the potential of P-substrate 11.

FIG. 1C illustrates in general a process that can be used to fabricate CMOS 20. The process starts with the formation of a field oxide layer on P substrate 11. The substrate is masked, and N-well 14 is formed by an implant and diffusion of phosphorus. The substrate is again masked, and P-well 21 is formed by an implant and diffusion of boron.

Next, there are two variations of the process. In one, the active device areas are defined by a mask and the field oxide layer is etched from the active device areas. In the other, the field oxide layer is stripped and a pad oxide layer is thermally grown. Field oxide regions are formed by a conventional LOCOS process, which includes defining the active device areas by patterning a nitride layer and etching the nitride layer from the areas where field oxide is to be grown. A blanket phosphor implant is performed to form an N field deposition (NFD), and a mask is formed to define areas where boron will be implanted to form a P-field deposition (PFD). The field oxide regions are then formed in areas where the nitride layer has been removed, the nitride layer is stripped, and a sacrificial oxide layer is grown and stripped to repair crystal damage and remove any silicon nitride residues that might impair the proper growth of the gate oxide.

A gate oxide layer is then deposited, and a polysilicon layer is deposited, doped, masked and etched to form the gates of the MOSFETs. The source and drain regions of PMOSFET 10a are formed by masking the substrate and implanting boron, and the source and drain regions of NMOSFET 10b are formed by masking the substrate and implanting phosphorus and/or arsenic. An anneal is applied to drive in the boron and phosphorus/arsenic implants.

A conventional interconnect formation process is then performed, including the deposition and etching of glass layers and the deposition (sputtering) of metal layers that contact the source, drain and body regions of PMOSFET 10a and NMOSFET 10b.

FIG. 2A shows a CMOS 30 that is produced using a more modern process that is capable of fabricating devices with a smaller gate dimension. N-well 14 contains a PMOSFET 30a and P-well 21 contains an NMOSFET 21. N-well 14 and P-well 21 are formed as complements of each other, i.e. the entire surface of substrate 11 is occupied by either an N-well 14 or a P-well 21. An oxide sidewall spacer 19 is formed on gates 12a, 12b. Oxide sidewall spacer inhibits the implanting of high-concentration dopant into substrate 11 thereby forming lightly-doped P− regions 33a, 33b adjacent the source and drain regions 13a, 13b in PMOSFET 30a and lightly-doped N− regions adjacent the source and drain regions 14a, 14b in NMOSFET 30b. A silicide layer 32 is formed on top of gates 12a, 12b. CMOS 30 is a non-isolated, twin well CMOS that represents the majority of CMOS devices in the 0.25 μm to 1.2 μm range. Like NMOSFET 10b shown in FIG. 1B, NMOSFET 30b shares a common body region with all other NMOSFETs in CMOS 30. Therefore, NMOSFET 30b must be biased near ground and is sensitive to any noise that may appear in P substrate 11.

CMOS 40, shown in FIG. 2B, is similar to CMOS 30 but is formed in a lightly-doped P− epitaxial (epi) layer 41 that is in turn grown on a heavily-doped P+ substrate 42. This is generally done to improve the latch-up characteristics of the device by preventing lateral voltage drops along the substrate. Heavily-doped P+ substrate 40 has a lower resistivity that the P− substrate 11 shown in FIG. 2A. This is an indication of the problems that can occur in non-isolated devices that share a lightly-doped common body region. While the heavily-doped substrate can reduce latch-up in a normal digital IC, it does not offer sufficient protection against latch-up in power and high-current ICs.

"Epitaxial" refers to the growth of a single-crystal semiconductor film on a single-crystal substrate of the same semiconductor. The word "epitaxial" is derived from the Greek meaning "arranged upon". See, A. S. Grove, *Physics and Technology of Semiconductor Devices*, John Wiley & Sons (1967), pp 7–20.

FIG. 2C illustrates a process that can be used to fabricate CMOS devices 30 and 40. In the case of CMOS 30 the process starts with P− substrate 11; in the case of CMOS 40 the process starts with P+ substrate 42 and includes growing P− epi layer 41 on top of P+ substrate 42. The complementary well formation and LOCOS field oxide formation are substantially the same as the processes described in FIG. 1C. The gate formation includes the formation of a metal layer by chemical vapor deposition on top of the polysilicon gate, followed by a silicidation process.

Following the gate formation, the substrate is masked and phosphorus is implanted to form lightly-doped N− regions 34a, 34b. The mask is removed and another mask is formed to define the lightly-doped P− regions 33a, 33b. $BF_2$ is implanted to form P− region 33a, 33b. The sidewall oxide or glass is then deposited and etched to form sidewall spacers 38a, 38b, 39a and 39b.

The substrate is masked and arsenic is implanted to form N+ regions 14a, 14b. The substrate is masked again and $BF_2$ is implanted to form regions 13a, 13b. An anneal is performed to drive in the dopants.

The interconnect formation includes the deposition of two Al—Cu layers with intervening dielectric layers. A rapid thermal anneal (RTA) is performed, a glass layer is deposited, patterned and etched, and a Ti or TiN adhesion layer is deposited on the glass before the first Al—Cu layer. Typically, the glass layer such as spin-on glass or BPSG is planarized by etchback or chemical-mechanical polishing (CMP) prior to patterning. The deposition of the second glass layer is followed by a via mask and etch, a tungsten deposition and etchback and the deposition of the second Al—Cu layer. The second glass layer, which may be a chemical vapor deposition (CVD) layer with TEOS as a precursor or a spin-on glass (SOG) layer, should be formed at a low temperature to avoid melting the first metal layer. The tungsten plug is typically used to planarize the via hole prior to the deposition of the second metal layer. The planarization is carried out by etchback or CMP.

FIG. 3A illustrates a substantially different approach to the fabrication of a CMOS device, using technology that evolved from the fabrication of bipolar devices. CMOS 50 includes an NMOSFET 50a, formed in a P-well 56, and a PMOSFET 50b, formed in an N-well 55. P-well 56 and N-well 55 are formed in an N− epi layer 52 that is grown over a P substrate 51. NMOSFET 50a includes an N+ source region 60a and an N+ drain region 60b. Lightly-doped N regions 62a, 62b are formed adjacent to regions 60a, 60b, respectively. A gate is formed over a gate oxide layer 65, and a silicide layer 59 is deposited on the gate. Contact to P-well 56 is made via a P+ region 61c.

PMOSFET 50b includes a P+ source region 61b and a P+ drain region 61a. Lightly-doped P regions 63a, 63b are formed adjacent to regions 61a, 61b, respectively. A gate is formed over gate oxide layer 65, and silicide layer 59 is deposited on the gate. Contact to N-well 55 is made via an N+ region 60c.

Regions of N-epi layer 52 are isolated from each other by stacks of P diffusions, such as the stack containing a P buried layer 53 and P-well 56, which are implanted at the top and bottom of N-epi layer 52 and then heated so as to cause them to diffuse upward and downward until they merge. The "thermal budget" (i.e., the product of temperature and time) that is necessary to cause P buried layer 53 and P-well 56 to diffuse in this way is substantial and ends up setting many of the electrical characteristics of the arrangement. Moreover, P buried layer 53 and P-well 56 also diffuse in a lateral direction, and this limits the packing density of the devices.

FIG. 3B illustrates a variation in which N buried layer 54 has been replaced by a hybrid N buried layer 71 in a CMOS device 70. N buried layer 71 is generally doped with phosphorus but contains a central region 72 that is doped with antimony. The phosphorus-doped portion of N buried layer 71 has diffused upward to merge with N-well 55, eliminating the intervening segment of N-epi layer 52 that is shown in CMOS device 50 of FIG. 3A. This provides a low-resistance path to N-well 55 and helps to prevent latch-up resulting from lateral voltage drops in N-well 55. Nonetheless, P-well 56 is still electrically tied to P-substrate 51, creating the limitations and problems described above.

FIGS. 3C–3E are graphs of doping concentration versus depth into the substrate at the cross sections indicated in FIGS. 3A and 3B. As these graphs suggest, the processes required to form these CMOS devices are highly susceptible to variations in such parameters as epitaxial thickness, diffusivity and temperature, and in addition they tend to be quite expensive, requiring long processing times and dedicated high-temperature diffusion furnaces. The process shown, moreover, requires the P-type buried layer, the arsenic N-type buried layer and the phosphorus N-type buried layer each to have its own dedicated mask, making the process even more expensive.

FIG. 4A is a schematic circuit diagram of CMOS devices 50a and 50b, shown in FIGS. 3A and 3B, respectively. Substrate 51 is shown as ground. PMOSFET 50b is shown as isolated from ground by diode 97, which represents the PN junction between P− substrate 51 and N buried layer 71. Diodes 95 and 96 represent the junctions between P+ source region 61b and P+ drain region 61a, respectively, and N well 55. NMOSFET 50a is shown as non-isolated. Diodes 92 and 93 represent the junctions between N+ drain region 60b and N+ source region 60a, respectively, and P well 56.

FIG. 4B illustrates a PNP bipolar transistor that can also be formed from this process. P+ region could be the emitter, N well 55 and N buried layer 71 could be the base, and P substrate 51 could be the collector.

FIG. 5A shows a CMOS device 100 that contains three buried layers: an N buried layer 103 (NBL2) of phosphorus underlying N well 104, a P buried layer 106 underlying P well 105, and an N buried layer 102 (NBL1) of antimony (or arsenic) that extends continuously under N well 104 and P well 105. PMOSFET 100a and NMOSFET 100b are similar to PMOSFET 50a and NMOSFET 50b shown in FIGS. 3A and 3B.

Extending N buried layer 102 under P well 105 has the effect of isolating PMOSFET 100a from the P-substrate 101. Thus all of the MOSFETs are isolated from the substrate. Adding N buried layer 102 requires an additional mask, however, and the diffusion of N buried layer 102 during the long isolation diffusion adds still more variability to the process. Therefore, it is necessary to overdesign all parameters including all updiffusion of buried layers, epi layer 114 may have to be grown to a thickness over 6 μm just to form 30V devices (that ideally less than 2 μm of silicon could support). In addition, the lateral diffusion of all the buried layers and the updiffusion of N buried layer 102 that occurs during the isolation (well) drive-ins further reduces the packing density that can be achieved.

FIG. 5B illustrates a possible process sequence for CMOS device 100. The process starts with a P substrate on which a thick oxide layer is formed. A mask is formed for N buried layer 102 and antimony and phosphorus are implanted and allowed to diffuse by thermal processing.

Then a choice is made between a complementary buried layer process and a multiple buried layer process. In the multiple buried layer process, separate masks are used to define the locations of N buried layer 103 and P buried layer 106, respectively. Each masking step is followed by an implant of either N-type dopant (phosphorus) or P-type dopant (boron) and after the implant the dopants are diffused by thermal processing. In the complementary buried layer process, a nitride layer is deposited and then patterned and etched by using the CBL mask, followed by the implantation of one of the two wells, which is subsequently oxidized. The nitride prevents the oxidation in the regions not receiving the first well implant, while the first well becomes covered by a thick oxide. The nitride is then stripped and the second well implant, the complement to the first, is executed. The thick oxide blocks the implant from the first well region. The second well is then diffused and all of the oxide is stripped. Hence, one mask defines complementary wells.

After the three buried layers have been formed, a P-epitaxial layer is grown and the NMOS and PMOS devices are formed in the epitaxial layer as described above. As will be apparent, this is a very complicated process involving numerous masking steps. It is possible, for example, to spend $150 just on the formation of the buried layers in a 6-inch wafer. If a mistake is then made in the fabrication of the NMOSFETs or PMOSFETs, that cost is entirely lost. Moreover, the multiple diffusions that are necessary create numerous possibilities for error, and even if the diffusions are carried out perfectly, the lateral diffusion of dopant that is inherent in the process reduces the number of devices that can be formed in a given area of substrate.

FIG. 5C shows a dopant profile taken at cross-section 5C—5C in FIG. 5A. This shows a region of the P-epitaxial layer between the N buried layer 102 and the P well 105. In some cases N buried layer 102 merges with P well 105. This variability occurs mainly because P well 105 is referenced to the top surface of the epi layer while N buried layer 102 is referenced to the surface of P substrate 101. These variations can have a significant effect on the electrical characteristics of a device, including junction breakdown, resistance, capacitance, speed and current.

The schematic diagram of FIG. 5D shows the advantage of CMOS device 100. NMOSFET 100a has a body that is tied to a separate terminal 110a and can be biased independently of the P substrate 101. Diode 127, which represents the PN junction between P well 105 and N buried layer 102, and diode 128, which represents the PN junction between N buried layer 102 and P substrate 101, provide isolation for NMOSFET 100a. The cathodes of diodes 127 and 128 are N buried layer 102.

FIGS. 5A–5D demonstrate that to form an isolated structure a very complicated, costly process is required, with numerous sources of variability and possible error. This process is suited primarily to devices having large feature sizes and large lateral spacing and can be carried out only in manufacturing plants capable of high temperature operations. This process is inconsistent with the modern CMOS processes, such as the process shown in FIG. 2A, which represents roughly 90% of the manufacturing capacity currently in existence. Thus there is a basic inconsistency between the processes required to produce isolated CMOS devices and the manufacturing facilities available to produce such devices today. There is a definite need in the art of semiconductor manufacturing for a process that will overcome this problem.

SUMMARY OF THE INVENTION

In accordance with this invention, a high-energy implant is used to fabricate various structures for electrically isolating transistors and other devices from a semiconductor substrate and from each other. Alternatively, a series of implants at different energies can be used. In sharp contrast to the current practice the isolation structure and devices are formed in a non-epitaxial semiconductor substrate. The substrate is exposed to a very limited thermal budget and thus the spreading of the implants, both vertically and horizontally, is restricted.

In one group of embodiments the isolation structure includes a deep isolating layer and sidewalls which extend upward from the buried layer to form a cup- or saucer-shaped structure of a first conductivity type, enclosing a region of a second conductivity type. The deep isolating layer can be formed by masking the surface of the substrate and implanting dopant of the first conductivity type through an opening in the mask to a predetermined depth below the surface of the substrate. The surface of the substrate may then be masked again, and dopant of the first conductivity type may be implanted through an opening, which may be annular, to form the sidewalls of the isolation structure. To increase the height of the sidewalls, a series of implants may be performed at different energies to create a vertical stack of overlapping doped regions. As used herein, the term "annular" refers to any structure that extends downward from the surface of the substrate and laterally surrounds an area of the substrate. Viewed from above, the annular structure may be circular (doughnut-shaped), or it may be oval, rectangular, polygonal, or any other shape.

The isolation region may be formed in a substrate of the second conductivity type. The doping concentration of the region enclosed by the isolation structure may be left unchanged, or additional dopant of the second conductivity type may be added to form a well of the second conductivity type. The well of second conductivity type may abut the isolation structure, or an intervening layer of the substrate with its doping concentration remaining unchanged may separate the well from the isolation structure. In still other embodiments, the well may extend through the deep isolating layer and into the substrate beneath the buried layer. Two wells of the first and second conductivity types, respectively, may be formed in the region enclosed by the isolation structure. The structure may contain two deep layers of first and second conductivity type, respectively. The deep layer of the second conductivity type may extend upward or downward, or both upward and downward, from the deep layer of the first conductivity type. The lateral dimension of the deep layer of the second conductivity type may be smaller than the lateral dimension of the deep layer of the first conductivity type.

The transistors or other devices may be formed in the region enclosed by the isolation structure, or in the structure itself, or both.

In some embodiments the isolation structure includes an implanted buried layer or well but no sidewalls.

The substrate is often biased at ground or the most negative on-chip potential, but this need not be the case.

Among the devices that can be isolated from the substrate using the techniques of this invention are N-channel and P-channel MOSFETs, PNP and NPN bipolar transistors, diodes, insulated gate bipolar transistors (IGBTs), resistors, junction field-effect transistors, photodiodes, detectors, or any other silicon devices.

Using the techniques of this invention avoids many of the problems described above. Dopants can be implanted with high precision to defined depths in the substrate. By avoiding thermal diffusion processes—either downward diffusions of dopants implanted through the top surface of an epitaxial layer or upward and downward diffusions of dopants introduced at the interface between an epitaxial layer and an underlying substrate—both the horizontal separation between the devices and the horizontal dimensions of the devices themselves can be reduced. In addition, the high costs associated with the growth of an epitaxial layer can be avoided.

BRIEF DESCRIPTION OF THE DRAWINGS

FIGS. 8A–8H illustrate a process for forming an isolated P well in accordance with the invention.

FIGS. 12G–12O illustrate variations of the process shown in FIGS. 12A–12F.

FIGS. 18A–18D illustrate how a series of implants can be employed to form a vertical sidewall of an isolation region.

FIGS. 19A–19D illustrate the steps of a process for fabricating an isolation region having a sidewall of the kind shown in FIGS. 18A–18D.

DESCRIPTION OF THE INVENTION

Figure 6A:
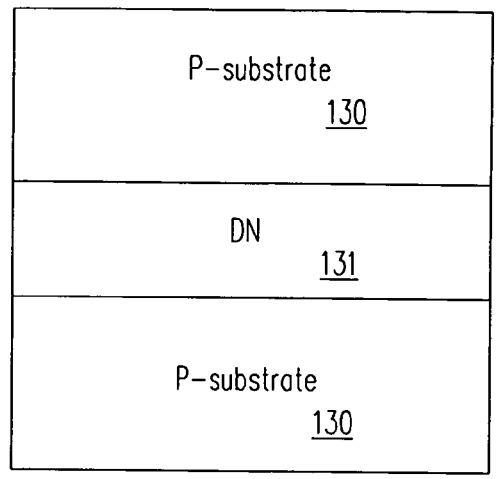
FIGS. 6A–6V illustrate a number of basic structures that can be formed using the methods of this invention.
Figure 6B:
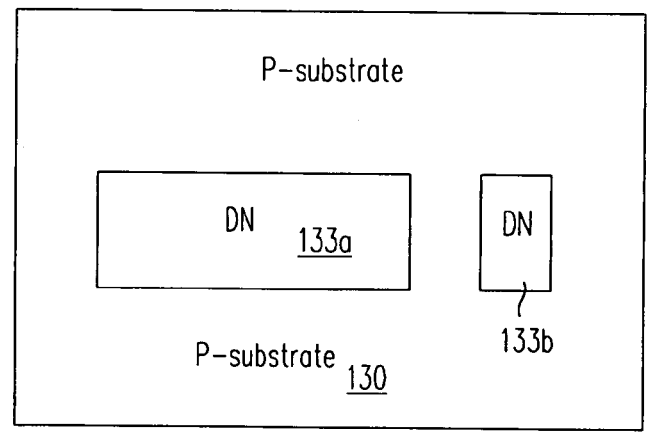
Figure 6C:
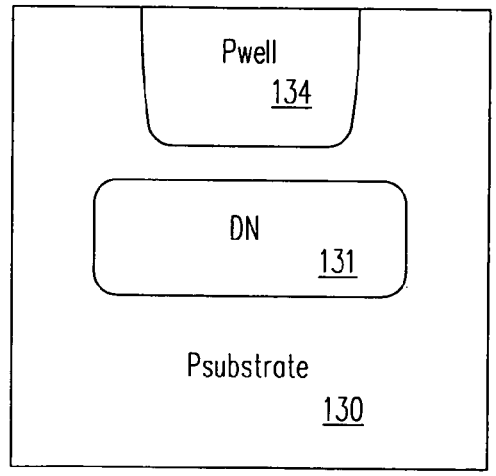
Figure 6D:
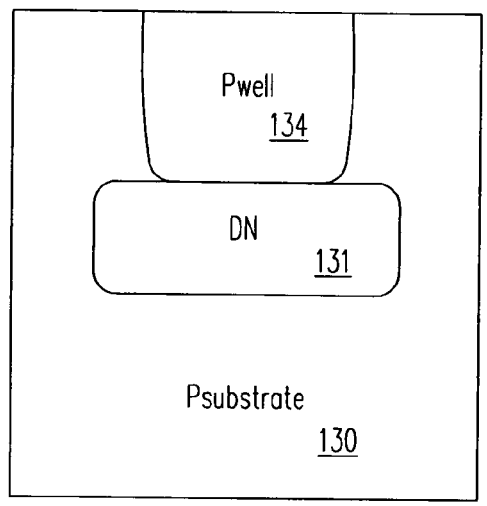
Figure 6E:
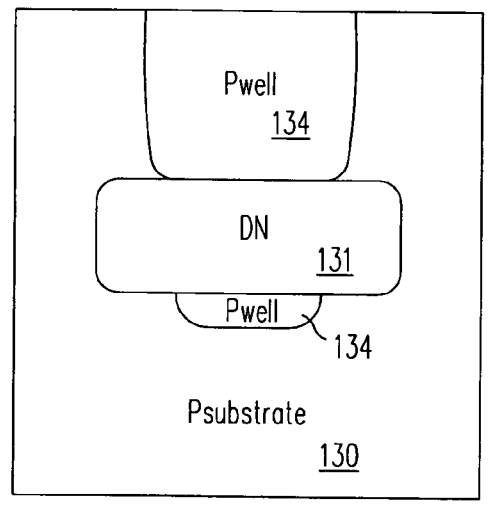
Figure 6F:
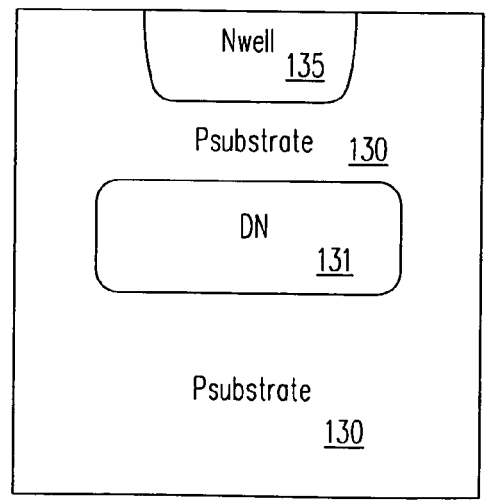
Figure 6G:
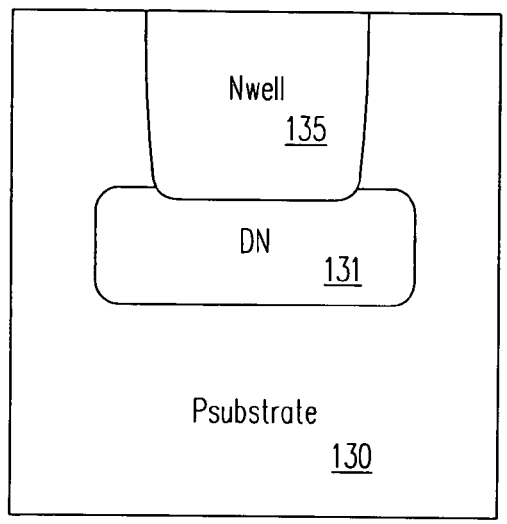
Figure 6H:
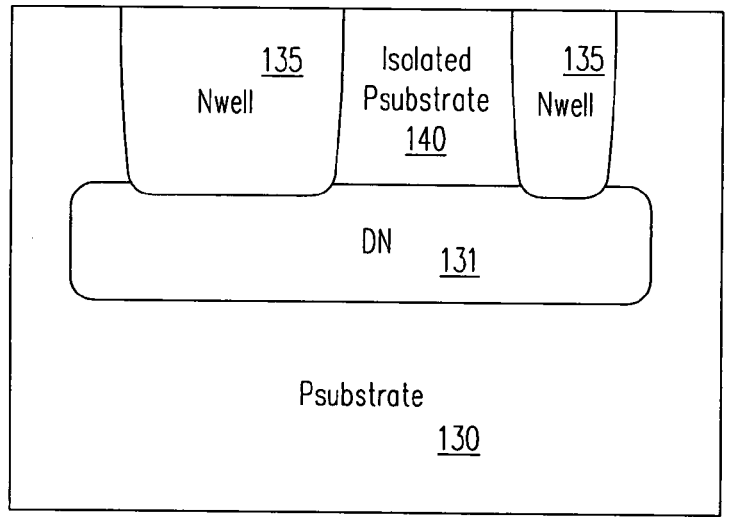
Figure 6I:
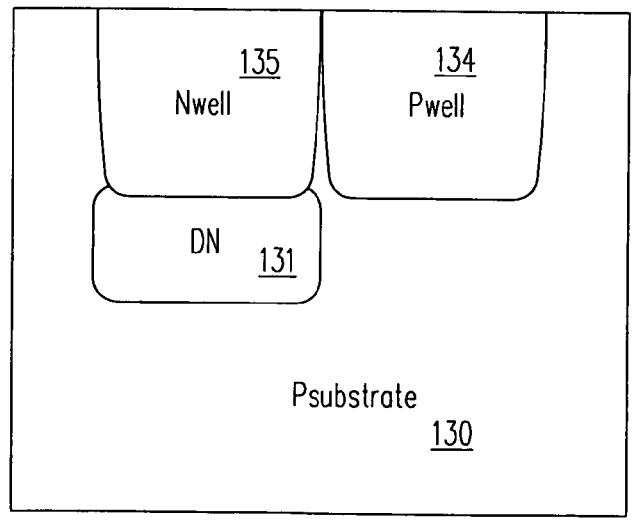
Figure 6J:
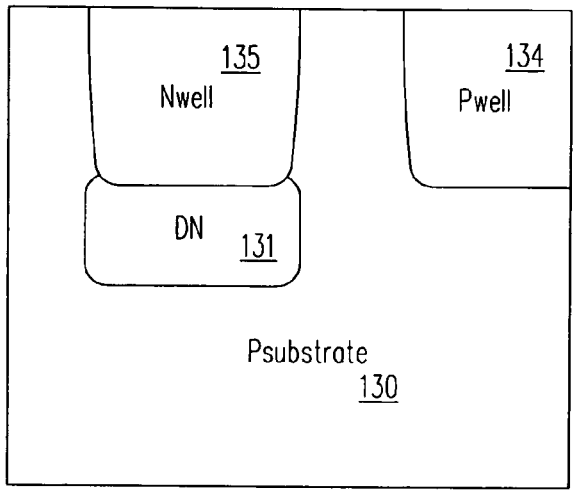
Figure 6K:
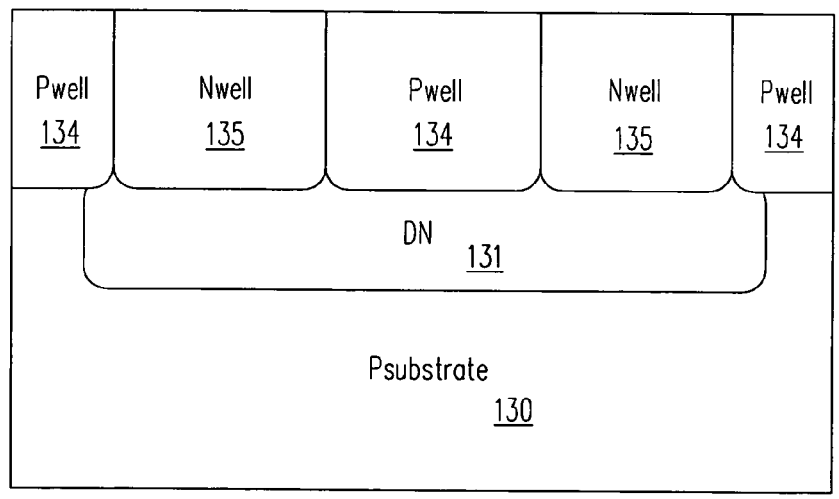
Figure 6L:
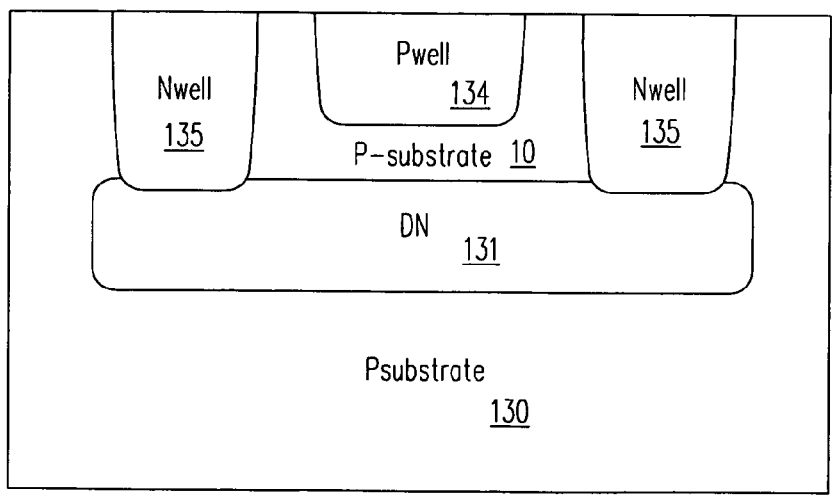
Figure 6M:
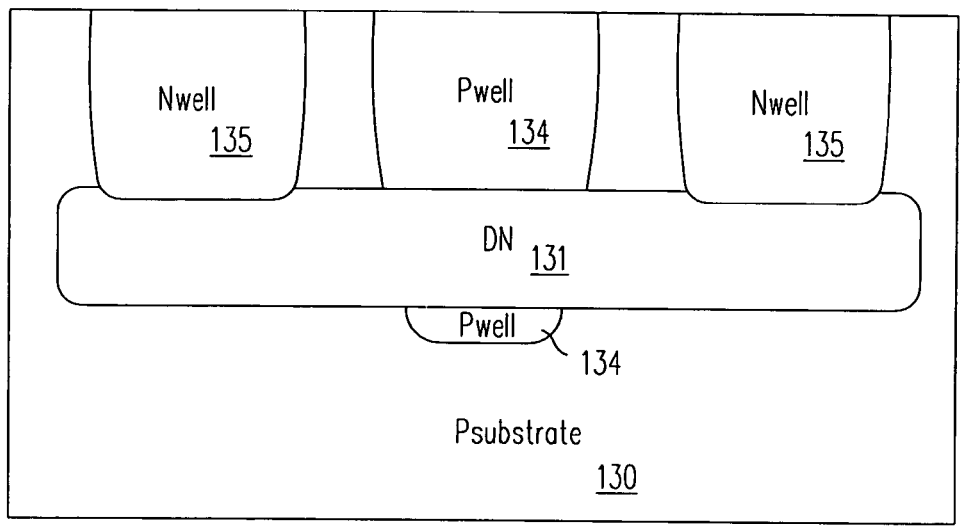
Figure 6N:
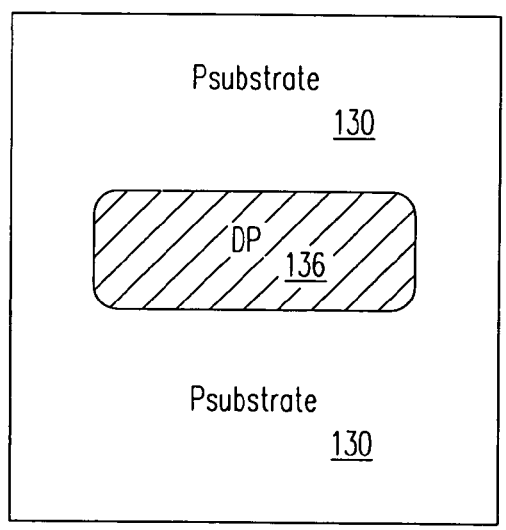
Figure 6O:
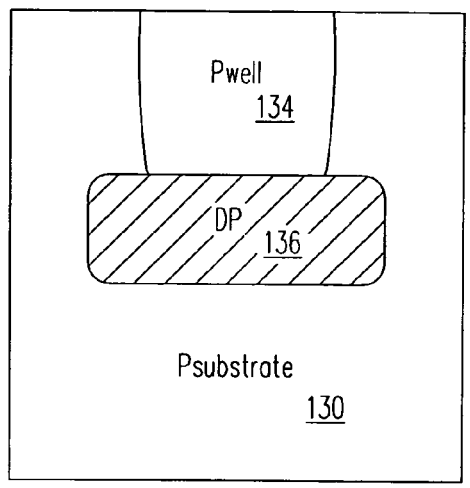
Figure 6P:
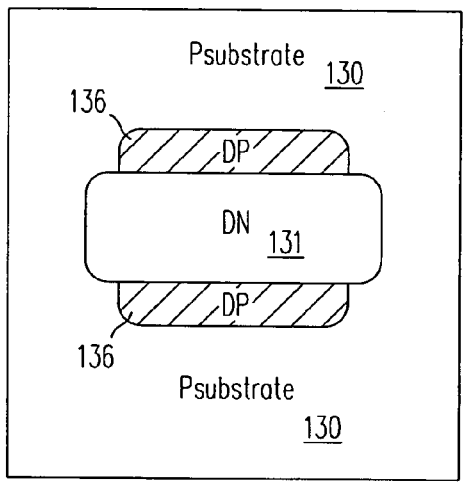
Figure 6Q:
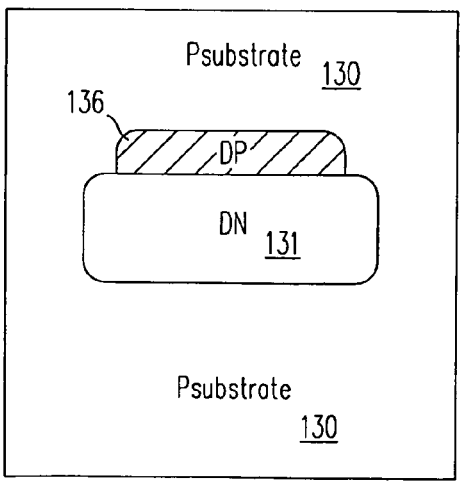
Figure 6R:
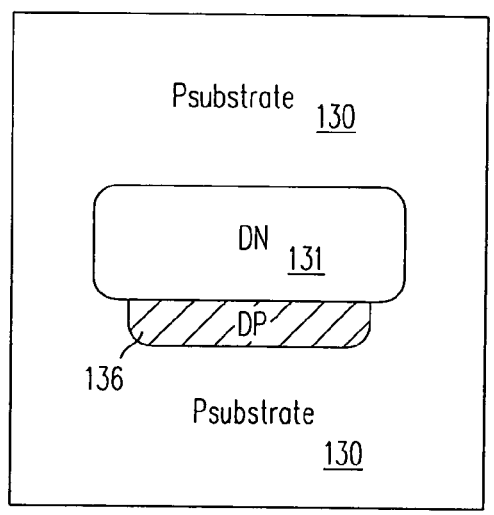
Figure 6S:
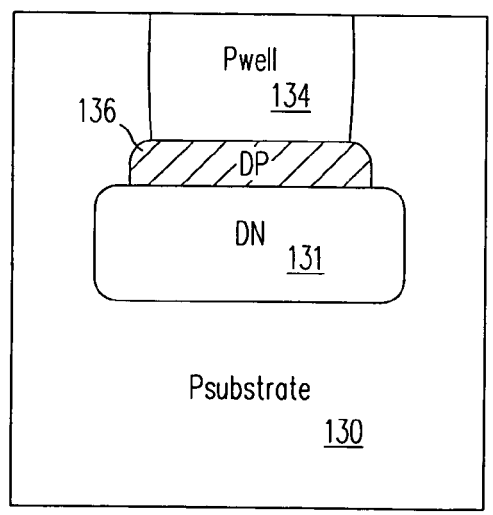
Figure 6T:
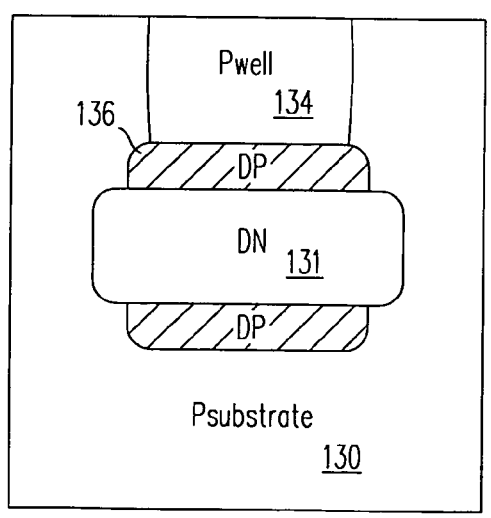
Figure 6U:
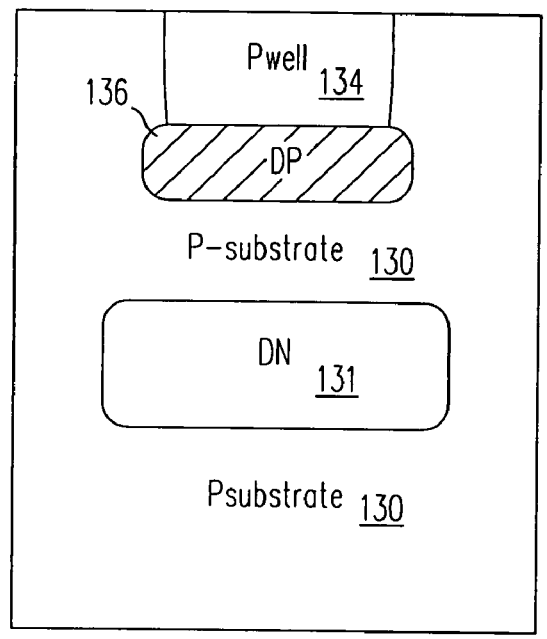
Figure 6V:
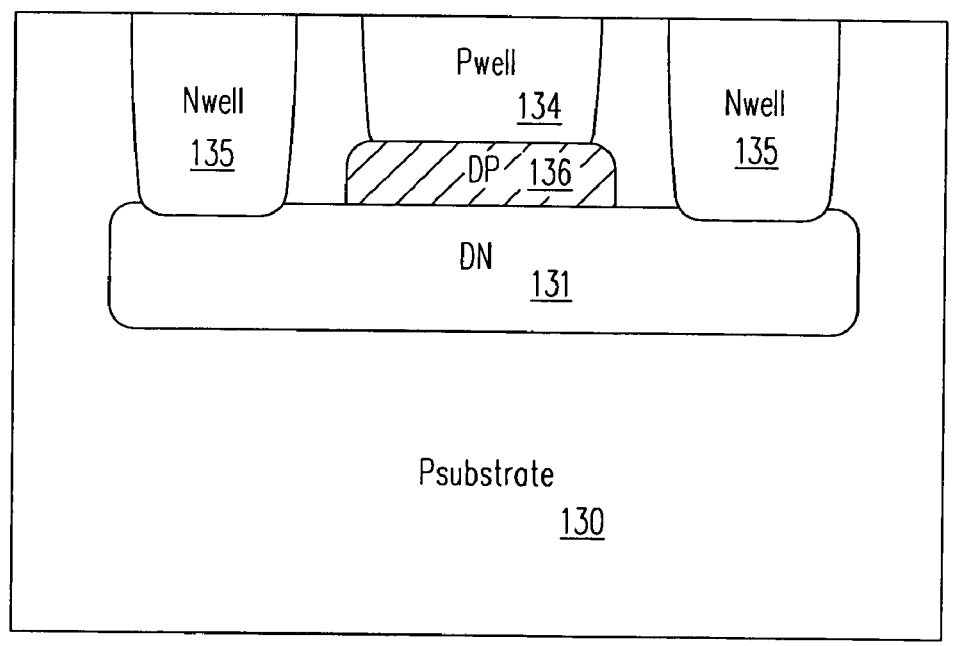

FIGS. 6A–6V illustrate a number of basic structures that can be formed using the methods of this invention. The general objective is to form a number of implanted wells lying over a deep implanted "subsurface" layer. These are in effect "building blocks" that can be combined in various ways in manufacturing a usable device. The deep implanted layers described herein are in contrast to conventional "buried layers", formed at the bottom of an epitaxial layer before and during the growth of the epitaxial layer. Such pre-epitaxial buried layers necessarily exhibit dopant redistribution during the growth of the epitaxial layer.

FIG. 6A shows a deep implanted N isolating layer 131 in a P substrate 130. FIG. 6B shows a deep implanted isolating layer 133 which is broken into sections 133a and 133b. FIG. 6C shows an implanted P well 134 above and separated from N isolating layer 131. Without sidewall isolation regions, however, P well 134 is not isolated from P substrate 130. FIG. 6D shows P well 134 touching deep N isolating layer 131; and FIG. 6E shows that P well 134 can be implanted in such way that a portion of P well 134 is located on the underside of deep N isolating layer 131.

FIG. 6F shows an N well 135 above and separated from deep N isolating layer 131; FIG. 6G shows N well 135 overlapping deep N isolating layer 131; and FIG. 6H shows an annular N well 135 that merges with deep N isolating layer 131, forming an fully isolated region 140 surrounded by N well 135 on its sides and by deep N isolating layer 131 on its bottom.

FIG. 6I shows P well 134 abutting N well 135, with N well 135 touching deep N isolating layer 131. FIG. 6J is similar to FIG. 6I except that P well 134 is spaced from N well 135. FIG. 6K shows a structure formed by a complementary well process where the entire surface of P substrate 130 is occupied by either a P well 134 or an N well 135 and N buried layer underlies and touches the P and N wells. If N well 135 forms a ring or annular structure around the center section of P well 134, then this center section will become fully isolated in the same manner as the isolated structure shown in FIG. 6H FIG. 6L is similar to FIG. 6H but shows a structure in which one of the P wells 134 is implanted to a shallower depth than the N wells 135 and is enclosed in an annular ring formed by N wells 135. FIG. 6M is similar to FIG. 6L but the P well 134 extends below the deep N isolating layer 131. In both FIGS. 6L and 6M P well 134 becomes fully isolated from P substrate 130.

FIG. 6N shows an implanted P subsurface layer 136 in P substrate 130. While there are no PN junctions in this embodiment, it would have an inverse or "retrograde" doping concentration, i.e., the doping concentration of P-type impurity increases in the direction downward from the surface of substrate 130 towards deep P layer 136. FIG. 6O shows P well 134, which could be fully implanted, merging with deep P layer 136. Again, this structure could have a retrograde doping concentration.

FIGS. 6P–6R show structures containing deep N isolating layer 131 and deep P layer 136 together in P substrate 130. Since deep layers 131 and 136 have different lateral dimensions, different masks were used in forming them. The mask used to form deep layer 131 would have an opening that is wider that an opening in the mask used to form deep layer 136. In other embodiments, the same mask could be used to form a deep N layer and a deep P layer, in which case the layers would have roughly the same lateral dimension. FIG. 6P shows deep P layer 136 extending both upward and downward from deep N layer 131. FIG. 6Q shows deep P layer 136 extending only upward from deep N 131. FIG. 6R shows deep P layer 136 extending only downward from deep N layer 131.

The structure shown in FIG. 6Q can be achieved by implanting deep P layer 136 at an implant energy such that it has a projected range less than that of deep N layer 131. The structure shown in FIG. 6R can be achieved by implanting deep P layer 136 at an energy such that it has a projected range deeper than deep N layer 131. The structure of FIG. 6P can be achieved using two implants to form deep P layer 136, one deeper than deep N layer 131, the other more shallow than deep N layer 131. Another method of fabricating the structure of FIG. 6P involves a single implant of boron to form deep P layer 136, the implant having the same range as the phosphorus implant used to form deep N layer 131, but a lower dose. The exposed portion of deep P layer 136 above and below deep N layer 131 occurs because boron exhibits a larger degree of straggle than phosphorus at any given depth.

FIG. 6S shows an embodiment that includes P well 134, deep P layer 136 and deep N 131, with P well 134 and deep P layer 136 sitting above deep N layer 131. P well 134 and deep P layer 136 would have a retrograde doping concentration. FIG. 6T is similar to FIG. 6S except that deep P layer 136 extends both upward and downward from deep N layer 131, comprising one of two implants. FIG. 6U is also similar to FIG. 6S but shows deep P layer 136 being separated from deep N layer 131. The portion of P substrate that separates deep P layer 136 and deep N layer 131 is formed by differences in implant energies rather than an epitaxial process and therefore the separation distance can be set with great precision.

FIG. 6V shows an N well 135, similar to the one shown in FIG. 6L, implanted around P well 134 and deep P layer 136. P well 134 and deep P layer 136 are arranged similar to the structure shown in FIG. 6S. Thus FIG. 6V shows that a fully isolated, retrograde P well can be formed very precisely and with a minimal thermal budget.

In summary, FIGS. 6A–6V show that, without relying on epitaxial growth, a tremendous variety of structures can be fabricated using the principles of this invention. Because no epitaxial process is involved, the components of the structure can be formed very precisely and with less lateral movement, less variability and greater control over breakdown voltages. Moreover, the doping concentrations can be either a normal Gaussian profile extending downward from the surface of substrate or an inverse or retrograde profile (Gaussian extending upward towards the surface of the substrate). Combined implants may be used to synthesize a non-Gaussian profile.

Figure 7A:
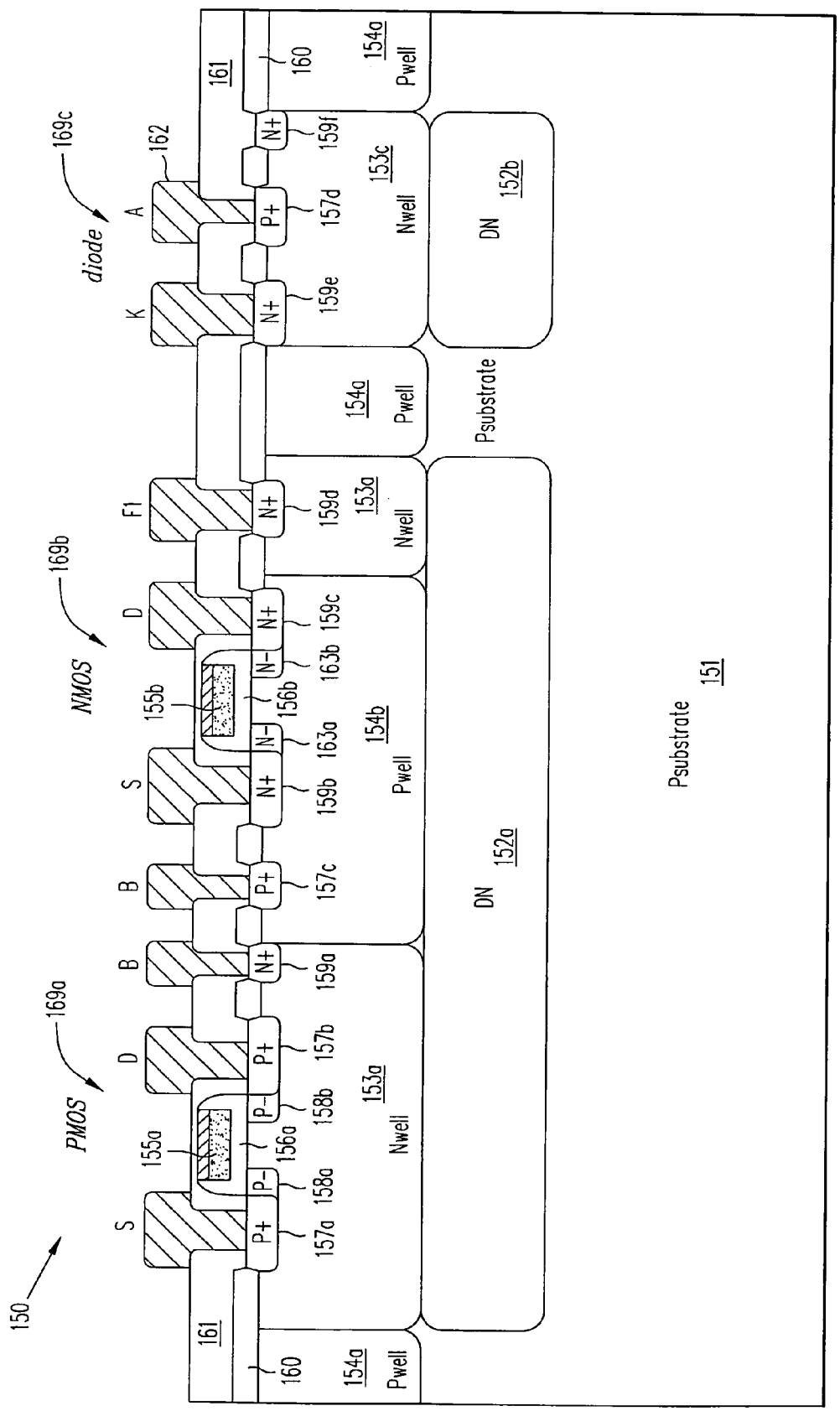
FIGS. 7A–7C illustrate devices in accordance with this invention containing some of elements shown in FIGS. 6A–6V, including a fully isolated CMOS device, an isolated NPN transistor, an N-channel lightly-doped drain MOSFET (LDMOS), a lateral double-implanted P-channel LDMOS, a substrate PNP transistor, and a non-isolated NMOSFET.
Figure 7B:
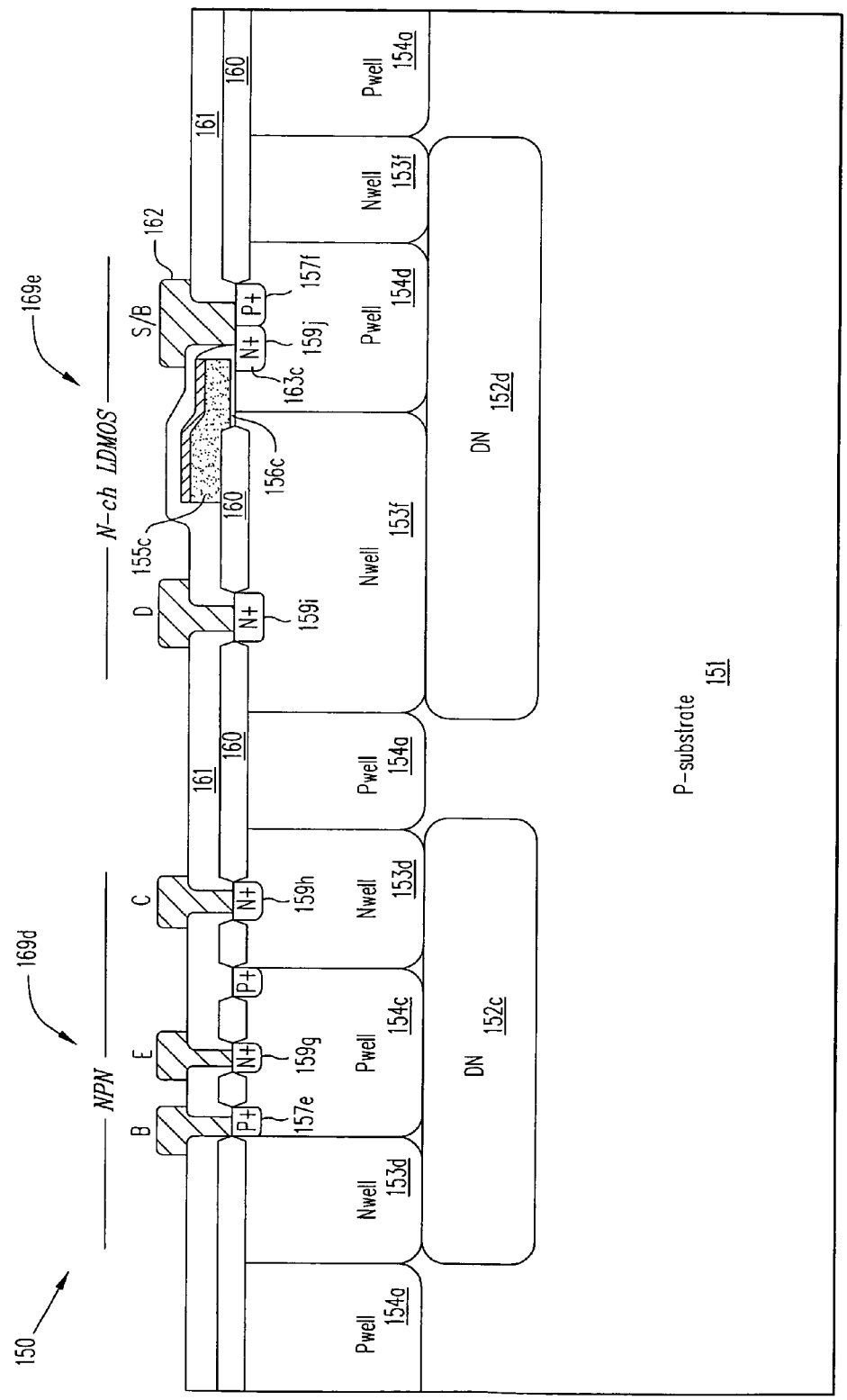
Figure 7C:
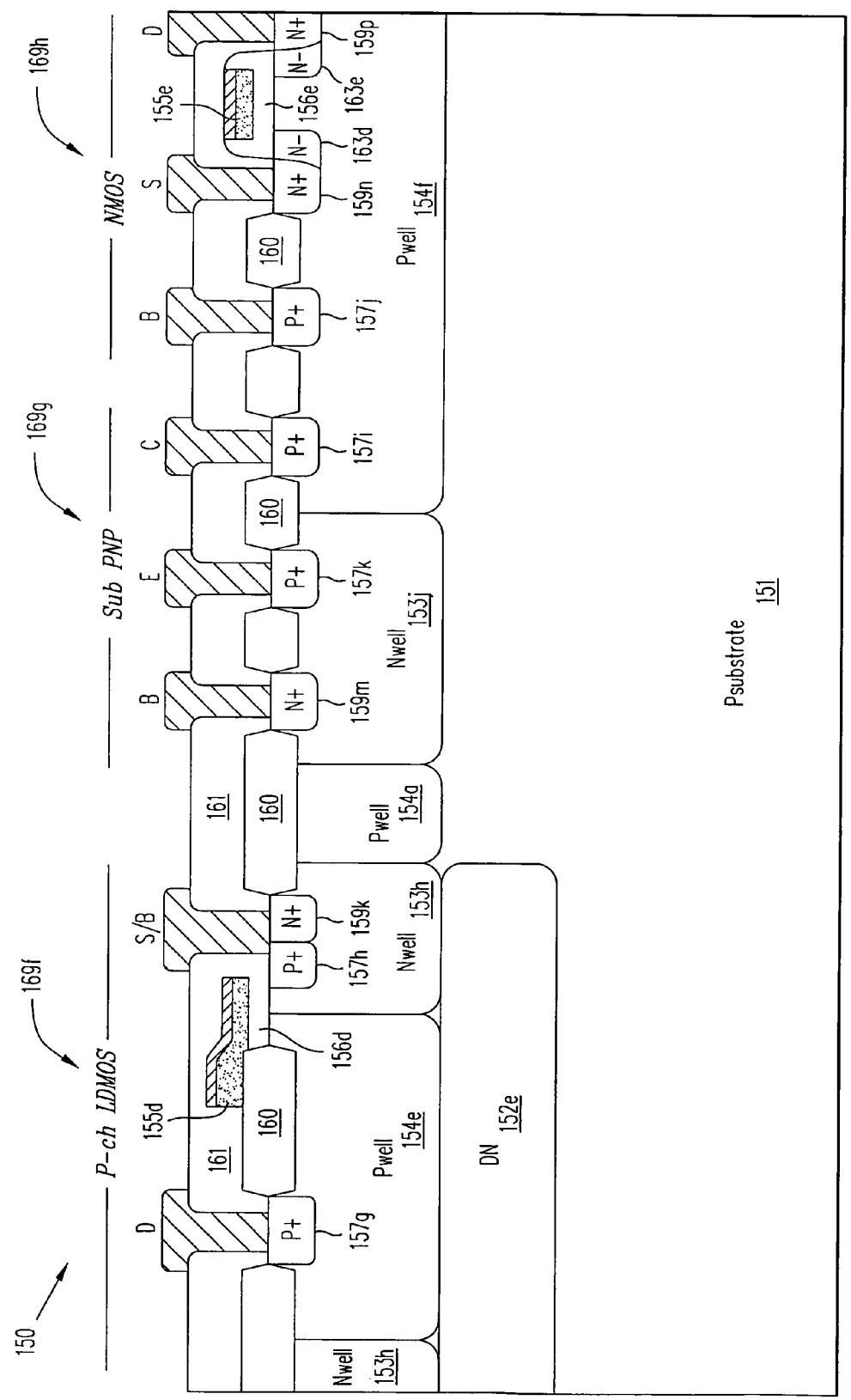

FIGS. 7A–7C illustrate CMOS structures containing some of elements shown in FIGS. 6A–6V. All of the structures are capable of being monolithically integrated without the need for growing an epitaxial layer.

Figure 1A:
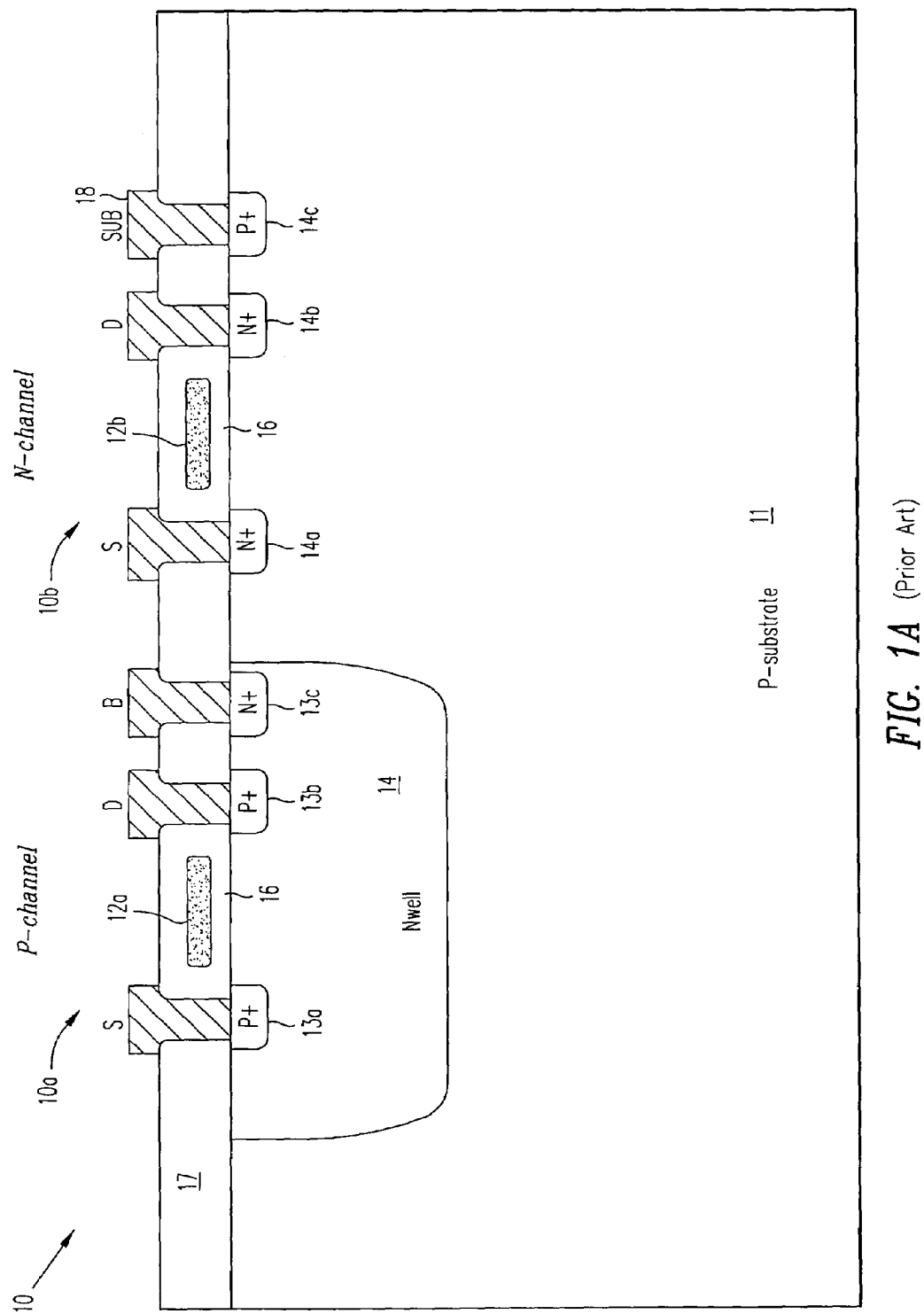
FIGS. 1A and 1B illustrate known CMOS structures.
Figure 1B:
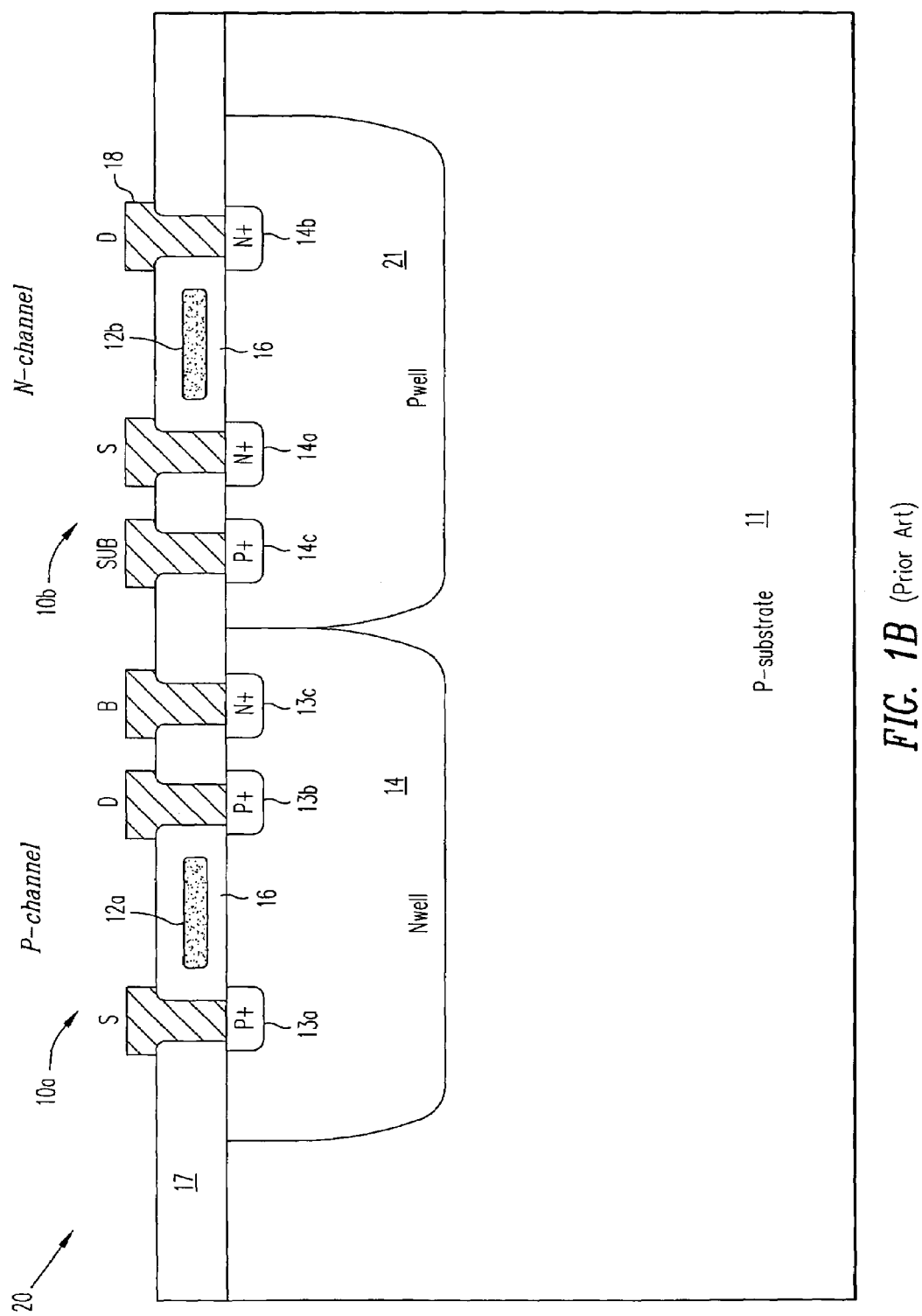
Figure 1C:
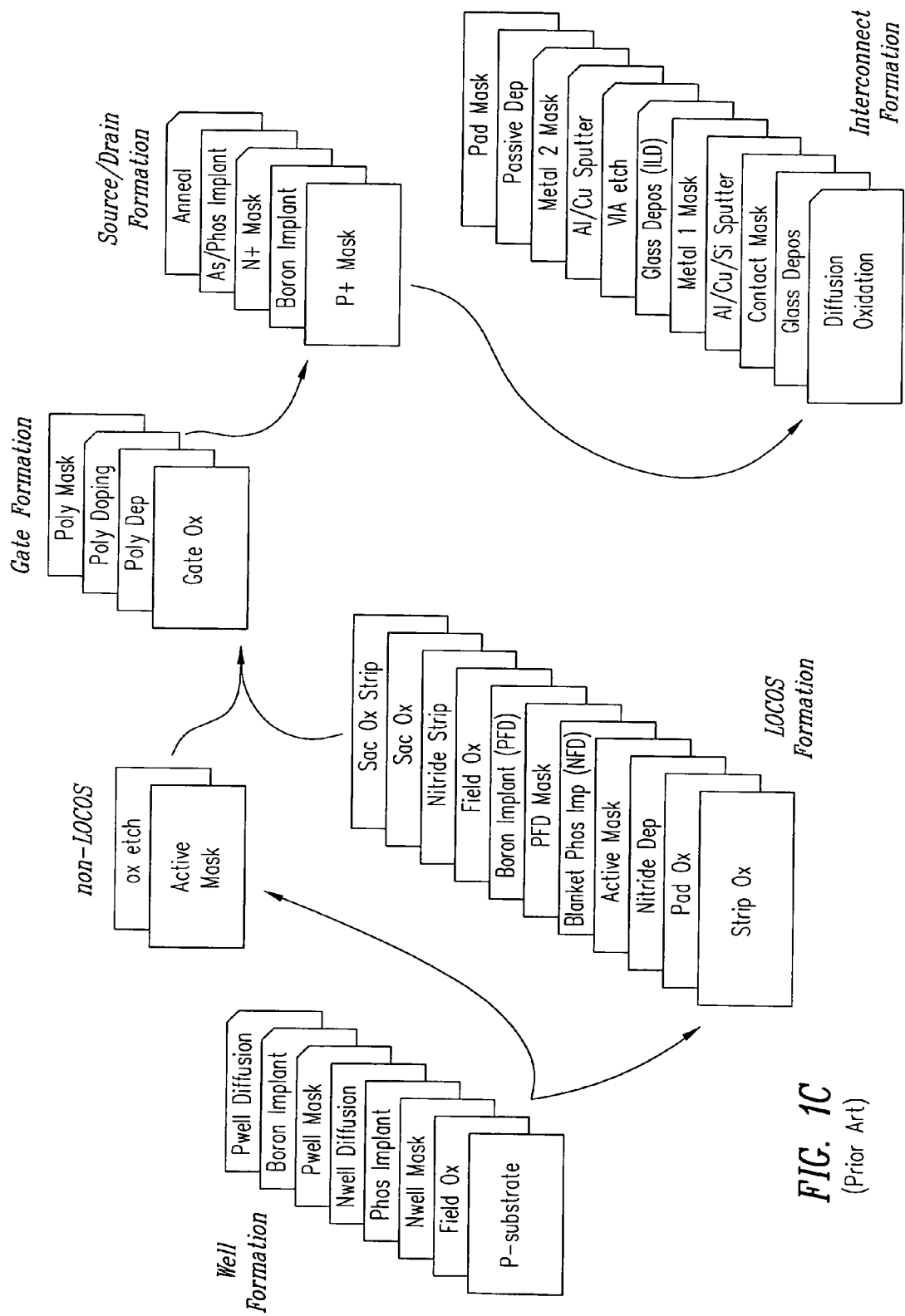
FIG. 1C shows a process flow for forming the CMOS structure shown in FIG. 1B.
Figure 2A:
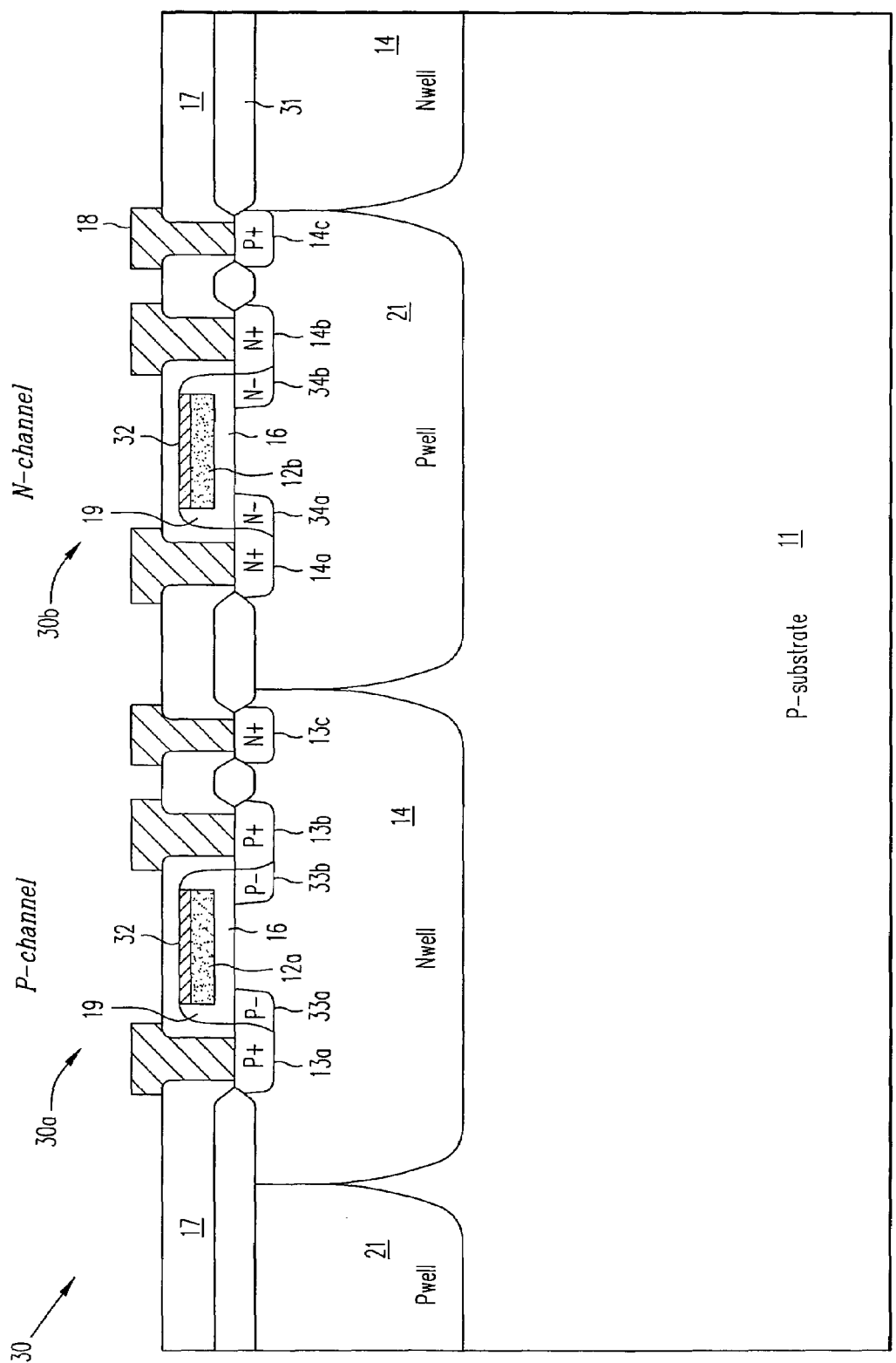
FIGS. 2A and 2B show CMOS devices produced using a more modern process than the process shown in FIG. 1C.
Figure 2B:
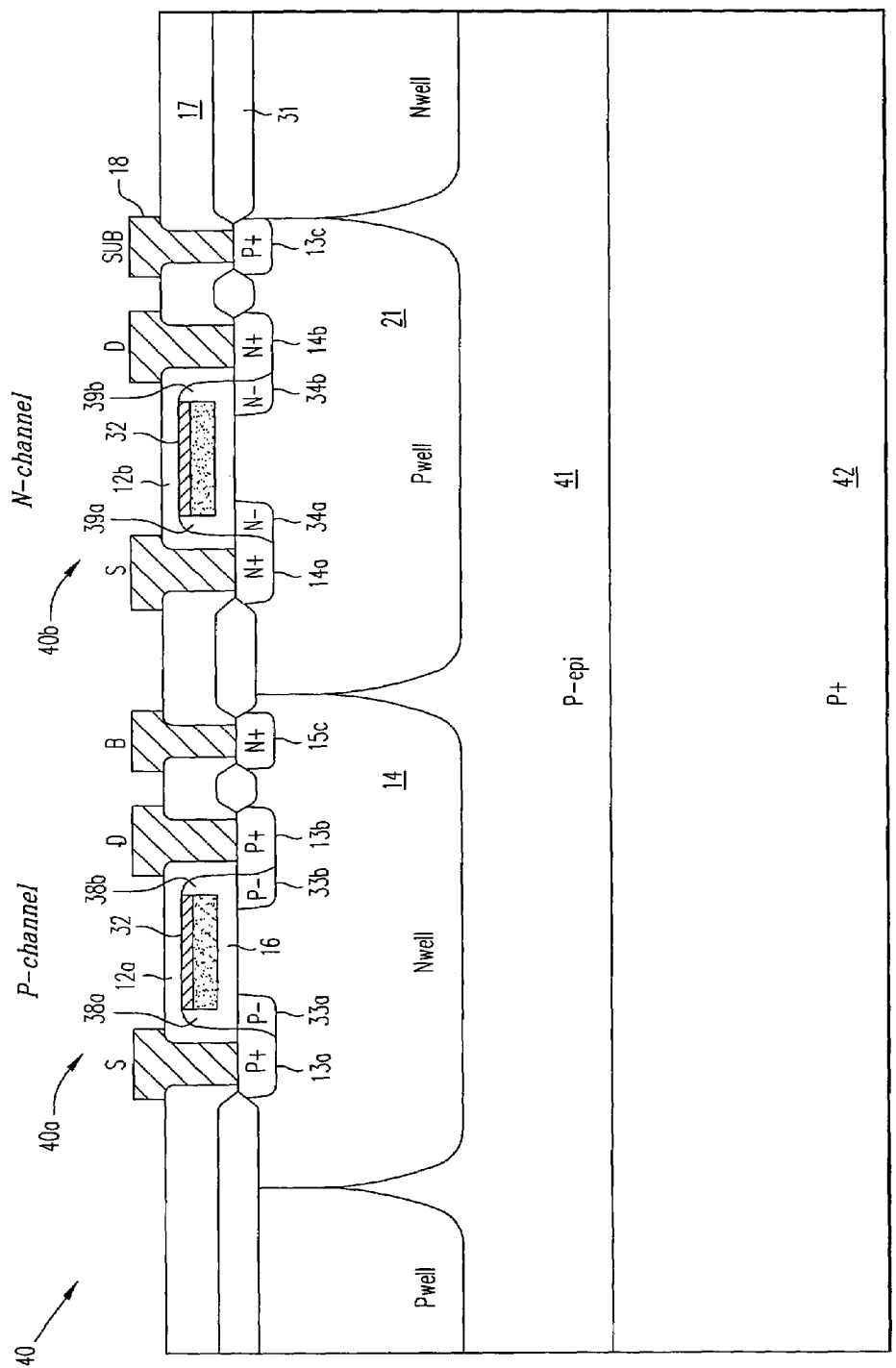
Figure 2C:
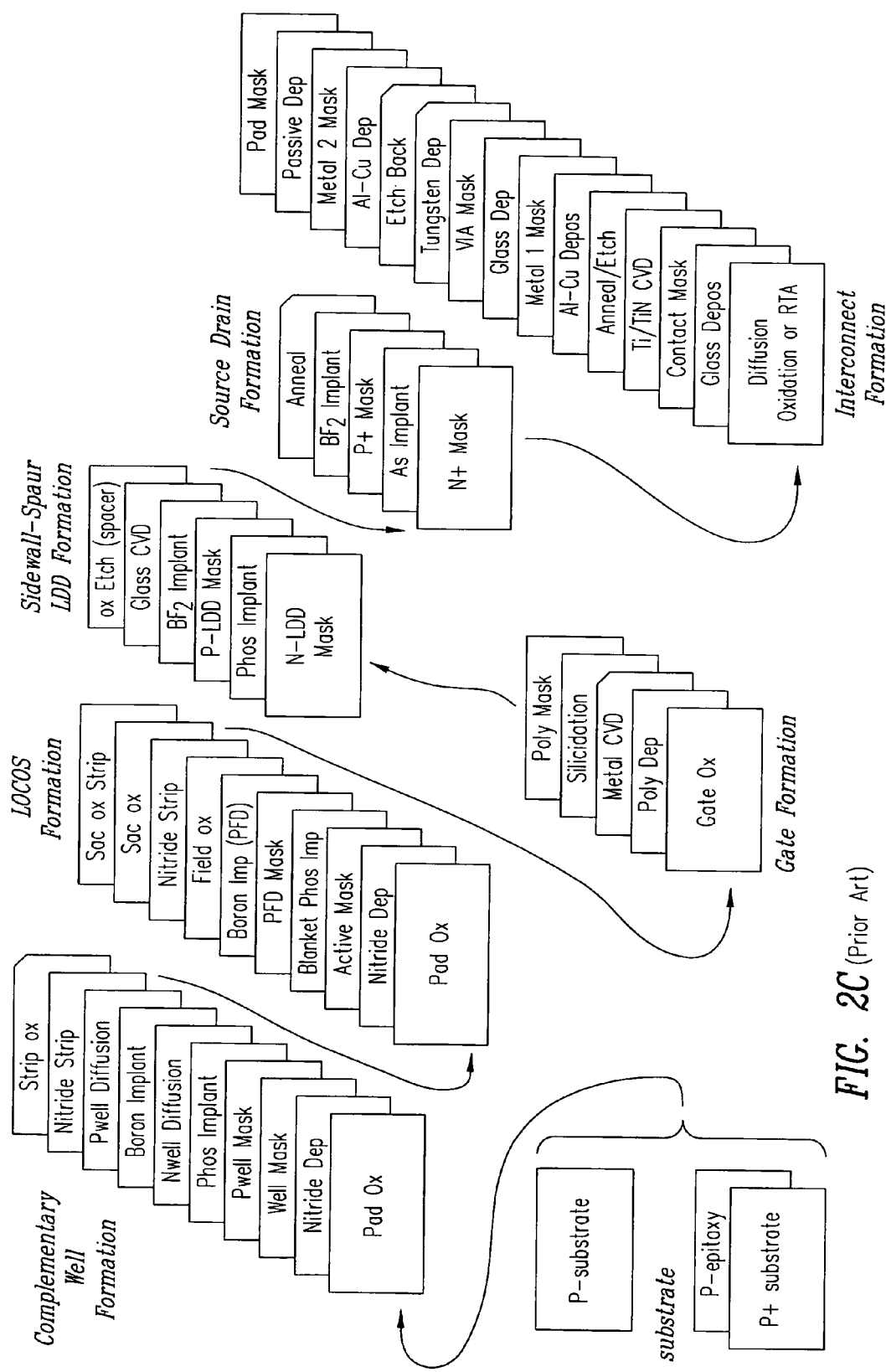
FIG. 2C illustrates a process that can be used to fabricate CMOS devices of FIGS. 2A and 2B.
Figure 3A:
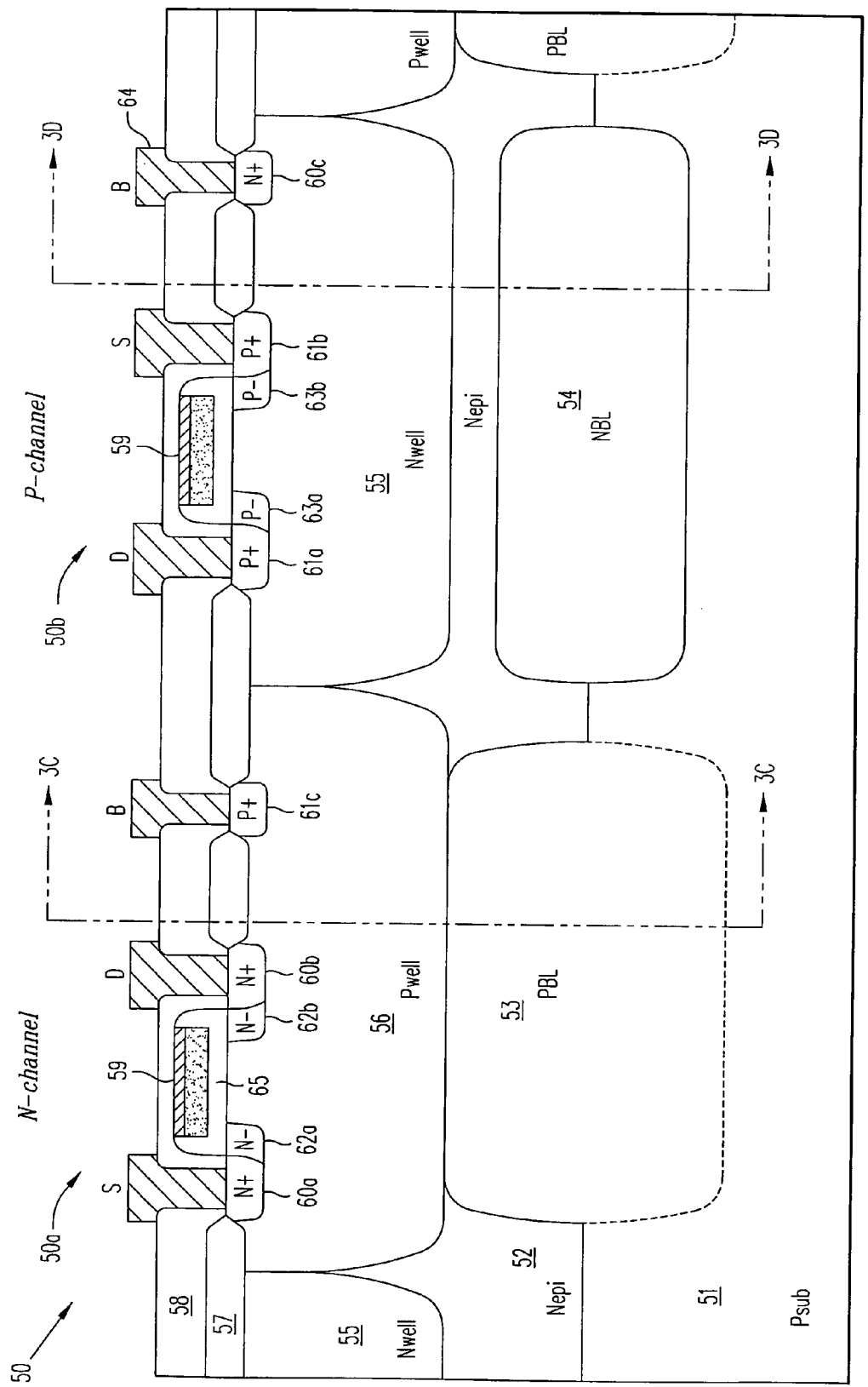
FIGS. 3A and 3B illustrate an approach to the fabrication of a CMOS device using technology that evolved from the fabrication of bipolar devices.
Figure 3B:
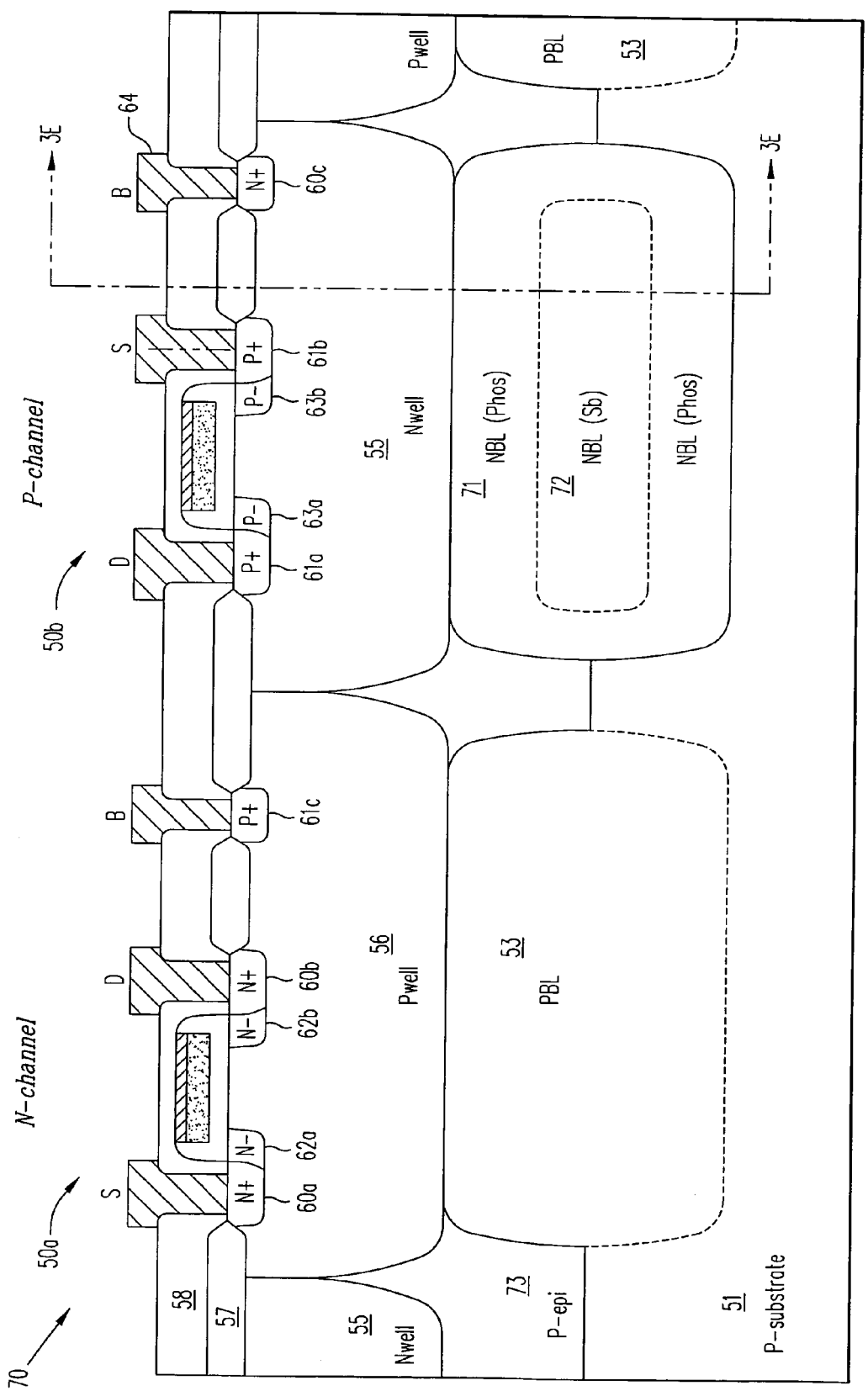
Figure 3C:
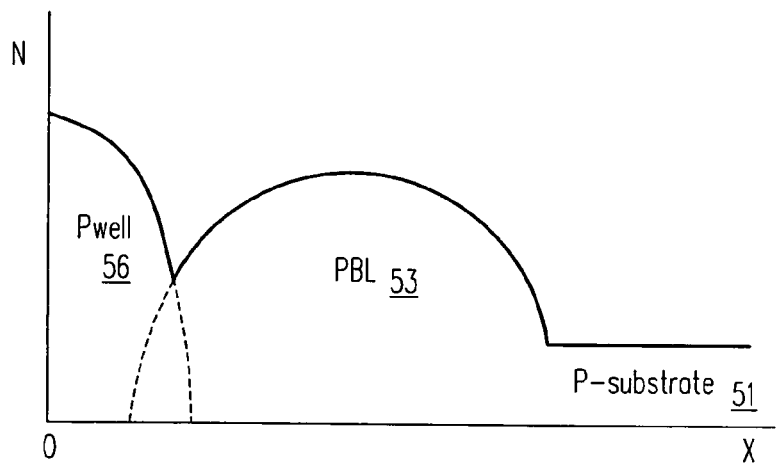
FIGS. 3C–3E are graphs of doping concentration versus depth into the substrate at the cross sections indicated in FIGS. 3A and 3B.
Figure 3D:
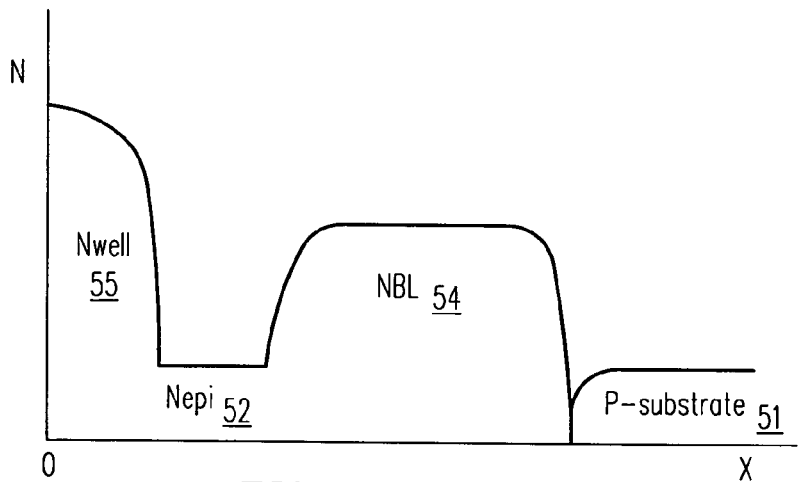
Figure 3E:
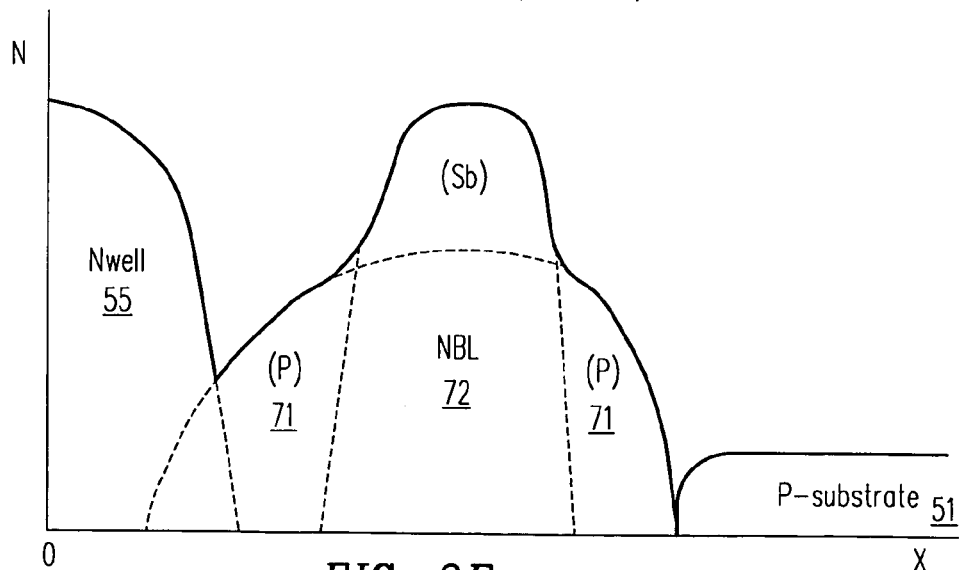
Figure 4A:
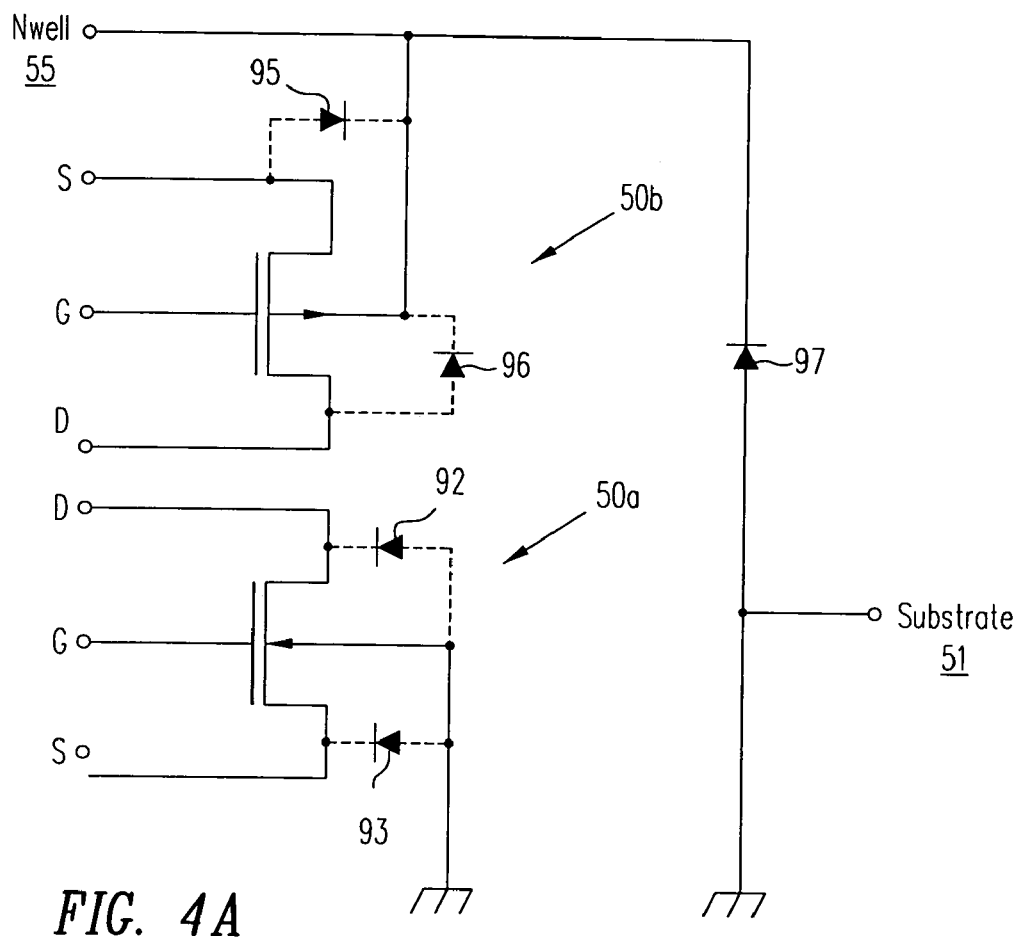
FIG. 4A is a schematic circuit diagram of the CMOS devices shown in FIGS. 3A and 3B.
Figure 4B:
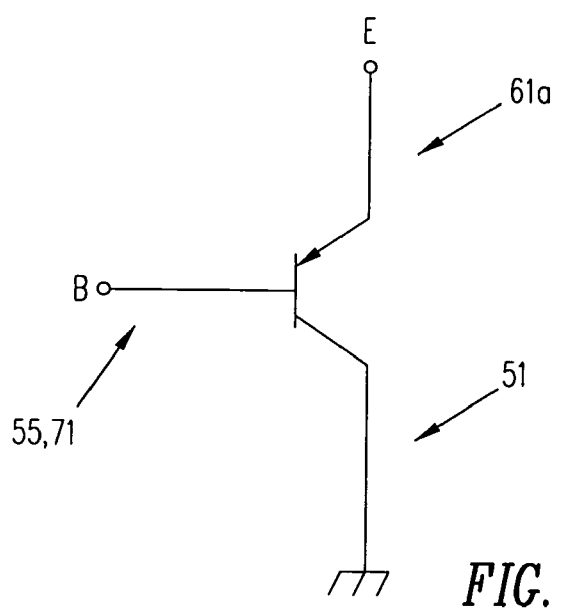
FIG. 4B is a schematic circuit diagram of a PNP bipolar transistor that can also be formed from the process used to make the devices of FIGS. 3A and 3B.
Figure 5A:
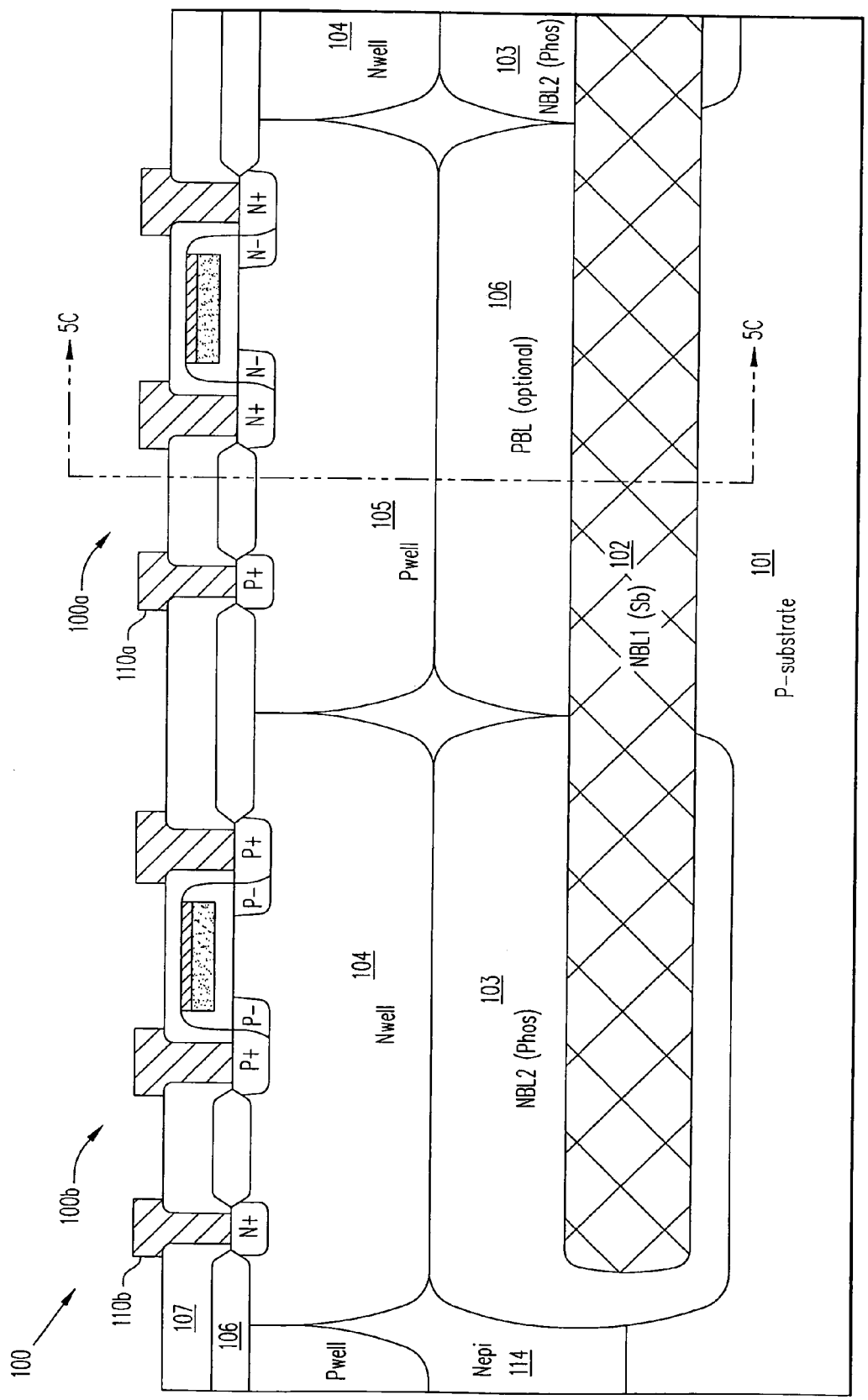
FIG. 5A illustrates a CMOS device that contains three buried layers.
Figure 5B:
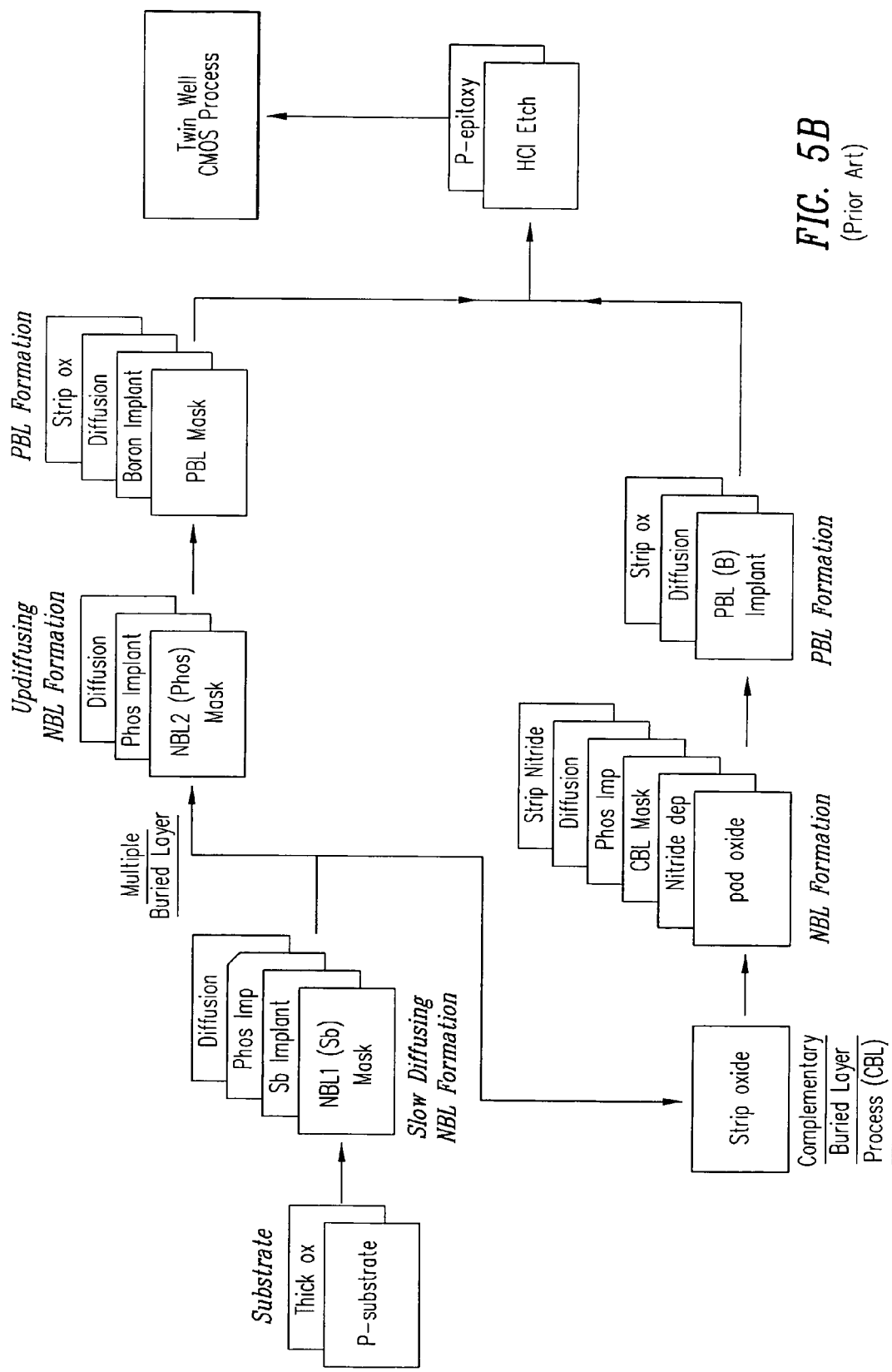
FIG. 5B shows a process for making the CMOS device of FIG. 5A.
Figure 5C:
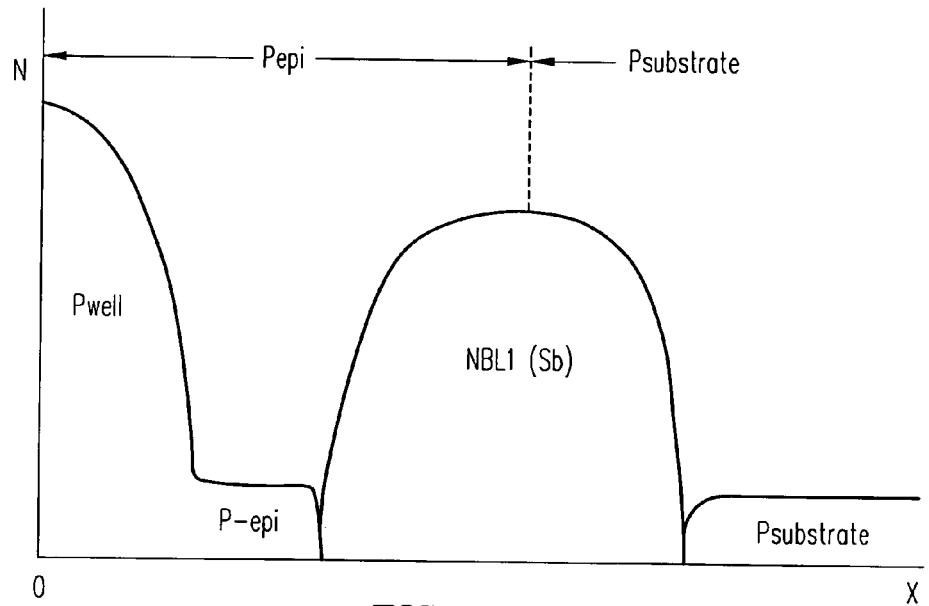
FIG. 5C shows a dopant profile of the CMOS device shown in FIG. 5A.
Figure 5D:
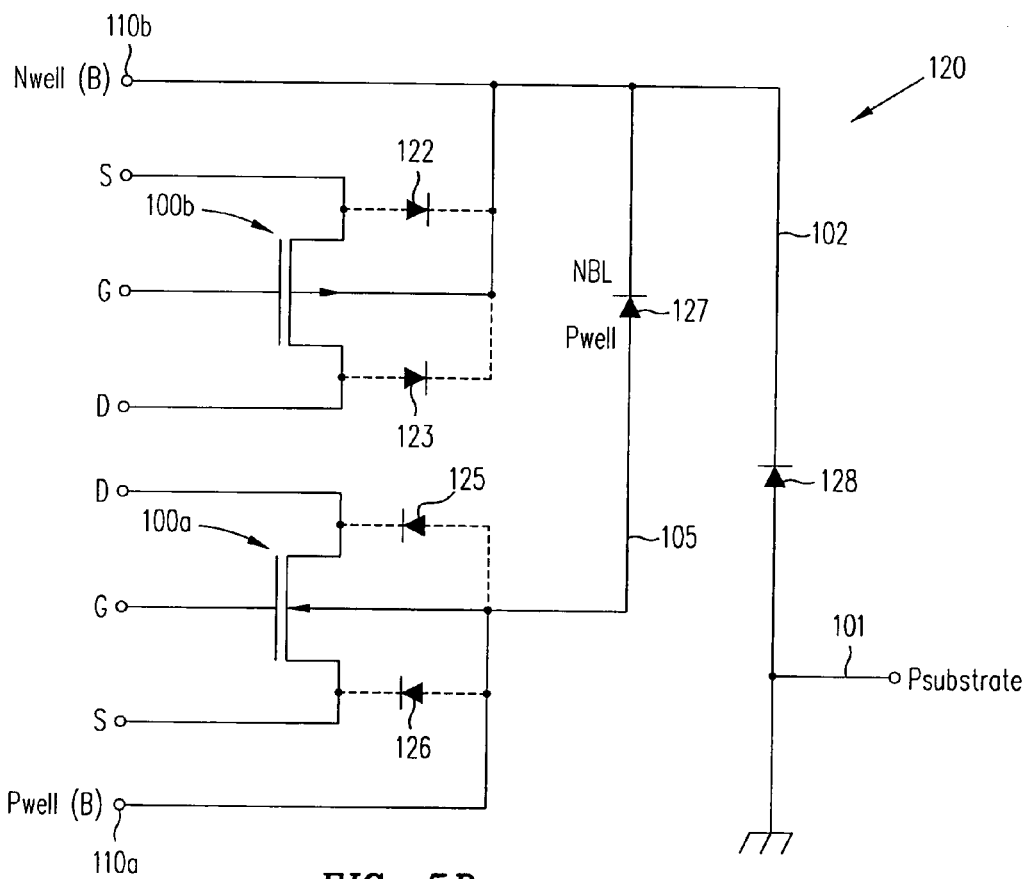
FIG. 5D shows a schematic diagram of the CMOS device shown in FIG. 5A.

FIG. 7A shows a fully isolated CMOS device 150 fabricated in accordance with this invention. CMOS device 150 contains a PMOSFET 169a and an NMOSFET 169b. NMOSFET 169b is formed in a P well 154b and is generally similar to NMOSFET 30b shown in FIG. 2A. Included in NMOSFET 169b are an N+ source region 159b, an N+ drain region 163b and a P+ body contact region 157c. N− regions 163a and 163b are lightly-doped drain regions. A gate 155b is formed over a gate oxide layer 156b. A LOCOS field oxide layer 160 and a second oxide layer 161 overlie the surface of P substrate 151.

P well 154b overlies deep N layer 152a and is surrounded by N well 153a, which together isolate NMOSFET 169b from P substrate 151. In this case, however, N well 153a also contains a PMOSFET 169a, generally similar to PMOSFET 30a shown in FIG. 2A, which is also isolated from P substrate 151. Included in PMOSFET 169a are a P+ source region 157a, a P+ drain region 157b and an N+ body contact region 159a. P− regions 158a and 158b are lightly-doped drain regions. A gate 155a is formed over a gate oxide layer 156a.

In other embodiments, N well 153a would not have to contain a PMOSFET but could be wrapped around P well 154b thereby simply providing P well 154b with isolation from P substrate 151. The width of the isolating ring represented by N well 153a can be widened to improve the isolating capability of the structure.

A diode 169c is also formed in an N well 153c. Diode 169c includes a P+ anode region 157d and an N+ cathode region 159e. A deep N layer 152b underlies N well 153c and suppresses the injection of holes in P substrate 151 to prevent PNP bipolar action involving P+ anode region 157d, N well 153c and P substrate 151. Lateral PNP conduction may be further suppressed by widening N well 153c to increase the lateral extent of N well 153c beyond P+ region 157d.

Alternatively, if even greater isolation between PMOSFET 169a and NMOSFET 169b were desired, PMOSFET 169a could be placed in an N well separate from N well 153a, and N well 153a could be used solely for isolating NMOSFET 169b from the substrate.

FIG. 7B illustrates an embodiment that contains an NPN transistor 169d and an N-channel lightly-doped drain lateral double-diffused channel MOSFET (LDMOS) 169e.

In NPN transistor 169d, N+ region 159g acts as the emitter, P+ region 157e and P well 154c act as the base, and N well 153d and deep N layer 152c act as the collector. Deep N layer 152c isolates the base (P well 154c) from P substrate 151.

In N-channel LDMOS 169e, N+ region 159i, N well 153f and deep N layer 152d act as the drain, with N well 153f serving as the lightly-doped portion of the drain to spread the voltage drop laterally along the lateral extent of N well 153f and away from N+ region 159i and P well 154d. P+ region 157f and P well 154d act as the body of the MOSFET, and N+ region 159i acts as the source. As is customary, the source and body are shorted together by means of metal source-body contact 162, although the source and body could be biased separately if separate source and body contacts were employed. The body region (P+ region 157f and P well 154d) is isolated from P substrate 151 by N well 153f and deep N layer 152d.

FIG. 7C illustrates three devices: a P-channel LDMOS 169f, a substrate PNP transistor 169g, and a non-isolated NMOSFET 169h.

In P-channel LDMOS 169f, P+ region 157g and P well 154e act as the drain, with P well 154e serving as the lightly-doped extension of the drain to help spread the voltage drop laterally between P+ region 157g and N well 153h. The voltage at P+ region 157g should not exceed the breakdown voltage of the junction between P well 154e and deep N layer 152e. N+ region 159k, N well 153h, and deep N layer 152e act as the body, and P+ region 157h acts as the source. Again, the source and body are typically shorted together by means of metal source-body contact 167, as shown, but could be biased separately. The drain (P+ region 157g and P well 154e) is isolated from P substrate 151 by N well 153h and deep N layer 152e.

Substrate PNP transistor 169g includes P+ region 157k which acts as the emitter, N+ region 159m and N well 153j which act as the base, and P+ region 157i and P well 154f which are tied to P substrate 151 and together act as the collector. Substrate PNP transistor 169g may lead to currents in P substrate 151, so the current density of substrate PNP transistor 169g is normally limited to small signal applications.

NMOSFET 169h is similar to NMOSFET 169b (FIG. 7A) except that it body (P well 154f) is not surrounded by an N well and deep N layer and thus is not isolated from the substrate. NMOSFET 169h includes an N+ source region 159n, an N+ drain region 159p, a polysilicon gate 155e and a gate oxide layer 156e. A P+ region 157j provides contact to the body (P well 154f). The decision whether to make the NMOSFET isolated or non-isolated is a matter of design choice.

Figure 8C:
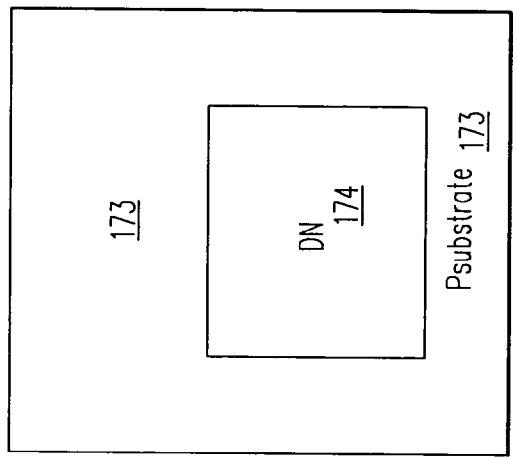
Figure 8B:
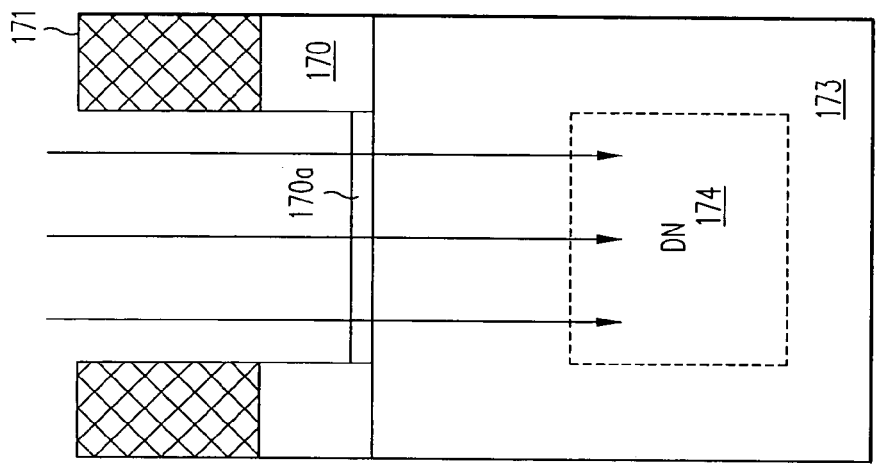
Figure 8A:
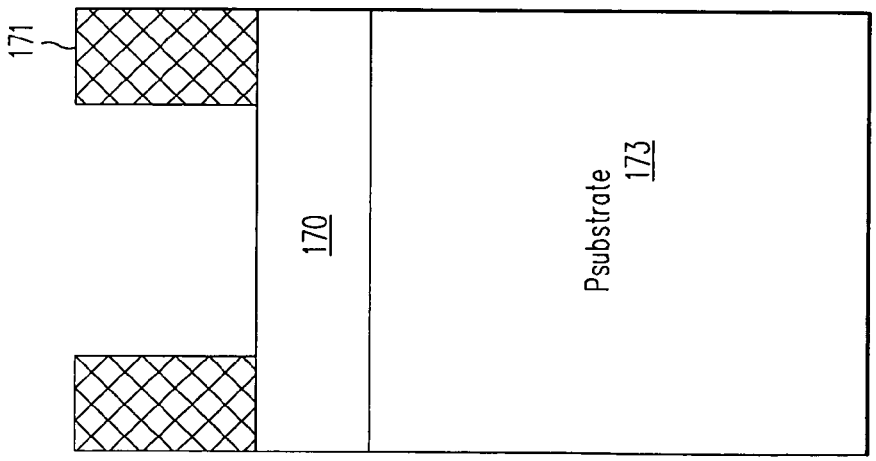

FIGS. 8A–8H illustrate a process for forming an isolated P well in accordance with the invention. In FIG. 8A, an oxide layer 170, preferably thick, has been formed on a P substrate 173. A photoresist layer 171 is deposited over oxide layer 170 and patterned, using conventional photolithographic techniques, to form an opening. As shown in FIG. 8B, oxide layer 170 is etched through the opening. Either a controlled etch can be performed, leaving a portion of oxide layer 170 in place, or the portion of oxide layer 170 under the opening can be completely removed and a new thin oxide layer can be grown. In either case, a thin oxide layer 170a remains over the P substrate 173 in the opening. An N-type dopant such as phosphorus is implanted through thin oxide layer 170a to form a deep N layer 174. Oxide layers 170 and 170a and photoresist layer 171 are then stripped, leaving the structure shown in FIG. 7C, with a compact, highly defined deep N layer 174 floating in P substrate 173.

Table I summarizes the processing steps used in the formation of deep N layer 174 and some possible variants of the process.

TABLE I

| Element | Possible Range | Preferred Range | Target | Criteria |
| --- | --- | --- | --- | --- |
| Implant-blocking oxide (170) - thickness | 100 Å–5 μm | 1 μm–3 μm | 2 μm | Oxide 170 plus mask 171 must block implant |
| Implant-blocking oxide (170) - oxidation conditions | 30 min–10 hrs @ 900–1200° C. | 2–4 hrs @ 1000–1100° C. | 3 hrs @ 1050° C. | No thermal limit |
| Pre-implant oxide (170a) - thickness | 100–1000 Å | 100–300 Å | 200 Å | To prevent surface damage |
| Photoresist blocking mask (171) - thickness | 1–5 μm | 2–3 μm | 2.5 μm | Mask 171 plus oxide 170 must block implant |
| Deep N phosphorus implant (174) - energy | 100 keV–3 MeV | 1.5–2.3 MeV | 2.3 MeV | Implant as deep as possible |

The conditions described in Table I may be altered, depending on the required voltages formed in the layers above deep N layer 174. In general, the higher the voltage rating of the device, the deeper the N layer should be implanted. Deeper implants are also needed in the event that any significant high temperature diffusions/oxidations (thermal budget) occur after the implant of the deep N layer.

Alternatively, oxide layer 170 may be grown thin and left in place during the implantation so that an etchback to form layer 170a is not required.

A pad oxide layer 172 is formed on the surface of P substrate 173, and a second photoresist layer 176 is deposited and patterned, leaving an opening as shown in FIG. 8D. The opening is preferably annular (i.e., a solid pattern with holes formed in it). An N-type dopant such as phosphorus is implanted, creating an N well 175, which because of the annular shape of the opening, surrounds any and all isolated portions 177 of P substrate 173.

Photoresist layer 176 is stripped, and a third photoresist layer 179 is deposited and patterned to form an opening over N well 175. A P-type dopant such as boron is implanted through the opening to form an isolated P well 178, having a dopant concentration greater that the dopant concentration of P substrate 173. The resulting structure is shown in FIG. 8E. Not all isolated regions 177 must receive the ion implant used to form P well 178.

The processing conditions that may be used in the formation of N well 175 and P well 178 are described in Table II, including some process variants.

TABLE II

| Element | Possible Range | Preferred Range | Target | Criteria |
|---|---|---|---|---|
| Pre-implant oxide | 500–1000 Å | 50–200 Å | 100 Å | Low-temperature to avoid deep N updiffusion |
| Implant blocking masks (176, 179) | 1–5 µm | 2–3 µm | 2.5 µm | Must block well implants |
| N well 175 (phosphorus) implant conditions | 1E11–1E14 cm$^{-2}$, 150 keV–2 MeV (one or multiple implants) | 1E11–1E12 cm$^{-2}$, E < 300 keV or 1E12–1E14 cm$^{-2}$, E > 700 keV | 1E12 cm$^{-2}$, 250 keV or 3E13 cm$^{-2}$, 1 MeV | N well should overlap deep N layer |
| P well 178 (boron) implant conditions | 1E11–1E14 cm$^{-2}$ 100 keV–1.4 MeV (one or multiple implants | 1E11–1E12 cm$^{-2}$, E < 200 keV or 5E12–1E14 cm$^{-2}$, E > 400 keV | 1E12 cm$^{-2}$, 150 keV or 3E13 cm$^{-2}$, 500 keV | Projected range of P well should be below projected range of N well |

The P well and N well can be made from single implant but then must be doped heavily to avoid punchthrough breakdown. In Table II the target exemplifies a two-implant well formation comprising a shallow and a deeper implant. This method works well for the fabrication of 5V CMOS devices and produces acceptable results for the fabrication of 12V CMOS devices.

The shallow implants set the basic CMOS device characteristic being sufficiently heavily-doped top prevent channel punchthrough but light doped enough to exhibit a threshold voltage close enough to the target that a shallow $V_t$ adjusting implant is able to set the final threshold voltage value (without excessive counterdoping). The well doping must also be light enough to meet the required breakdown voltage. A "shallow" implant in this context is an implant at an energy under 200 keV for boron or under 300 keV for phosphorus, and a "deep" implant is an implant at an energy over 400 keV for boron or over 700 keV for phosphorus. The dose of the deeper implants is preferably higher to help suppress parasitic bipolar action. The P well, however, must not be as deep as the deep N layer; otherwise, the P well may counterdope the deep N layer and the isolation capability of the device will be degraded.

The well doping profile may also be constructed b additional implants but then the surface dose may be further reduced accordingly. For example, a 12V compatible N well as described may comprise a 1E12 m$^{-2}$ phosphorus implant at 250 keV and a 3E13 cm$^{-2}$ phosphorus implant at 1 MeV. An added implant, for example, an extra 7E12 cm$^{-2}$ may be included at an intermediate energy such as 600 keV. The lower the energy of the added implant, the more likely the surface concentration may be affected.

In a 5V only device the need for multiple chained implants is less than in 12V devices, since all the implanted layers can be formed closer to the surface, i.e., at lower implant energies. Since the dopant is constrained to a thinner layer, the resulting concentration for a given dose is increased. Accordingly, 5V CMOS wells may be produced with a lower implant dose but still produce a layer having a higher dopant concentration.

A 5V N well may comprise a deep implant of only 5E12 cm$^{-2}$ at 500 keV, one-half the energy and one-sixth the dose of the deeper 12V deep well. The shallow implant of a 5V N well may comprise a dose of 6E11 cm$^{-2}$ at 250 keV, not a substantial difference in energy from a 12V device. The lower dose is not so critical since the PMOS device's characteristic is more a function of a subsequent $V_t$ adjusting implant than the well itself. Moreover, PMOS devices are less likely to exhibit parasitic snapback than NMOS devices.

The fabrication of a 5V NMOS in a 5V P well is substantially different from the fabrication of a 12V NMOS in a 12V P well. Both the 5V P well and the 12V P well comprise the combination of a deep implant to prevent bulk punchthrough and a shallow implant to prevent surface punchthrough In both cases the shallow implant has its peak near the surface, a consequence of a 40 keV implant. The shallow implant of the 5V P well generally has a higher dose than the 12V P well, ranging from 20% higher to as much as double, primarily to prevent punchthrough in the shorter channel length 5V device.

The deep boron implant used in the 5V P well is however, both shallower and lighter than the 12V P well. For example, the 5V P well may comprise an implant dose of around 1 to 2E13 cm$^{-2}$ at an energy of 250 keV. The 12V P well in contrast uses a deep implant at an energy near 500 keV and an implant dose of 3E13 cm$^{-2}$ to 5E13 cm$^{-2}$ (nearly twice the energy and twice the dose of the 5V P well). While it may seem counter intuitive to use a higher dose implant for a higher voltage device, bulk punchthrough and snapback phenomena occur in higher voltage devices farther away from the surface than in low voltage devices. The parasitic bipolar phenomenon is exacerbated in the bulk due to a higher minority carrier lifetime. Impact ionization is also worsened by the alignment of the path of current through high electric field regions of a the drain depletion region in a saturated MOSFET. Increasing the deep implant doping minimizes these effects.

Figure 8F:
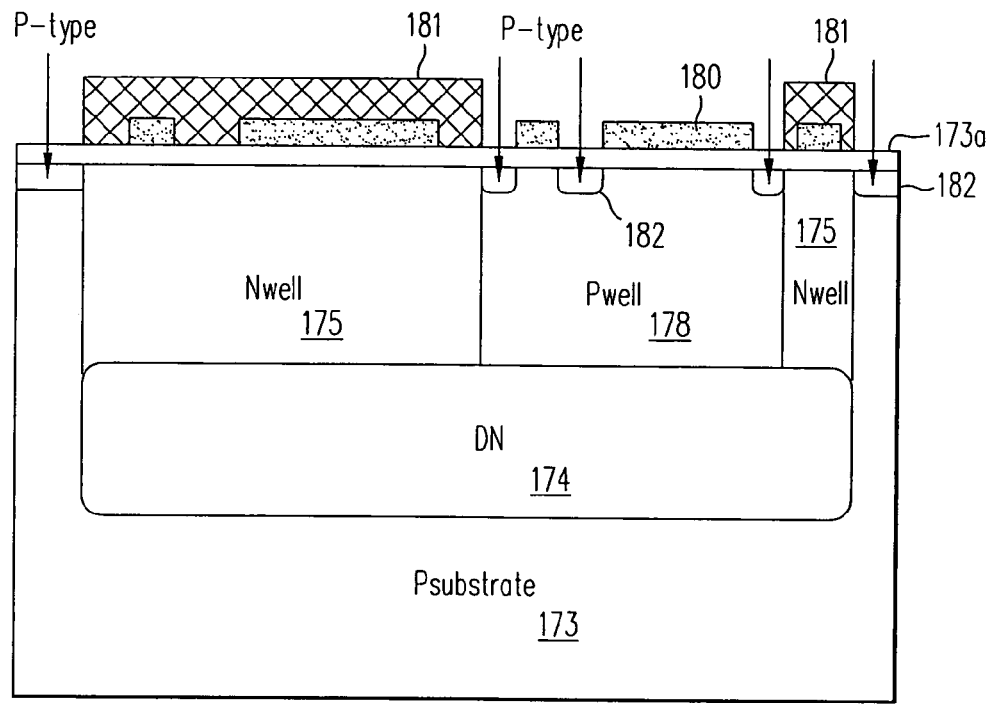

As shown in FIG. 8F, a silicon nitride layer 180 is deposited over pad oxide layer 173a. Nitride layer 180 is patterned and etched, using conventional photolithographic techniques, to expose certain areas of pad oxide layer 173a. A photoresist layer 181 is then deposited over nitride layer 180 and patterned to create an opening over P well 178. A P-type dopant such as boron is implanted through the openings in nitride layer to form enhanced-concentration P field doped (PFD) regions 182 in P well 178 and in other P wells in the structure.

Figure 8G:
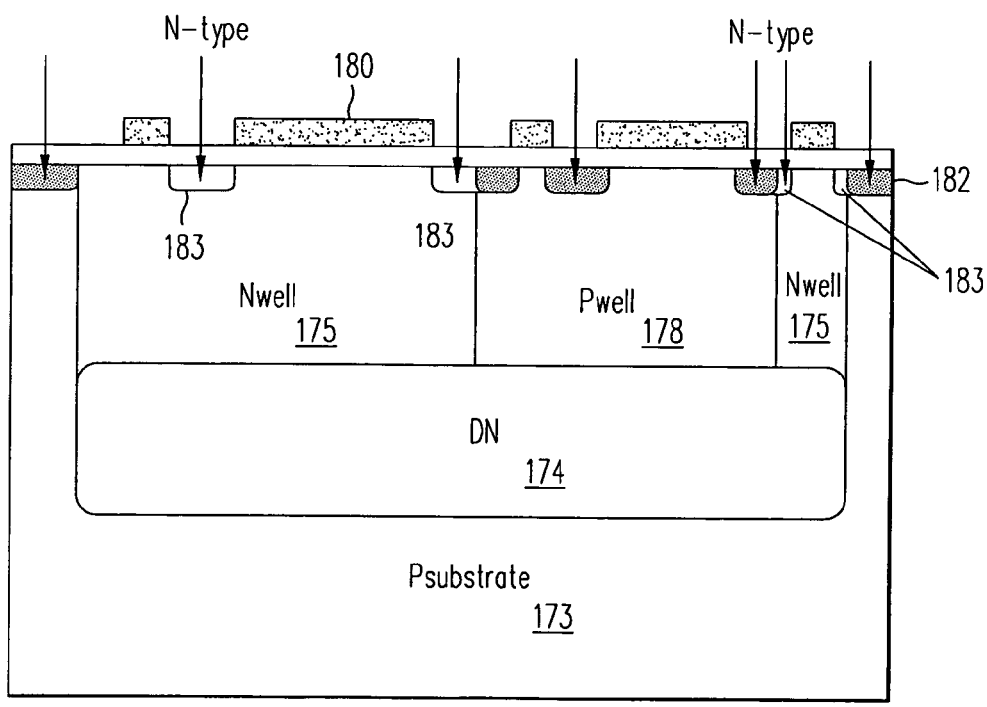

As shown in FIG. 8G, photoresist layer 181 is removed, and an N-type dopant such as phosphorus or arsenic is implanted through the openings in nitride layer 180 to form enhanced-concentration N field doped (NFD) regions 183. The dopant that goes into N well 175 forms NFD regions 183, while the NFD dopant that goes into P well 178 is not concentrated enough to completely counterdope the PFD regions 182. Unlike the case with conventional CMOS devices, the thermal oxidation time and temperature must be held to a minimum to prevent redistribution of the dopant in the deep N layers and in the N wells and the P wells, especially the heavily-doped portions thereof. For field oxides approximately 4000 Å in thickness, NFD implant of around 5E13 $cm^{-2}$ are employed while PFD implants twice that dose are required. The implants are at a low energy, typically about 50 keV.

P substrate 173 is subjected to a low-temperature oxidation, producing field oxide layers 184 in the portions of P substrate that underlie the openings in nitride layer 180. This is the well-known local oxidation of silicon (LOCOS) process. The anneal also drives in PFD regions 182 and NFD regions 183, thereby forming field dopant regions which together with field oxide layers 184 provide a higher field threshold and prevent inversion in the areas between the active devices.

Figure 8H:
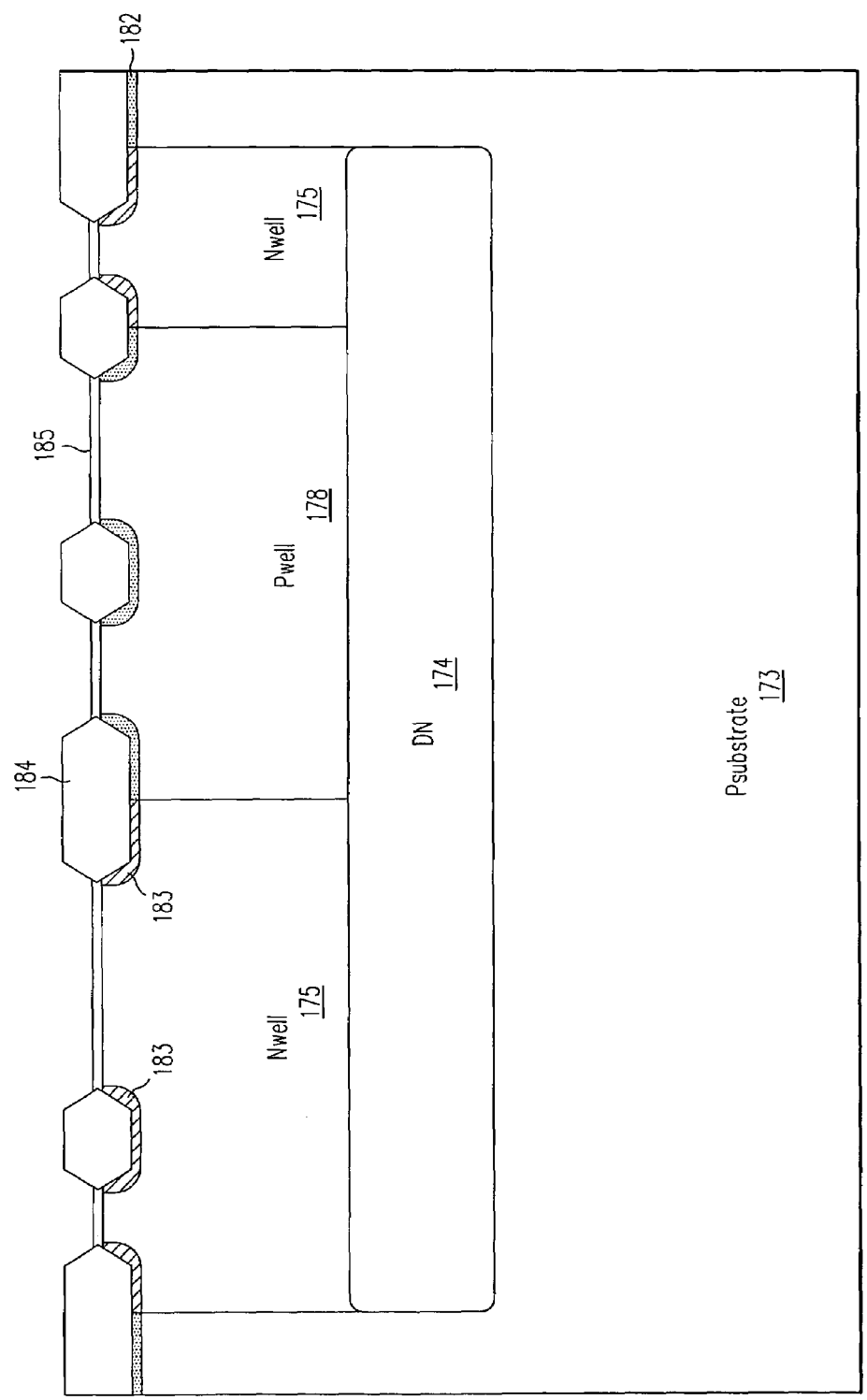

Next, a sacrificial oxide layer (not shown) is formed on the surface of P substrate 173, and a gate oxide layer 185 is grown. The isolated structure shown in FIG. 8H is ready for the formation of MOSFETs, for example, the CMOS devices shown in FIG. 7A.

Figures 9A, 9B:
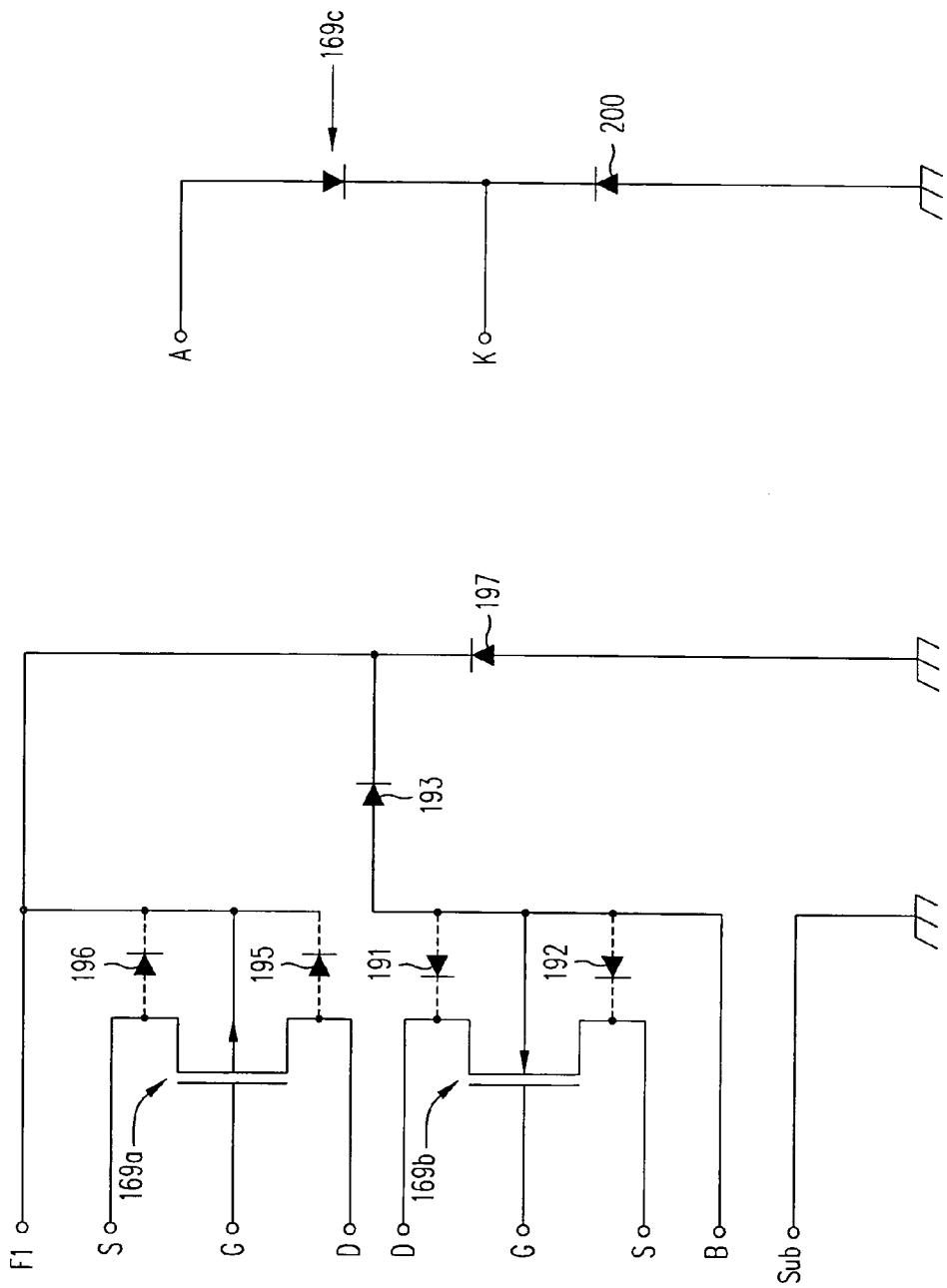
FIGS. 9A–9G are schematic diagrams that represent the devices shown in FIGS. 7A–7C FIGS. 10A–10F illustrate how the depth of the N deep isolating layer in the substrate can be varied while still providing an isolation structure.

FIGS. 9A–9G are schematic diagrams that represent the devices shown in FIGS. 7A–7C, which have been similarly numbered in FIGS. 9A–9G. FIG. 9A shows PMOSFET 169a and NMOSFET 169b (FIG. 7A). NMOSFET 169b is isolated from P substrate 151 by diode 193, which represents the PN junction between P well 154b and deep N layer 152a, and by diode 197, which represents the PN junction between deep N layer 152a and P substrate 151. Diodes 193 and 197 are back-to-back diodes that completely isolate NMOSFET 169b from P substrate 151. The cathodes of diodes 193 and 197 (i.e., the deep N layer) can be biased to an arbitrary potential, labeled as "FI" (an acronym for "floor isolation") but are typically biased at the most positive potential on the chip. This potential is also commonly used to bias the source of PMOSFET 169a.

Figure 9C:
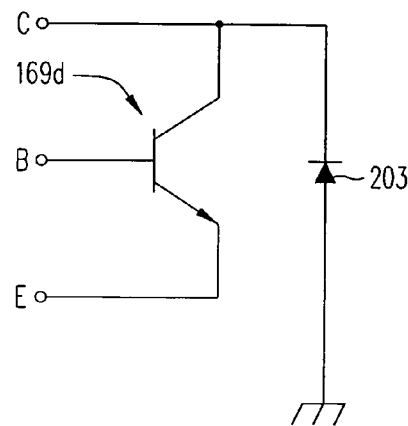
Figure 9D:
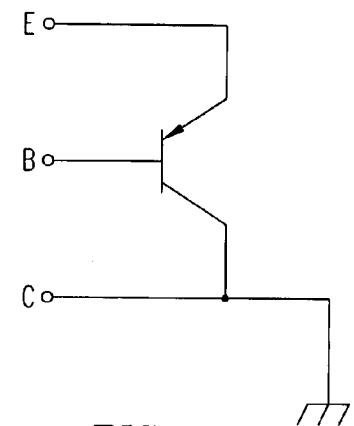

In FIG. 9B, diode 169c (FIG. 7A) is isolated from P substrate 151 by a diode 200, which represents the junction between deep N layer 152b and P substrate 151. In operation, the cathode of (pin K) of diode 169c must remain more positive than ground (the anode of diode 200). FIG. 9C shows NPN transistor 169d (FIG. 7B), with the diode 202 representing the junction between P substrate 151 and deep N layer 152c. FIG. 9D shows the substrate PNP transistor 169g (FIG. 7C). It is important that the collector (P+ region 157i) be physically located near the base (N well 153i) so that the current does not flow too far into and along the P substrate 151.

Figure 9E:
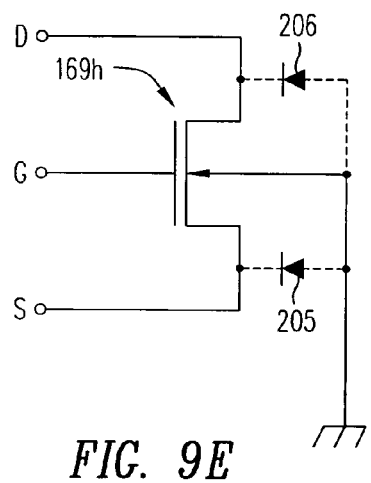
Figure 9F:
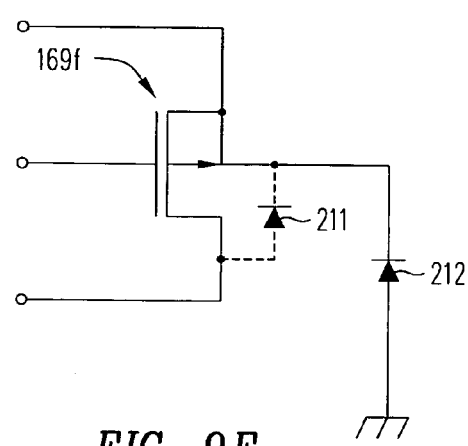
Figure 9G:
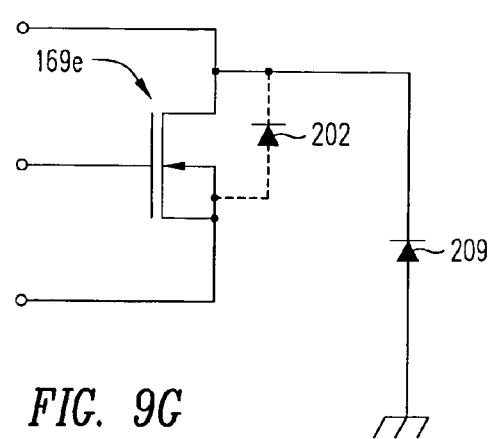

FIG. 9E shows the non-isolated NMOSFET 169h (FIG. 7C), having a structure similar to NMOS 169b of FIG. 9A but without the deep N layer forming diodes 193 and 197. FIG. 9F shows lateral high-voltage PMOSFET 169f (FIG. 7C). Diode 212 represents the junction between deep N layer 152e and P substrate 151. The body (N well 153h) is shorted to the source (P+ region 157h), and "anti-parallel" diode 211 represents the junction between the body and the drain (P well 154e). FIG. 9G shows the lateral NMOSFET 169e (FIG. 7B). Diode 209 represents the junction between deep N layer 152d and P substrate 151. The body (P well 154d) is shorted to the source (N+ region 159j), and "anti-parallel" diode 208 represents the junction between the body and the drain (N well 153f).

FIGS. 10A–10F illustrate how the depth of the deep N layer in the substrate can be varied while still providing an isolation structure.

Figure 10B:
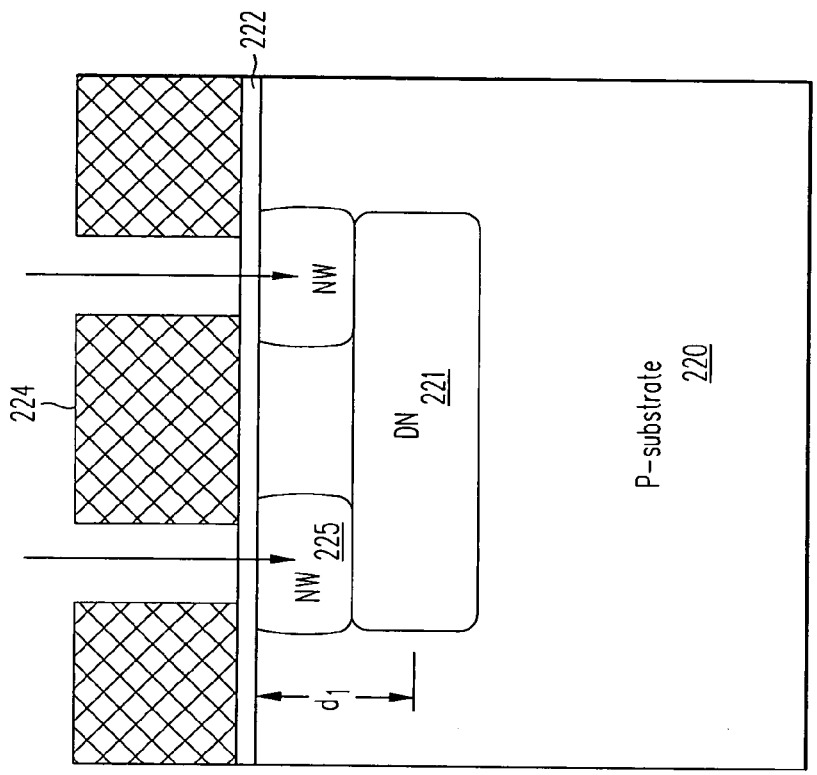
Figure 10A:
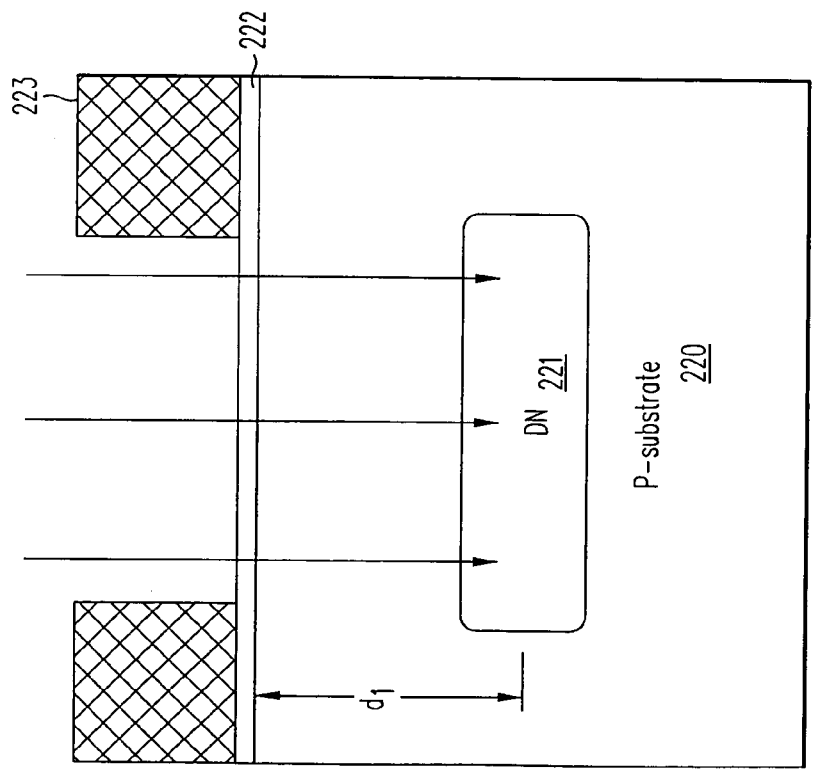

FIG. 10A shows a deep N layer 221 that is implanted to a depth $d_1$ into a P substrate 221. Deep N layer is implanted through an opening in a photoresist layer 223 and through an oxide layer 222. In FIG. 10B, photoresist layer 223 has been removed and replaced by a photoresist layer 224, which is patterned with an annular opening. Dopant is implanted through the annular opening in photoresist layer 224 to form an N well 225, which merges with deep N layer 221 to form an isolation structure. Alternatively, the ring can be formed with a separate implant having a higher dose that the N well.

Figure 10D:
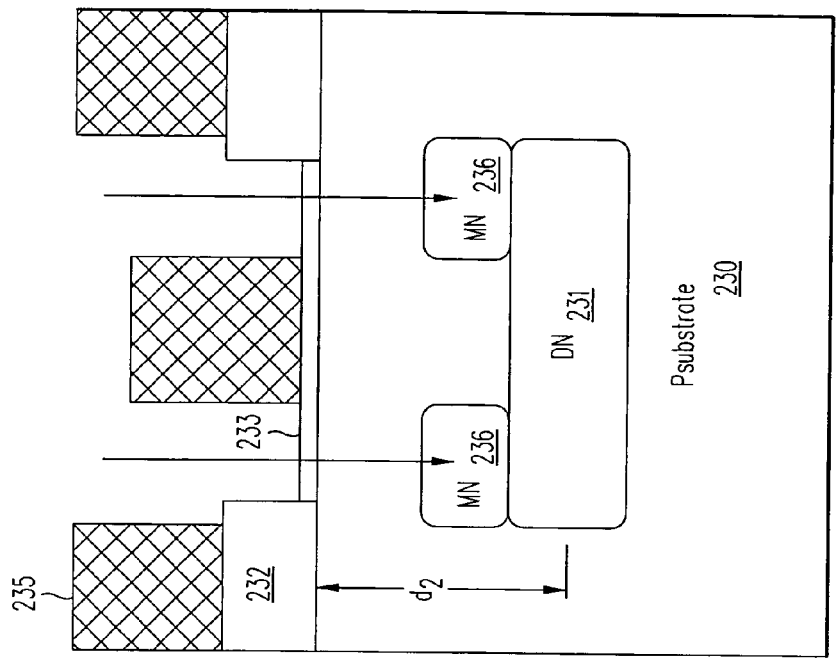
Figure 10C:
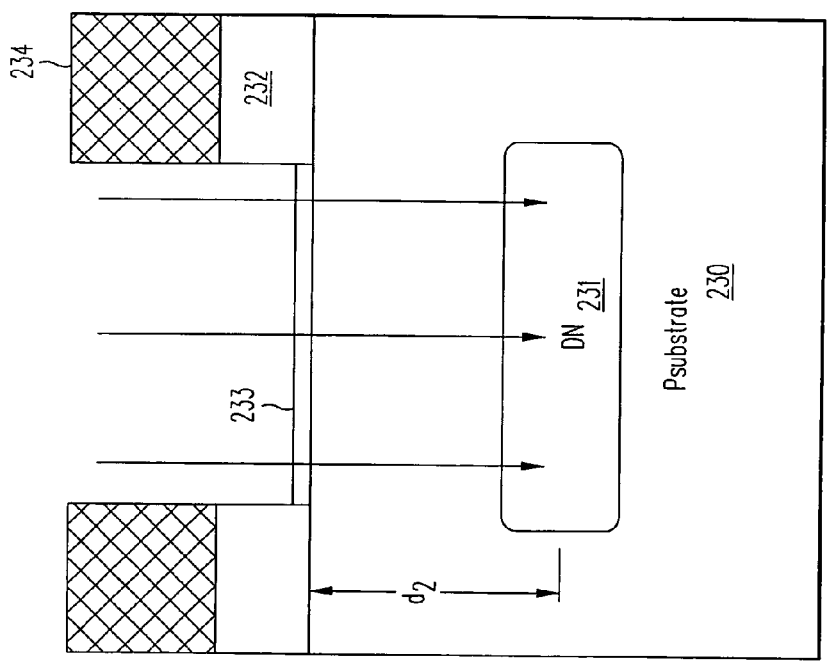
Figure 10F:
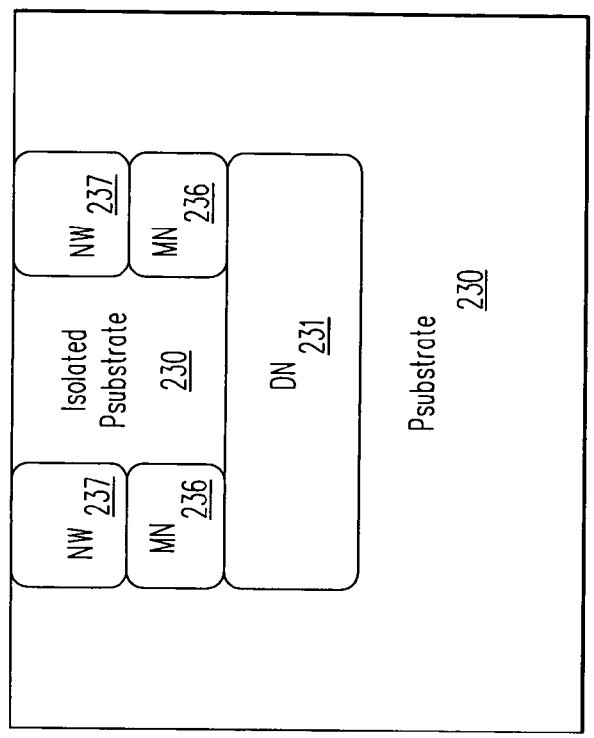
Figure 10E:
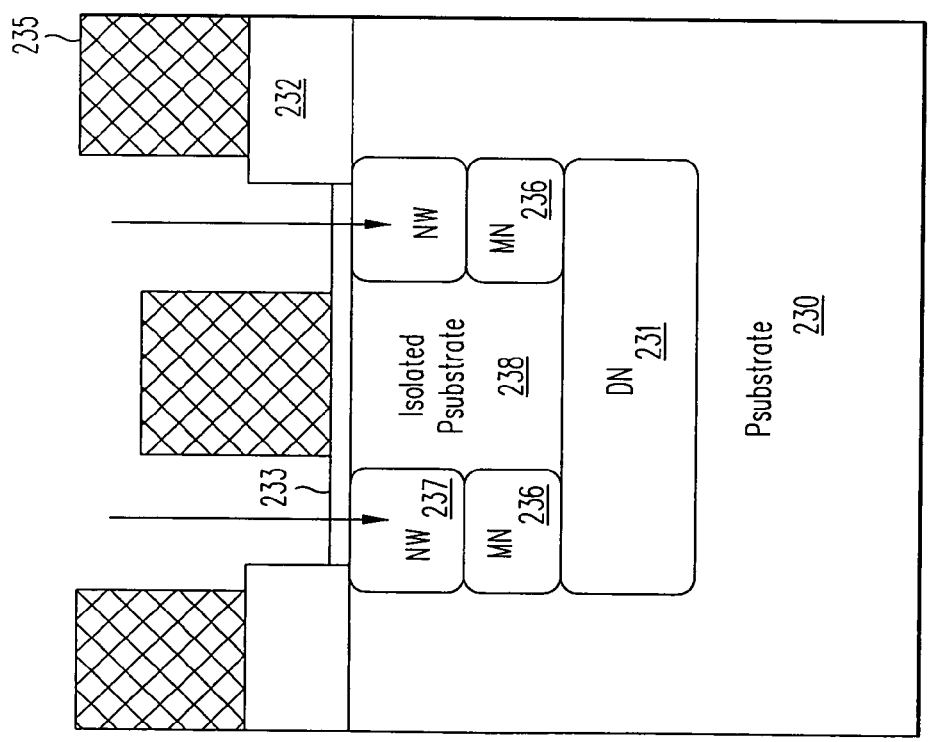

In FIG. 10C, a thick oxide layer 232 and a photoresist layer 234 have been deposited on a P substrate 230 and patterned to provide an opening. A thin oxide layer 233 is grown in the opening. Alternatively, oxide layer 232 can be etched back to form the thin oxide layer. A deep N layer 221 is implanted in P substrate 230 through the thin oxide layer 233. Photoresist layer 234 is removed, and a photoresist layer 235 is deposited with an annular opening, as shown in FIG. 10D. Deep N layer 221 is implanted to a depth $d_2$ greater than $d_1$ that makes it difficult to form an isolation structure using a single N well such as N well 225 shown in FIG. 10B. Instead, as shown in FIGS. 10D and 10E, first an intermediate medium-depth N (MN) well 236 is formed on the topside of deep N layer 231, and this is followed by the implant of a second N well 237, which reaches to the surface of P substrate 230 and merges with N well 236. Typically the dose of the implant that forms N well 237 would be such as to yield a retrograde doping profile for N wells 236 and 237, i.e., the doping concentration of N well 237 is less than the doping concentration of N well 236, which in turn is less than the doping concentration deep N layer 231, although MN well 236 and deep N well may also have the same doping concentration.

The result is an isolated region 238 of P substrate 230. Oxide layers 232 and 233 and photoresist layer 235 are stripped, producing the isolation structure shown in FIG. 10F, which includes a stack of N regions that extend upward from deep N layer 231 to the surface of P substrate 230. Any number of N regions could be stacked in this way to create isolation structures of various depths. The stack of N regions can be formed very rapidly with pulsed implants of varying energies and doses to achieve an isolation structure of whatever size and doping profile are desired. The top N region, N well 237, may be a CMOS N well or a dedicated isolation implant. The sidewall consisting of MN 236 and N well 237 may also be formed using a channel implant or multiple implants at different energies.

The implants shown in FIGS. 8B, 8D and 10A–10E are preferably performed using a high energy implanter, which may achieve an implant energy of 3,000,000 eV or higher, and by limiting the amount of thermal processing following the implants to avoid diffusion of the implanted dopants. The location of the implanted dopants, both vertically and laterally, can be determined with great precision in sharp contrast to the uncertainty associated with controlling the results of thermal diffusion processes. As a result the isolation regions are compact and predictably located, and the packing density of the transistors or other devices in the substrate can be increased.

In the processes and structures defined thus far, the implants were performed through oxide layers of uniform thickness (except for areas masked from ion implantation). The resulting wells and deep layers have dopant profiles and junctions that run essentially parallel to the wafer's original flat surface.

Figure 11A:
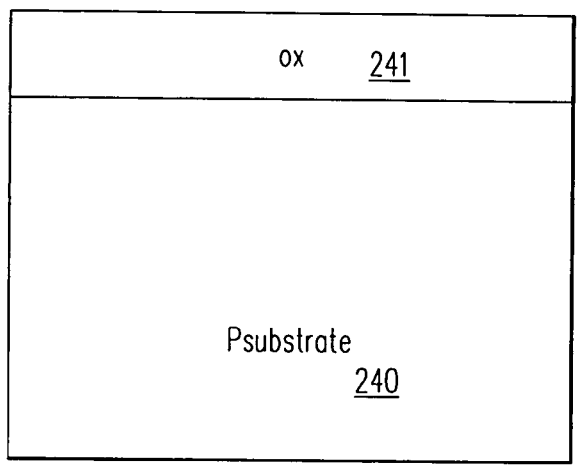
FIGS. 11A–11G show a method of forming an isolation region using a stair-step oxide.
Figure 11B:
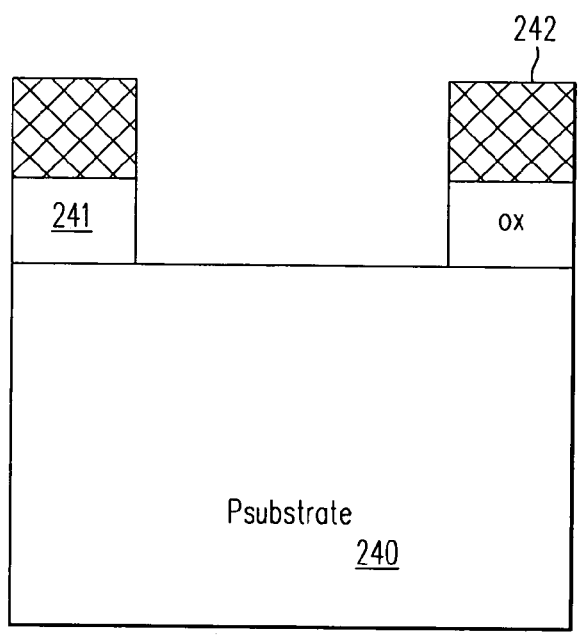
Figure 11C:
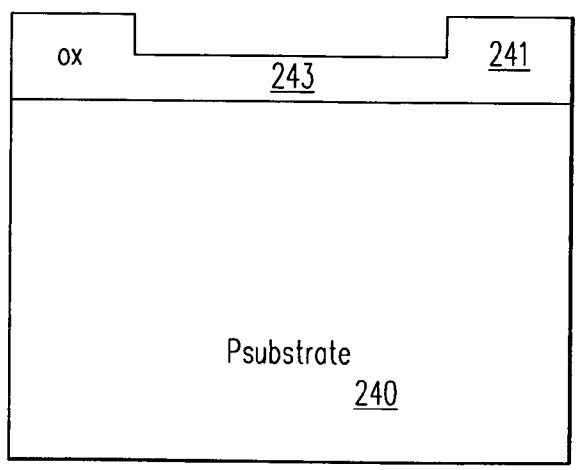
Figure 11E:
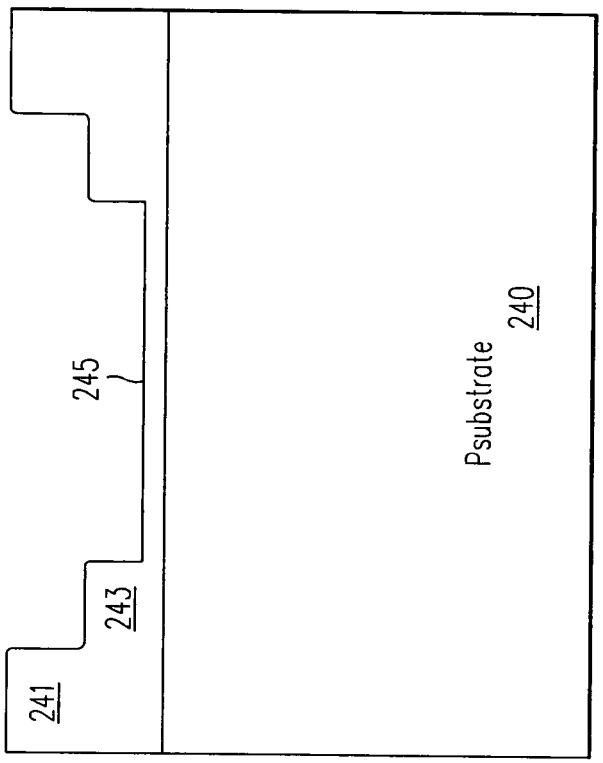
Figure 11D:
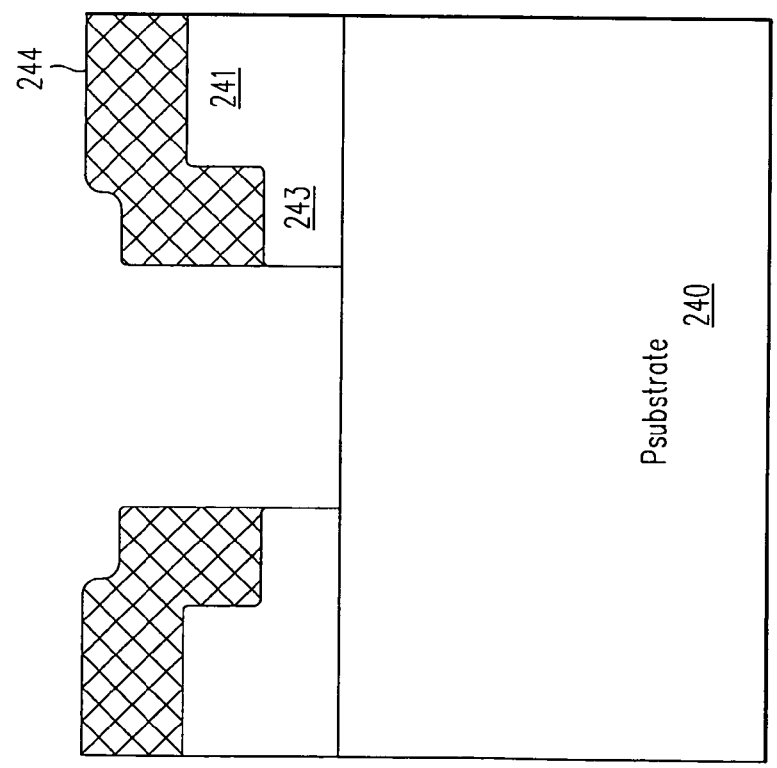

FIGS. 11A–11G show a method of forming an isolation region using a stair-step oxide. Step oxides can be used to shape or contour the junctions. The process starts with the formation of a thick oxide layer 241 over a P substrate 240. A photoresist layer 242 is deposited on top of oxide layer 241 and patterned with an opening, through which a portion of oxide layer 241 is etched, as shown in FIG. 11B. A thinner oxide layer 243 is grown in the opening, as shown in FIG. 11C. Another photoresist layer 244 is deposited and patterned, as shown in FIG. 11D, this time with a smaller opening. A portion of oxide layer 243 is removed through the smaller opening, photoresist layer 244 is removed, and a thinner oxide layer 245 is grown in the opening, yielding the stair-step structure shown in FIG. 11E.

Figure 11G:
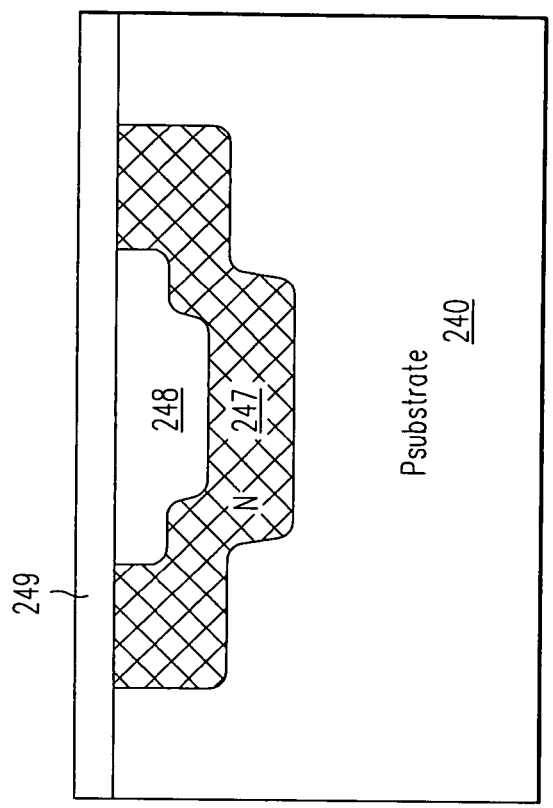
Figure 11F:
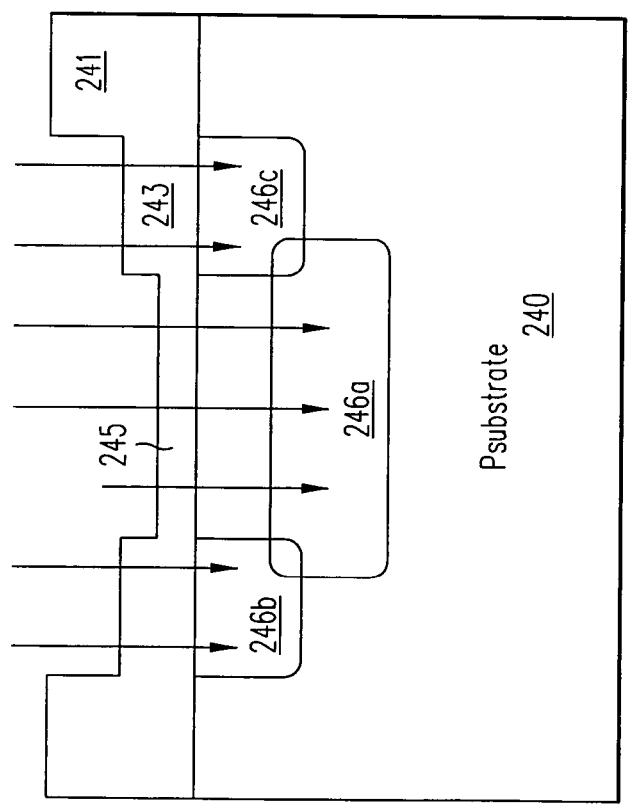

An N-type dopant such as phosphorus is implanted at a single energy through oxide layers 241, 243 and 245. Because of the different thicknesses of the oxide layers 241, 243 and 245, the range of the implant varies, producing a deep N layer 246a and N wells 246b and 246c, as shown in FIG. 11F. Oxide layer 241 is sufficiently thick that it prevents essentially all of the dopant from reaching P substrate 240. With a short anneal, a saucer-shaped isolation structure 247, shown in FIG. 11G, is formed, enclosing an isolated region 248 of P substrate 240.

In contrast to the prior structures, the depth of the implanted layer varies laterally along and across the chip, wherever an oxide step occurs. The number of steps can be increased to create a more gradual, smooth dopant profile. To create a continuously varying junction, a graded oxide may be used.

Figure 12B:
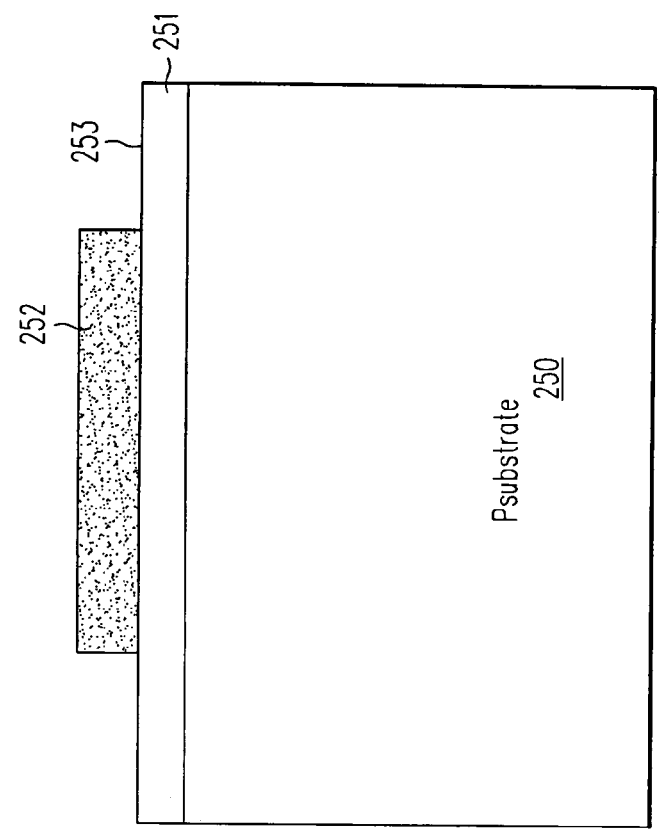
FIGS. 12A–12F show a process of forming an isolation structure that uses a LOCOS technique.
Figure 12A:
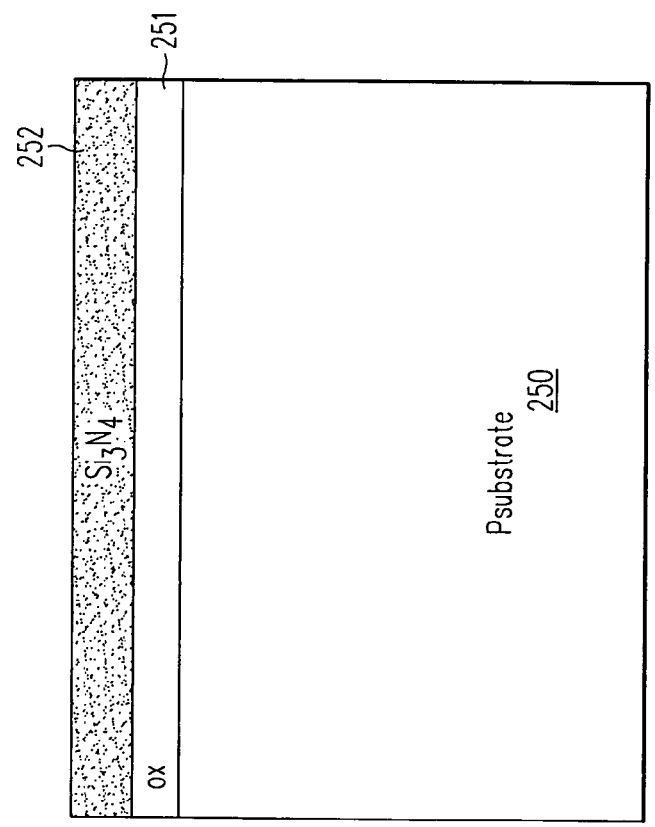

FIGS. 12A–12F show a process of forming an isolation structure that uses a LOCOS (local oxidation of silicon) technique to form the graded oxide. The process starts with a P substrate 250, on which a silicon oxide layer 251 and a silicon nitride layer 252 are deposited, as shown in FIG. 12A. Nitride layer 252 is etched, using conventional photolithography, to form openings 253, as shown in FIG. 12B. The structure is then subjected to a LOCOS process to grow a thick field oxide layer 254, shown in FIG. 12C, including the well-known "bird's beak" formations 255 where nitride layer 252 is bent upward by the growing oxide layer.

Figure 12D:
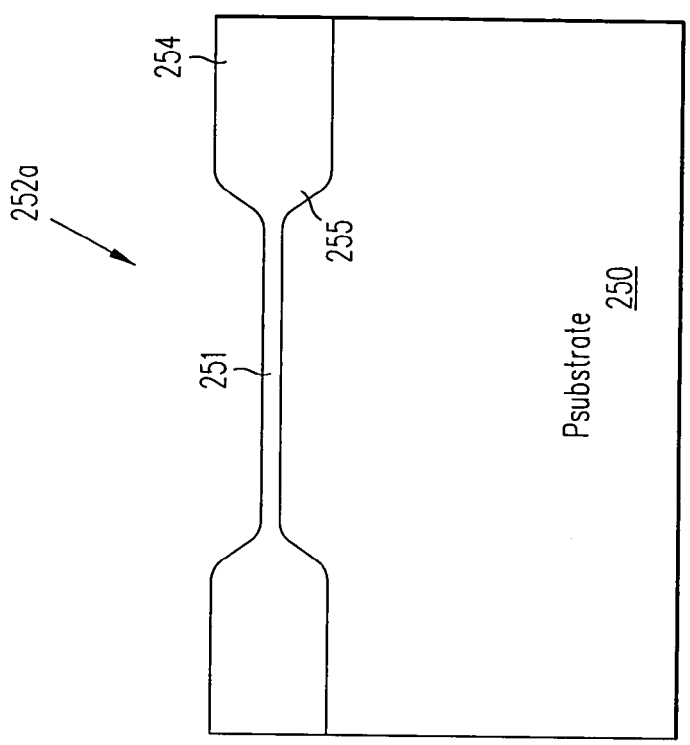
Figure 12C:
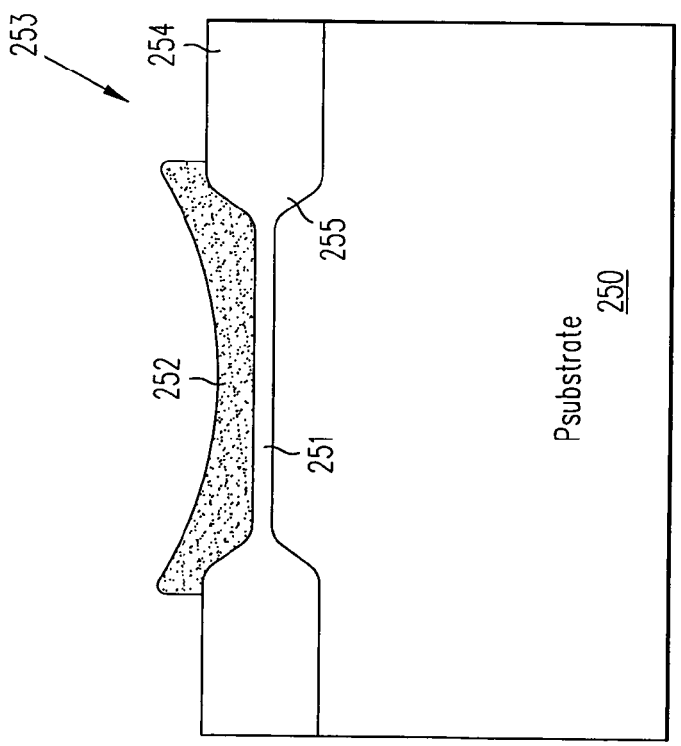
Figure 12F:
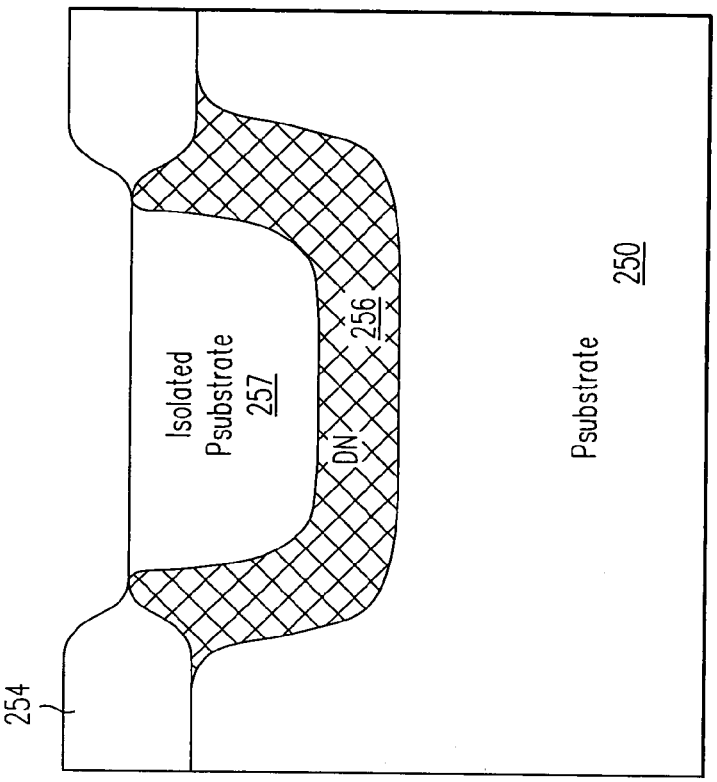
Figure 12E:
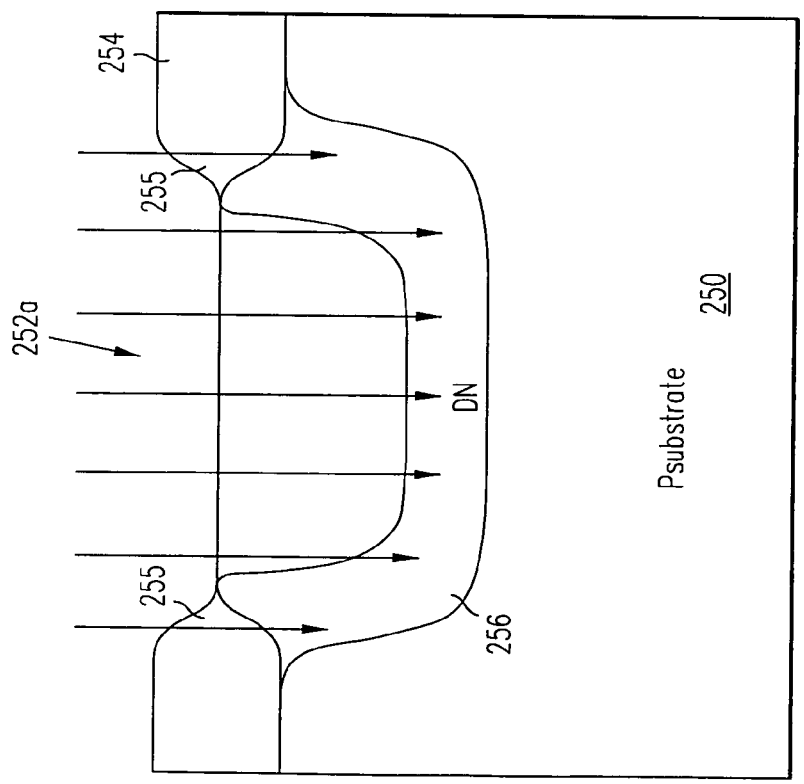

Nitride layer 252 is then removed, as shown in FIG. 12D, leaving an opening 252a where P substrate is covered only by oxide layer 251. An N-type dopant such as phosphorus is implanted to form a deep N layer 256, shown in FIG. 12E. N layer is buried in the region under opening 252a curves upward to the surface of P substrate 250 in the area under the bird's beak formations 255. In one embodiment, the dopant does not penetrate field oxide layer 254. The result is shown in FIG. 12F, with an isolated region 257 of P substrate 250 enclosed by N layer 256.

Figure 12G:
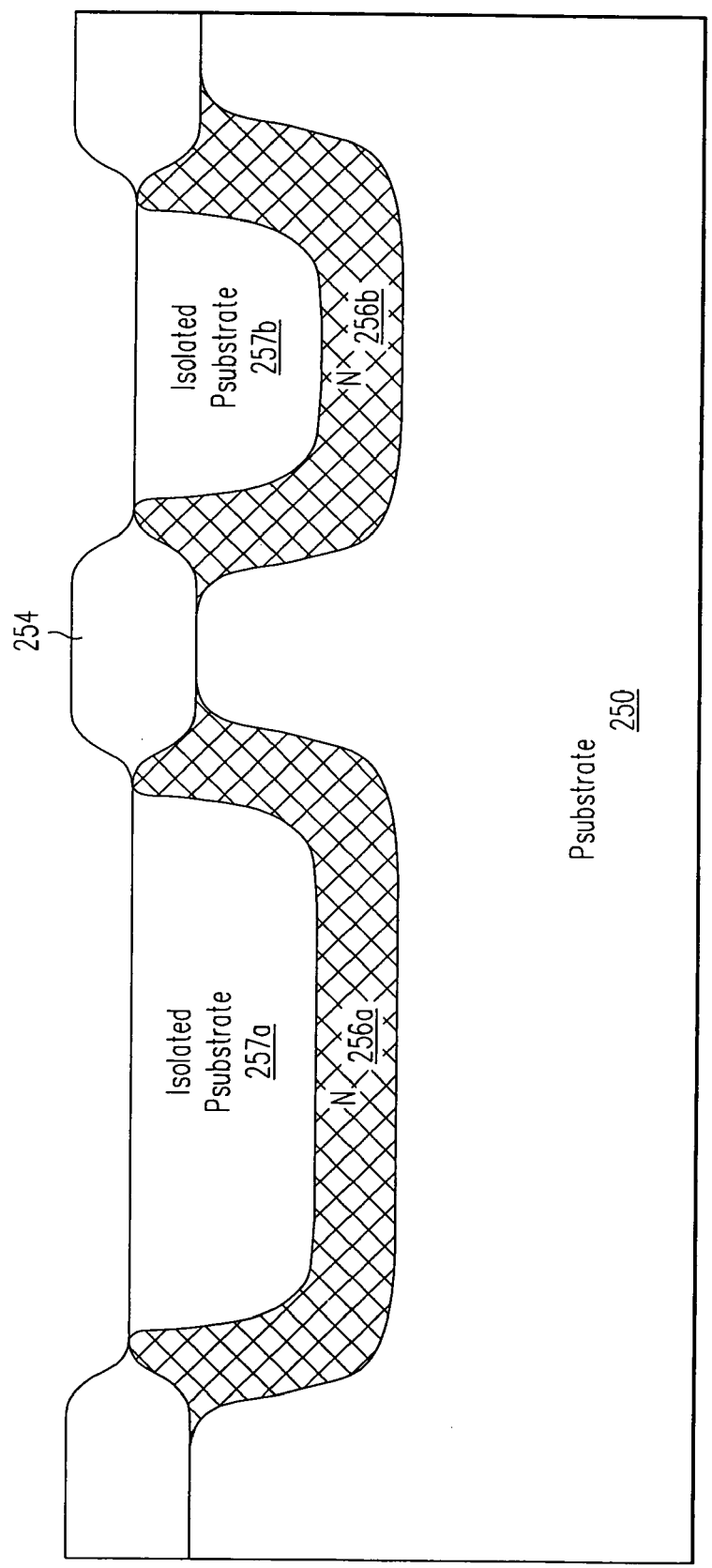
Figure 12H:
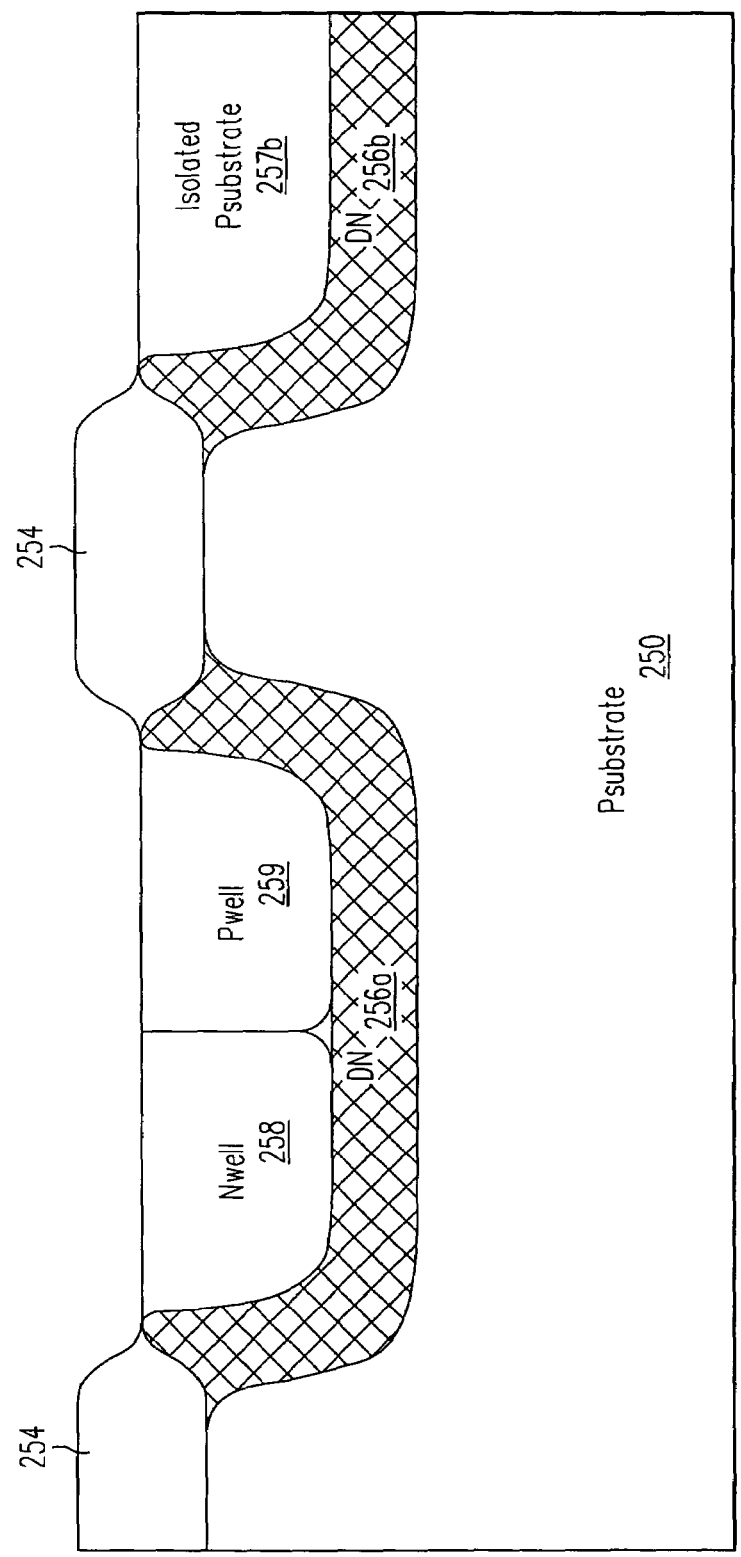

Numerous variations of this process are possible, several of which are shown in FIGS. 12G–12O. FIG. 12G shows an embodiment in which two openings are formed in the field oxide and N layers 256a and 256b are formed under the two openings, enclosing two isolated regions 257a and 257b, respectively. Provided that the segment 254 of the field oxide layer is sufficiently long, the N layers 256a and 256b remain separate. Additional P-type dopant may also be introduced between the wells. The structure shown in FIG. 12H is similar to that of FIG. 12G, except that an N well 258 and a P well 259 have been formed in the enclosed region above deep N layer 256a.

Figure 12I:
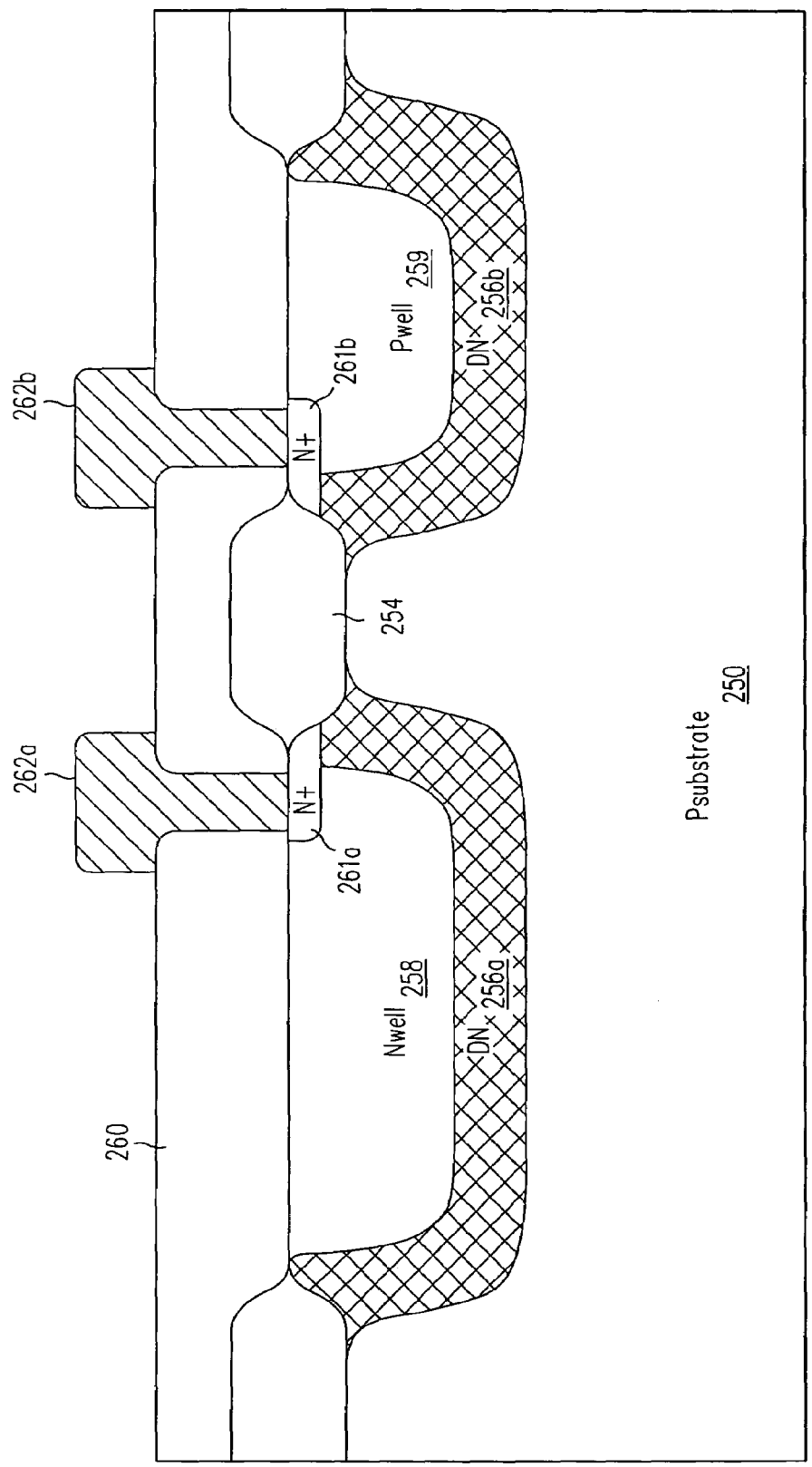

In FIG. 12I, N well 258 has been formed in the region above N layer 256a and P well 259 has been form in the region above N layer 256b. A dielectric layer 260 has been deposited over the entire structure. Two contact openings have been formed in dielectric layer 260 and N-type dopant has been implanted through the contact openings to form N+ contact regions 261a and 261b. The openings are filled with metal to form contacts 262a and 262b. Thus N layer 256a is electrically contacted by metal contact 262a, and N layer 256b is electrically contacts by metal contact 256b, allowing N layers 256a and 256b to be biased at desired potentials. Other contacts can be formed at the same time to connect to the devices fabricated in the isolated deep N rings.

Figure 12J:
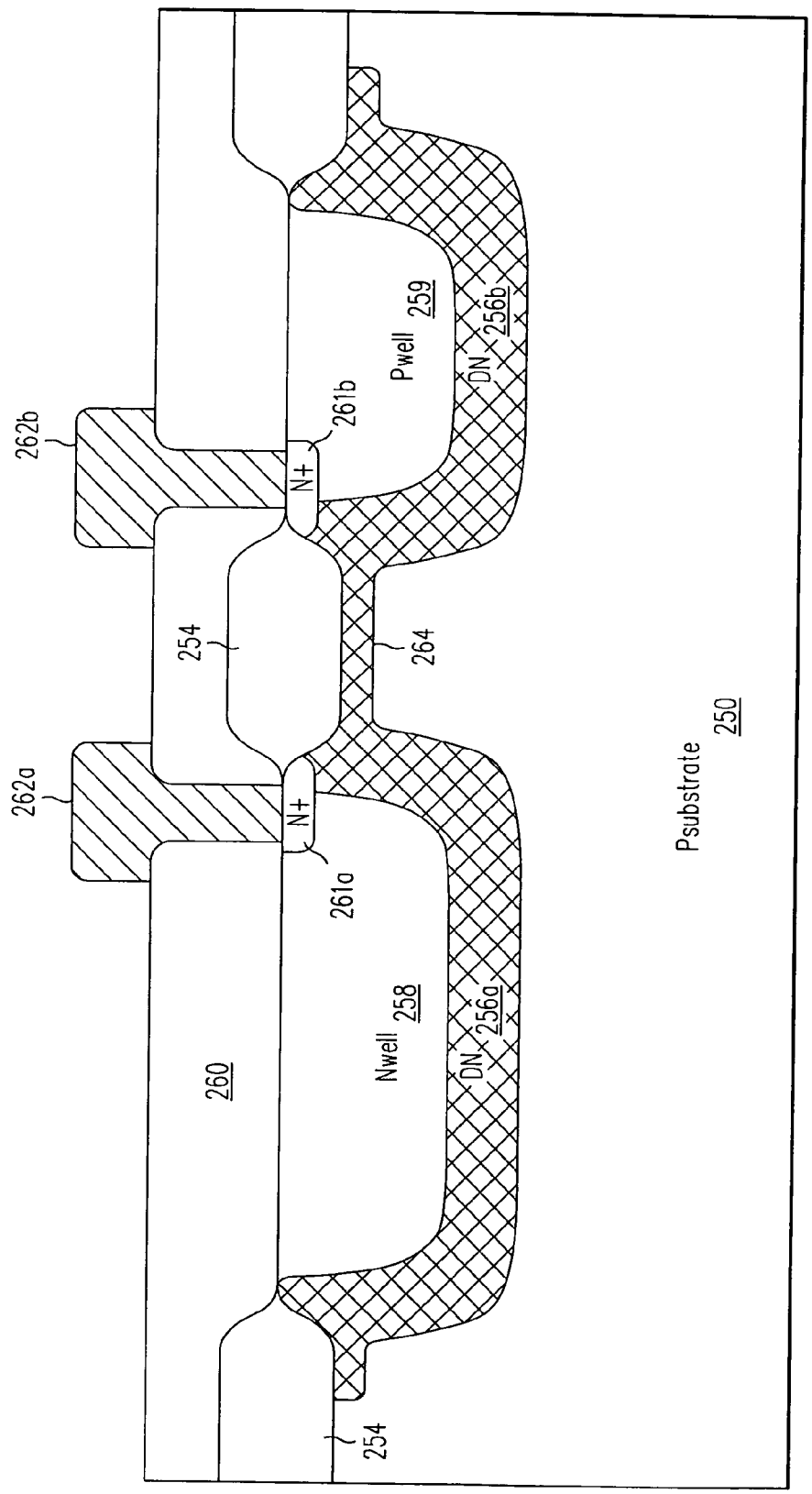

The structure shown in FIG. 12J is similar, except that N layers 256a and 256b are linked by an N layer 264 beneath region 254 of the field oxide. This is accomplished by masking the structure with a photoresist layer 270, as shown in FIG. 12K, and implanting the dopant with sufficient energy that it penetrates the field oxide region 254 but does not penetrate the photoresist layer 270.

Figure 12K:
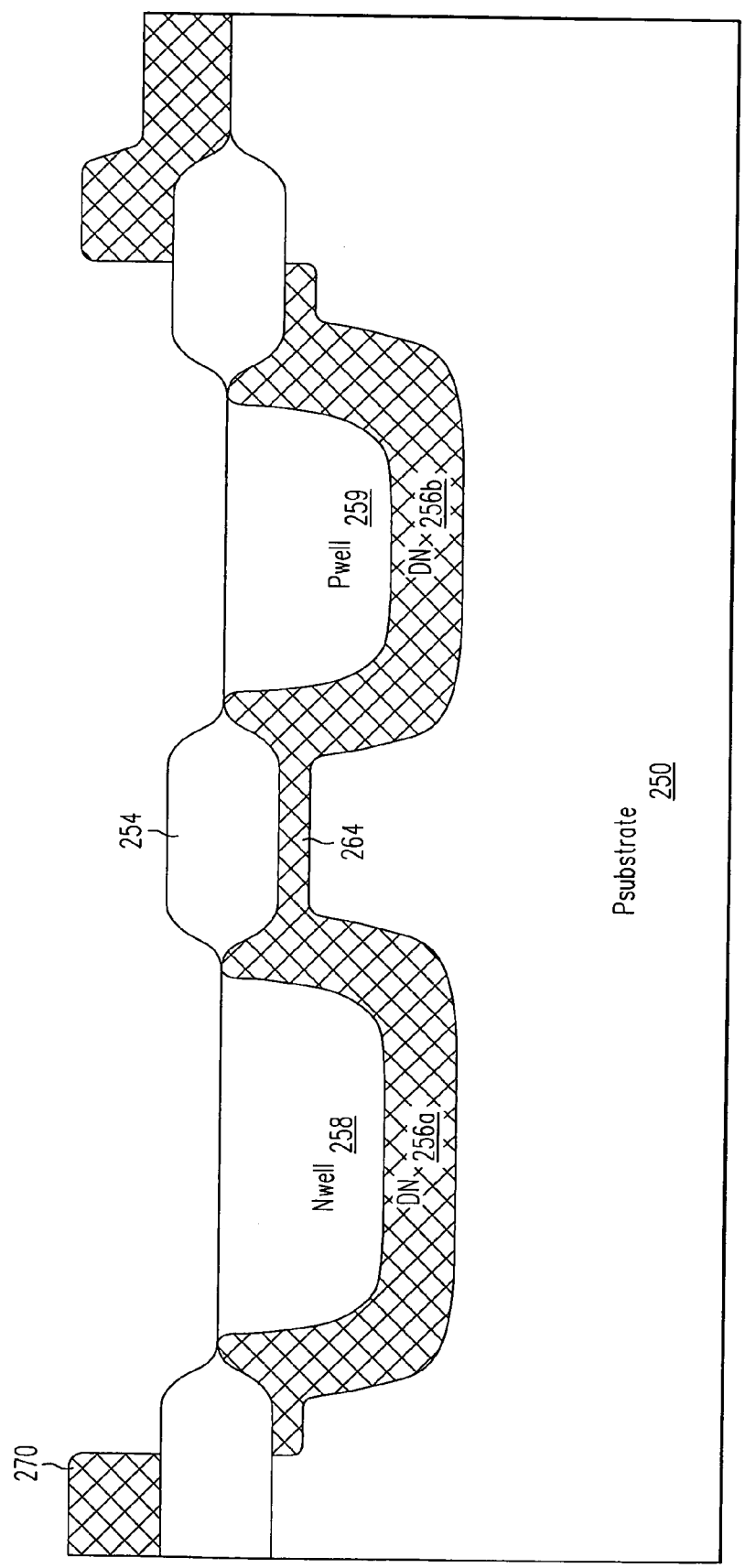
Figure 12L:
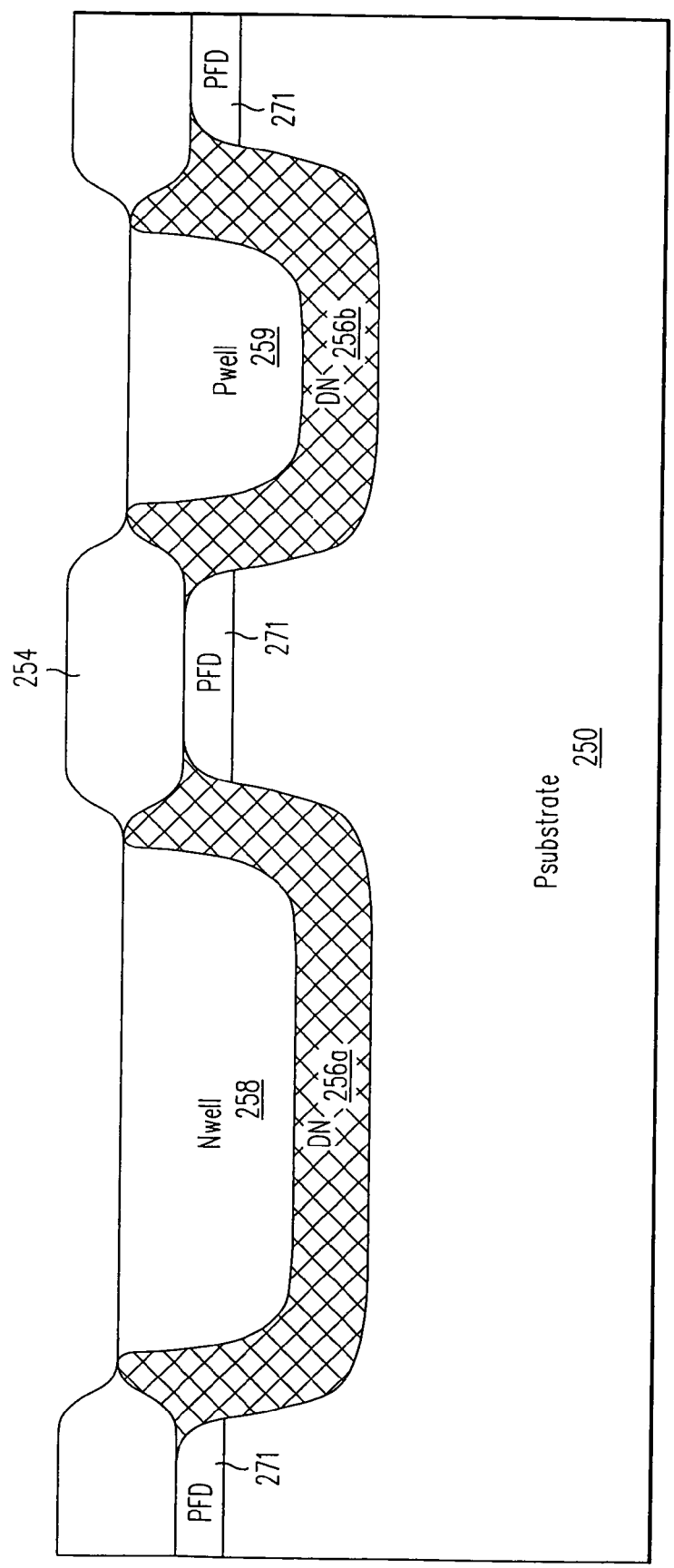
Figure 12N:
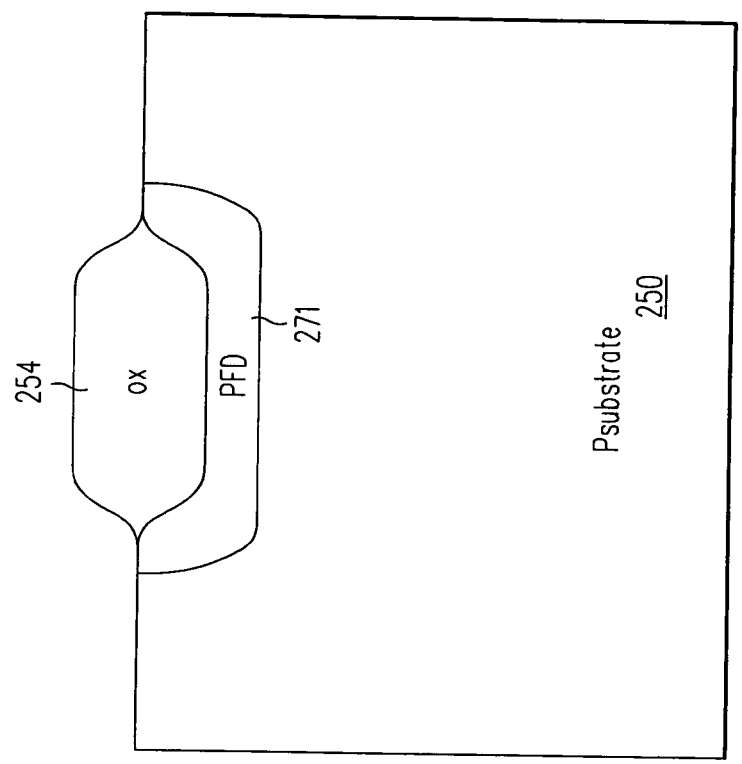
Figure 12M:
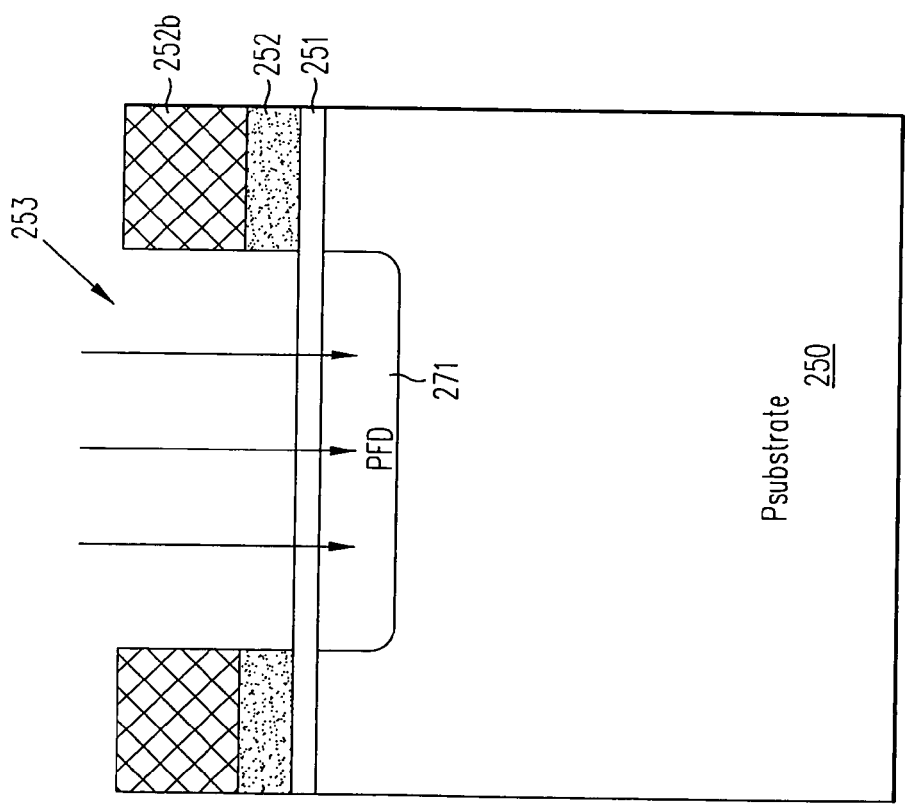
Figure 120:
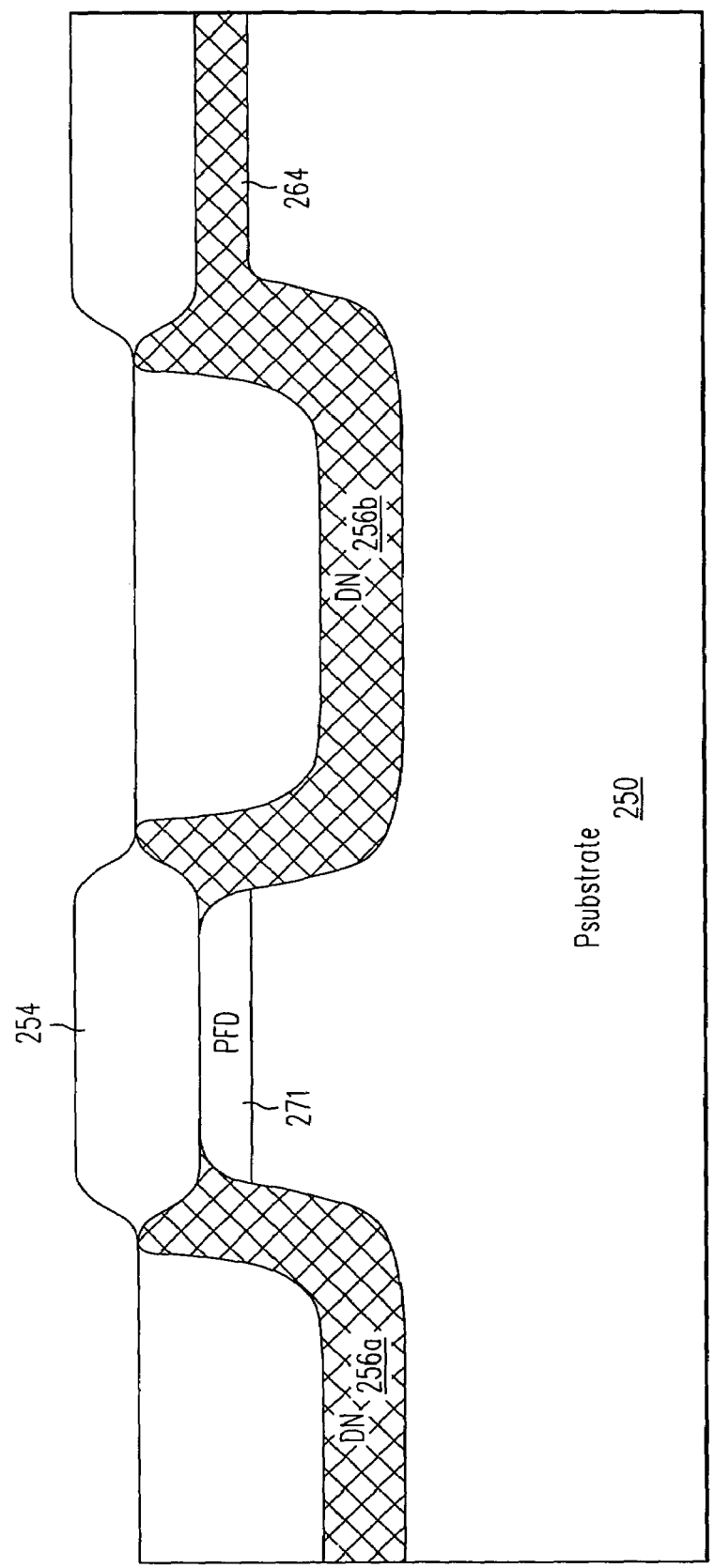

Alternatively, if it is desired to isolate N well 258 and P well 259, the structure can be masked, and a P-type dopant such as boron can be implanted to form a P field dopant (PFD) 271 under field oxide region 254, as shown in FIG. 12L. FIG. 12M shows the implanting of the P field dopant through an opening in nitride layer 251, which is patterned using a photoresist layer 252b. This occurs prior to the deep N high-energy implant. FIG. 12M shows essentially the same stage of the process that is shown in FIG. 12B, with the patterned nitride layer 252 overlying the oxide layer 251. The P dopant is implanted through opening 253 to form PFD 271. After field oxide 254 is grown, PFD 271 remains submerged under field oxide 254, as shown in FIG. 12N. Then the deep N layer implant can be performed.

Alternatively, PDF 271 could be formed by implanting dopant at a high energy through field oxide 254, after the field oxide is formed.

FIG. 12O shows a combination of FIGS. 12K and 12L, with PFD 271 isolating N well 258 from P well 259, and N layer 264 linking N layer 256b with an adjacent N layer (not shown).

Figure 13:
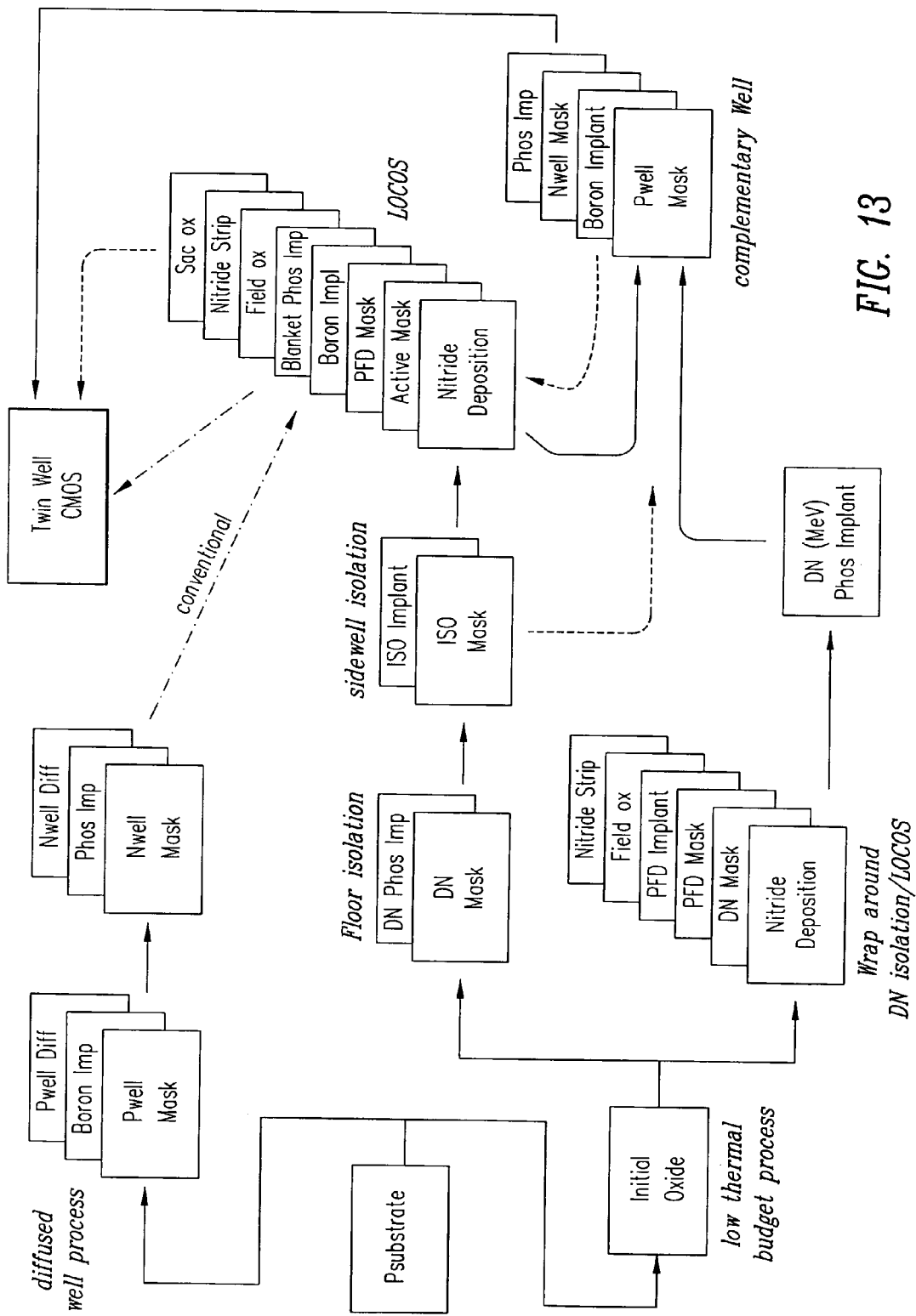
FIG. 13 illustrates several processes that can be used to form a fully isolated twin well CMOS device.

FIG. 13 provides a summary of several processes that can be used to form a twin well CMOS device. The upper path represents a conventional diffused well process using a high thermal budget. The lower paths portray two variants of a low thermal budget process in accordance with this invention. In one variant an initial oxide layer is formed and the surface is masked for the implanting of a deep N layer. After the deep N layer has been implanted, the surface is masked for the implanting of the sidewalls of the isolation structure. Alternatively, a LOCOS process can be performed and wraparound isolation structure can be formed with a high energy implant (as shown in FIGS. 12A–12F).

After the isolation structure has been formed, complementary N and P wells can be formed, each after a masking step. With the conventional process and with the floor isolation and sidewall isolation process a LOCOS process is performed to grow the field oxide regions. With the wraparound process, the field oxide regions have already been formed, so the process is complete after the complementary wells have been formed.

Figure 14B:
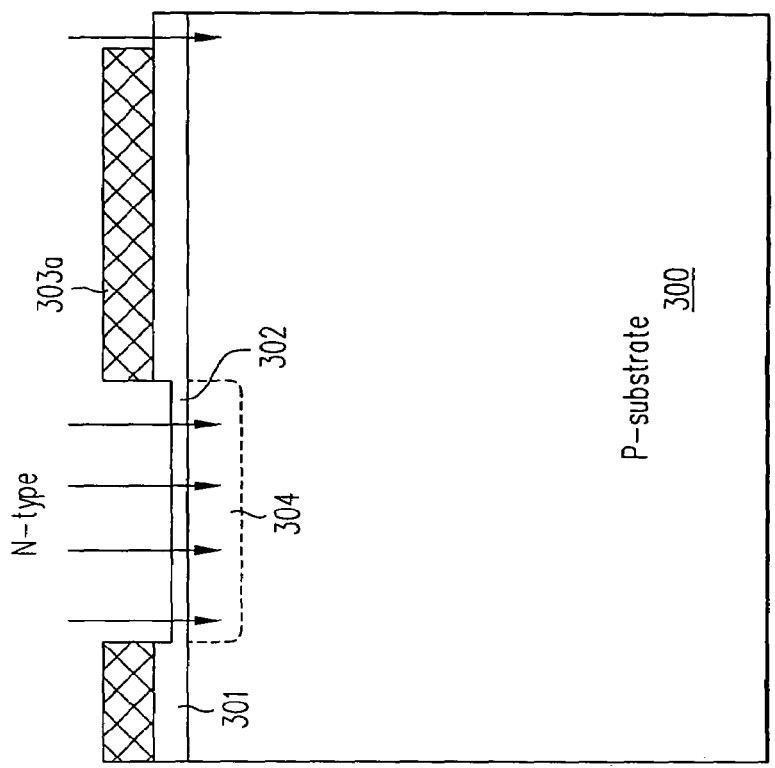
FIGS. 14A–14H illustrate a "hybrid" process which combines the conventional diffusion of N and P wells with the subsequent implanting of a deep isolating N layer.
Figure 14A:
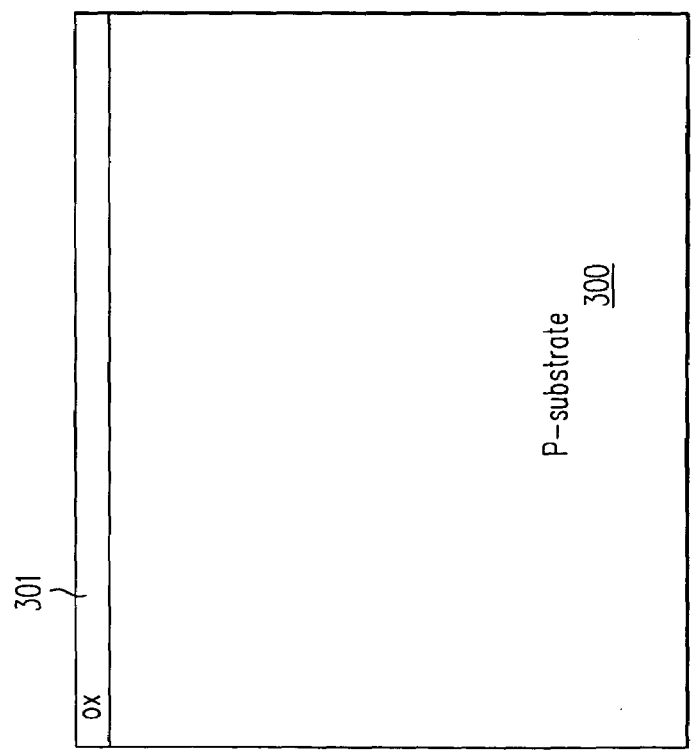
Figure 14D:
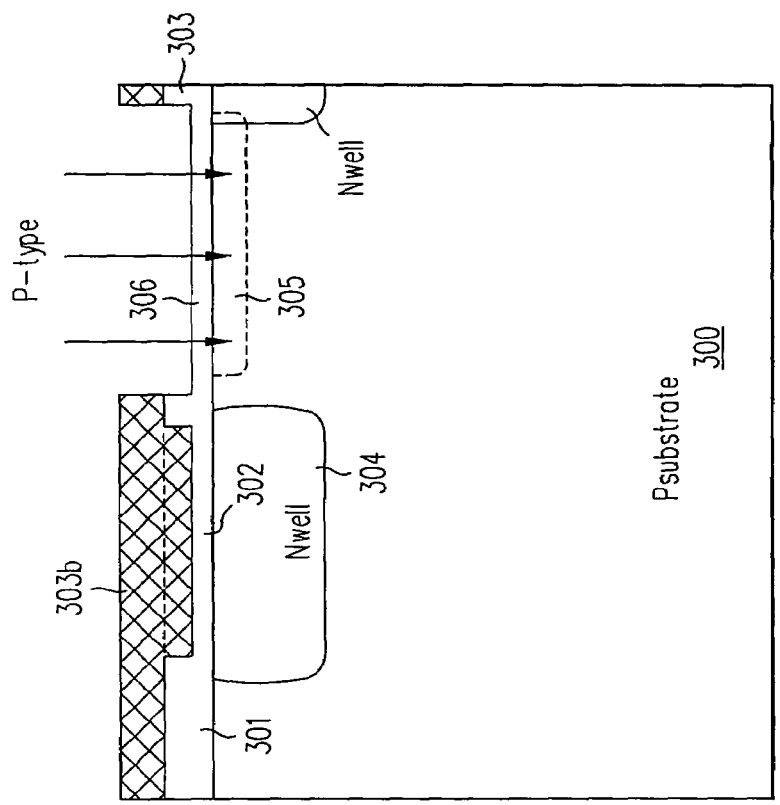
Figure 14C:
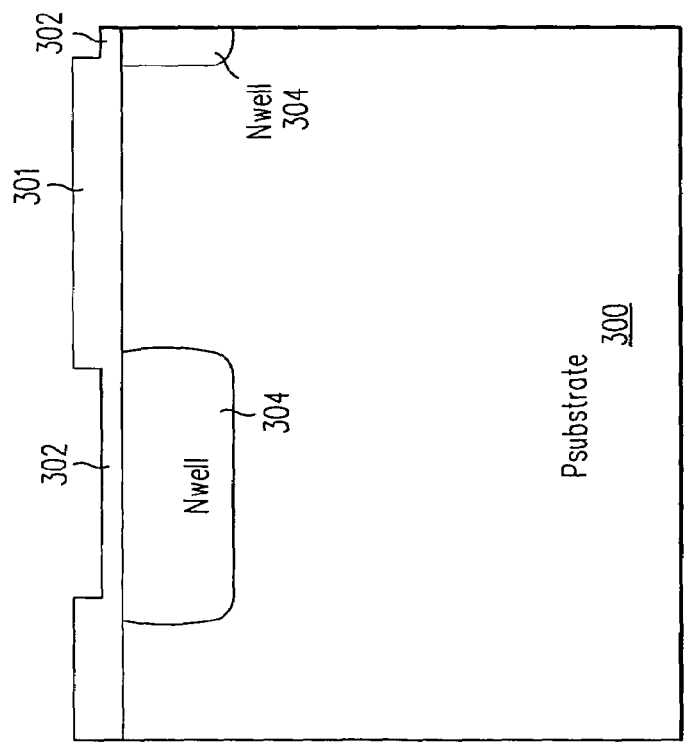
Figure 14F:
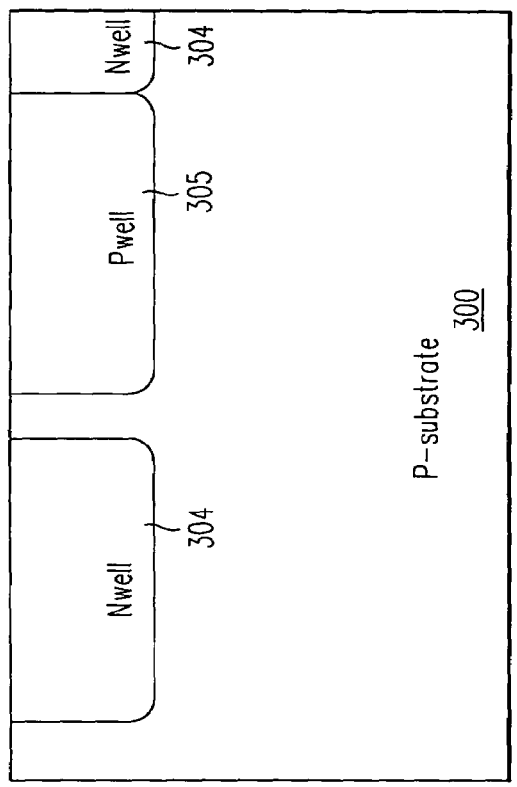

FIGS. 14A–14H illustrate a "hybrid" process which combines the conventional diffusion of N and P wells with the subsequent implanting of an deep N layer. FIG. 14A shows the formation of an oxide layer 301 on a P substrate 300. Oxide layer 301 can have a thickness from 100 Å to 1 µm, for example. In FIG. 14B oxide layer 301 has been masked with a photoresist layer 303a and a portion of oxide layer 301 has been etched through an opening in photoresist layer 303a to create a thin oxide layer 302. Oxide layer 302 can have a thickness from 50 to 1000 Å, preferably about 200 Å. Phosphorus is implanted at a low energy through the opening in photoresist layer 303a to form an N region 304. Typically the energy of the phosphorus implant is 80 to 160 keV and the dose is 1E12 to 5E13 cm$^{-2}$. As shown in FIG. 14C, N region 304 is diffused by a thermal process to form an N well 304. The diffusion may take place at 900 to 120° C. but preferably at around 1050 to 110° C. with the diffusion time ranging from 4 to 12 hours to reach a junction depth of 1 to 2 µm.

Figure 14E:
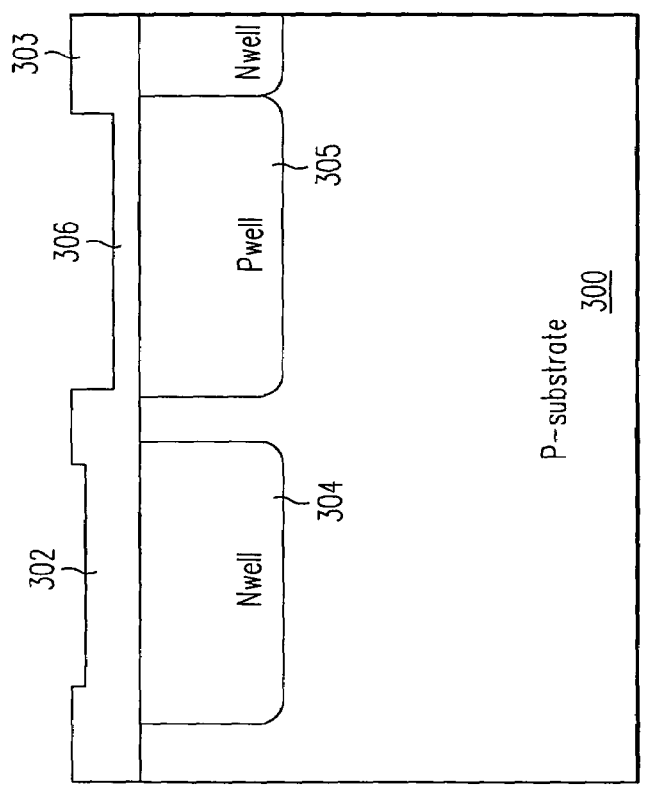

A second photoresist layer 303b is deposited and patterned and another portion of oxide layer 301 is etched through an opening in photoresist layer 303b to form a thin oxide layer 306, again about 200 Å thick, as shown in FIG. 14D. P-type dopant (boron) is implanted through the opening in photoresist layer 303b to form a P region 305. As shown in FIG. 14E, P region 305 is diffused by a thermal process to form a P well 305. The conditions for implanting and diffusing P well 305 are similar to those described above for implanting and diffusing N well 304. As indicated, P substrate 300 would typically contain a number of N wells 304 and P wells 305.

Thus far the process is a conventional, high thermal budget process, and the dopant profiles in N wells 304 and P wells 305 are Gaussian, with the doping concentration increasing as one moves downward from the surface of the substrate.

Figure 14G:
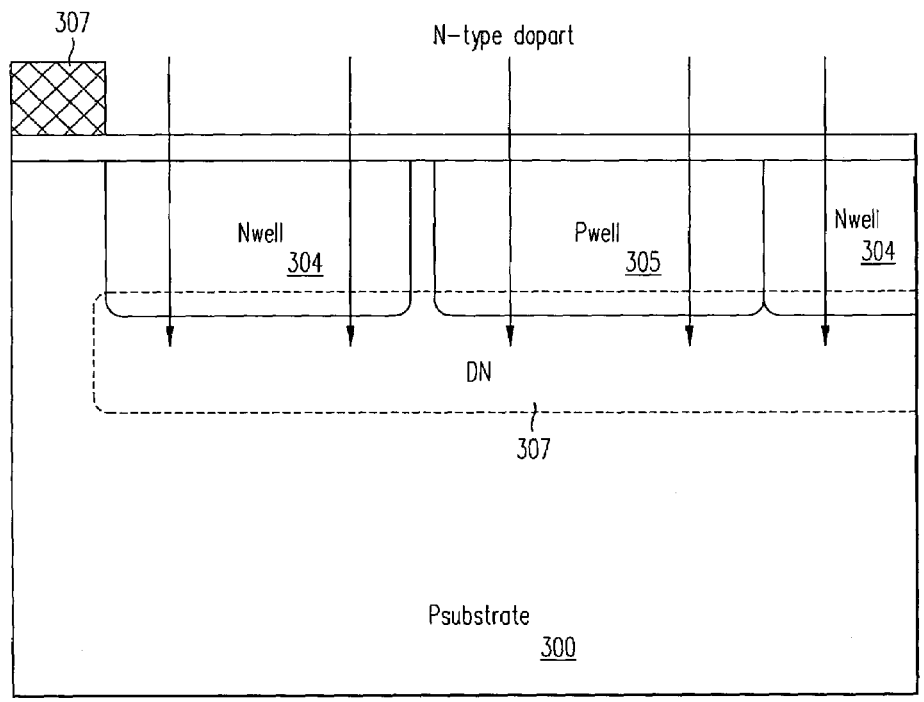
Figure 14H:
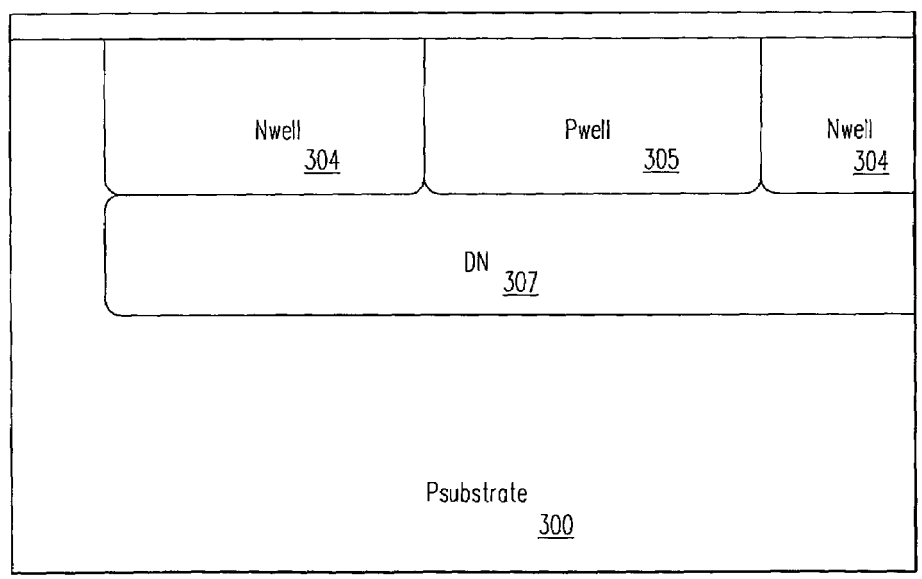

Next, as shown in FIG. 14G, oxide layers 302, 303 and 306 are stripped, and a third photoresist layer 307 is deposited and patterned with an opening over N wells 304 and P wells 305. Using a high-energy implant, a deep N layer 307 is formed in P substrate 300. The energy of the implant is set such that deep N layer 307 overlaps and extends below N wells 304 and, optionally, P wells 305. The implant energy ranges from 1.0 to 1.5 MeV, with 2.3 being the maximum for high volume, low cost production. Beyond about 2.3 MeV, the commonly available implanters suffer from low beam current and long processing times. Photoresist layer 307 is removed, yielding the structure shown in FIG. 14H.

Figure 15A:
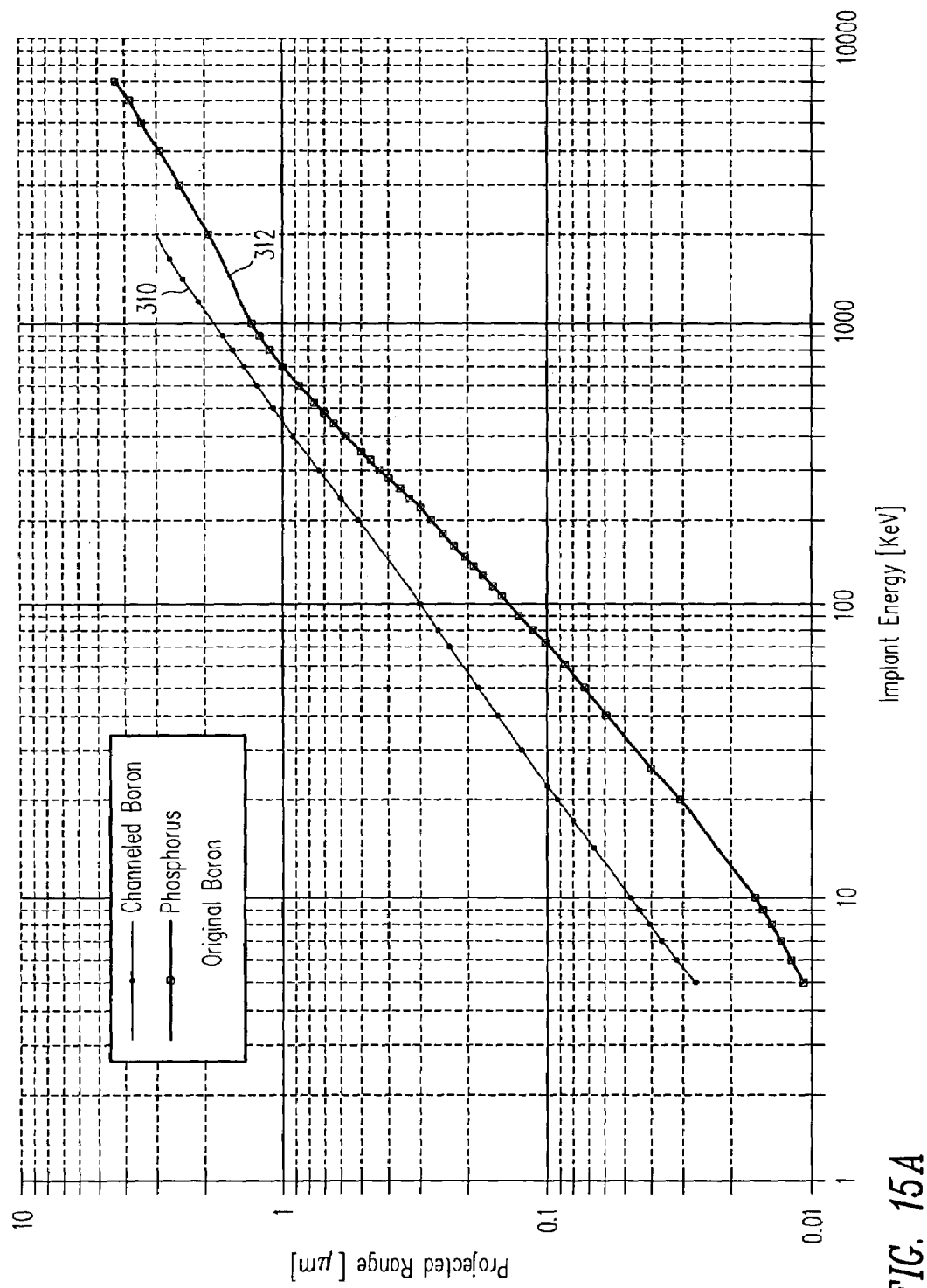
FIG. 15A is a graph showing the projected range $R_p$) of boron and phosphorus implants as a function of implant energy.

FIG. 15A is a graph showing the projected range R$_p$) of boron and phosphorus implants in silicon as a function of implant energy. Curve 310 shows the range for "channeling" boron and curve 312 shows the range for phosphorus and non-channeling boron. Because the channeling boron moves through channels in the crystal lattice its range is slightly greater than the range of the non-channeling boron.

Figure 15B:
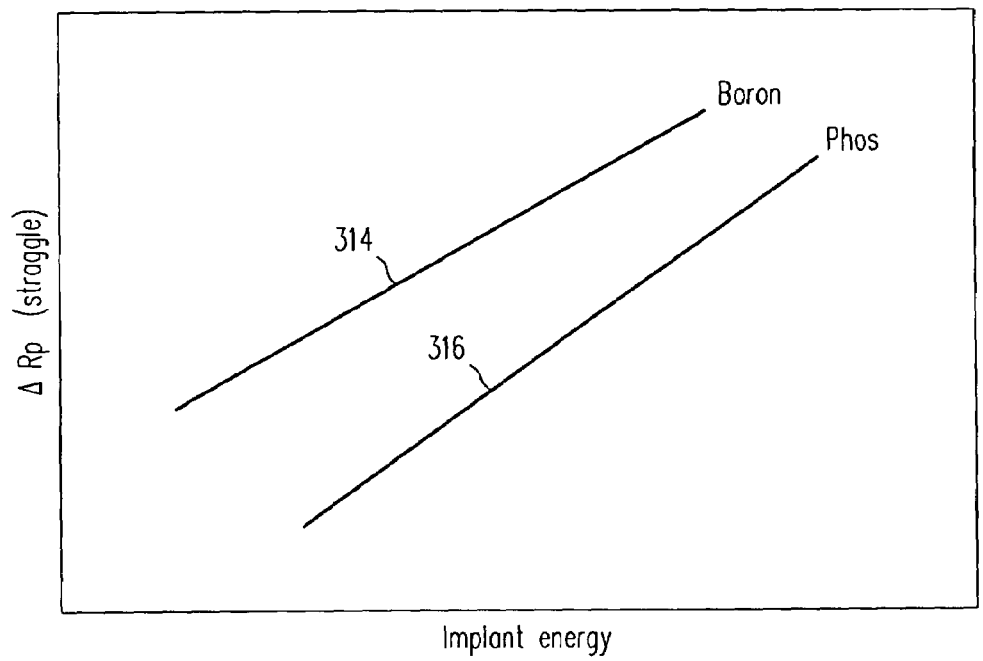
FIG. 15B is a graph of the straggle ($\Delta R_p$) for similar implants of boron and phosphorus.

FIG. 15B is a graph of the straggle (ΔR$_p$) for similar implants of boron and phosphorus. Curve 314 is the straggle for boron and curve 316 is the straggle for phosphorus.

Figure 16A:
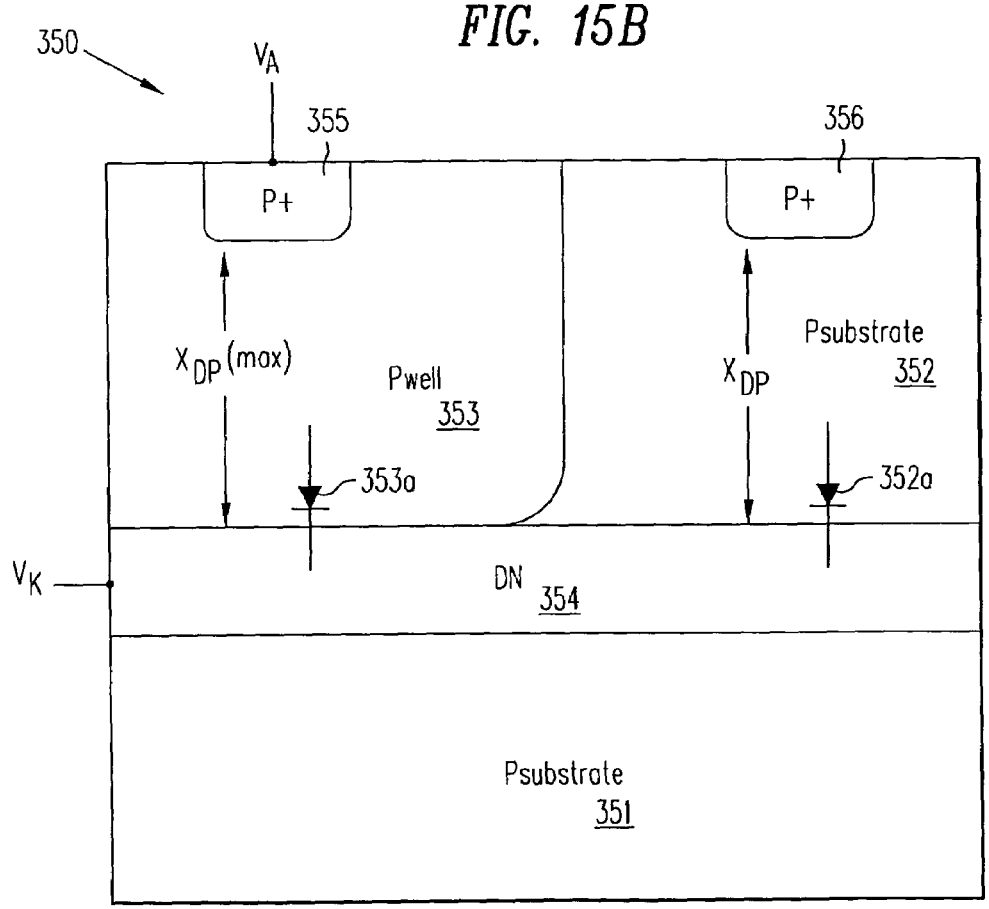
FIG. 16A shows the vertical dimension between the bottom of a P+ region and a deep isolating N layer in a P well and the vertical dimension between the bottom of a P+ region and a deep isolating N layer in a region of a P substrate.

FIG. 16A shows the vertical dimension X$_{DP}$(max) between the bottom of a P+ region 355 and a deep N layer 354 in a P well 353 and the vertical dimension X$_{DP}$ between the bottom of a P+ region 356 and deep N layer 354 in a region 352 of P substrate 351. It is assumed that P well 353 is more heavily doped than region 352. A diode 352a, formed by deep N layer 354, region 352 and P+ region 356, is essentially a PIN diode, whereas a diode 353a, formed by deep N layer 354 and P well 353, is a PN diode.

Figure 16C:
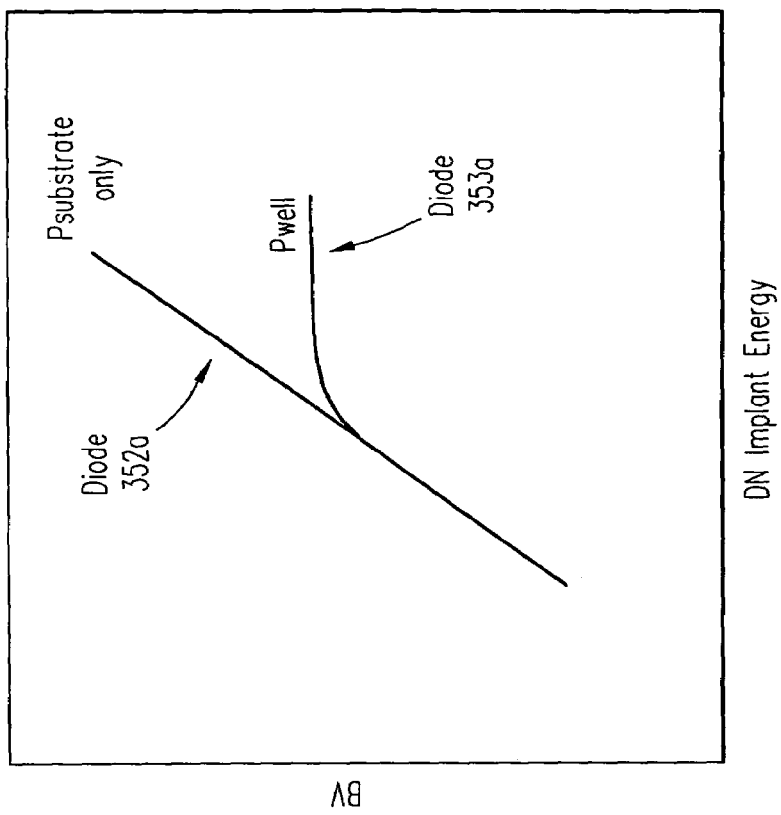
FIG. 16C shows the breakdown potential as a function of the implant energy of the deep isolating N layer.
Figure 16B:
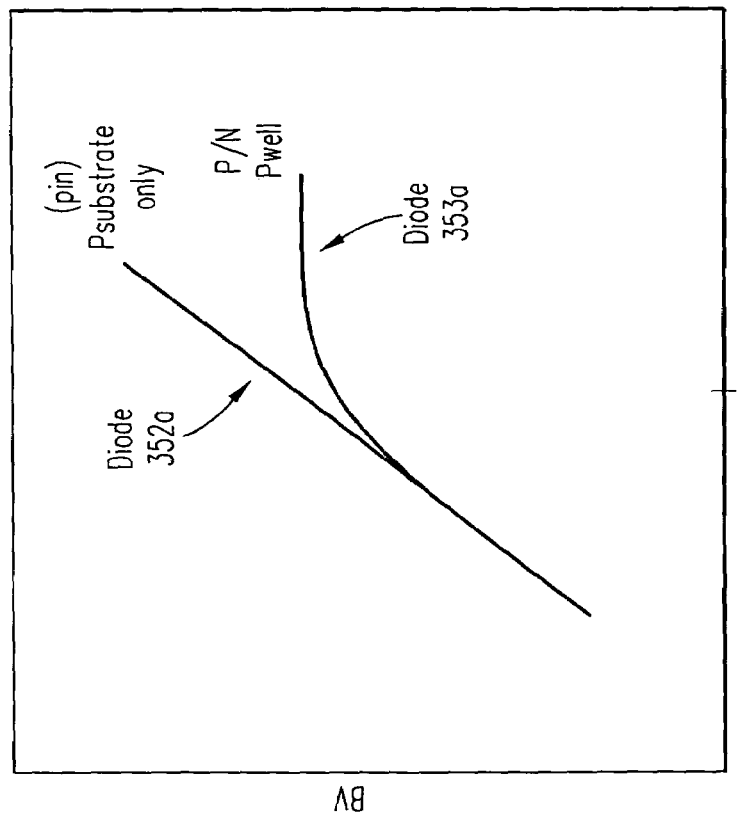
FIG. 16B is a graph showing how the breakdown voltages of diodes vary with the vertical dimensions shown in FIG. 16A.

FIG. 16B is a graph showing how the breakdown voltages BV of diodes 352a and 353a, respectively, vary with X$_{DP}$. As would be expected with a PIN diode, the BV of diode 352a varies as a function of X$_{DP}$ (i.e., the P substrate region 353 between deep N layer 354 and P+ region 356 is the intrinsic region of the PIN diode). The BV of diode 353a is essentially constant until X$_{DP}$ is reduced to a distance (X$_{DP}$)$_1$ and then coincides with the BV of diode 352a at distances less than (X$_{DP}$)$_1$. The BV of diode 352a is higher at values of X$_{DP}$ greater than (X$_{DP}$)$_1$. FIG. 16C shows the breakdown potential as a function of the implant energy of the deep N layer.

FIGS. 16A–16C thus illustrate how one variable, the depth of the deep N layer, X$_{DP}$, must be controlled to produce a device having a desired breakdown voltage. FIGS. 17A–17E illustrate how another variable, the range of the implant used to form the sidewall of the isolation region, must be controlled. As shown in FIG. 17A, device 380 contains an deep N layer 383 and a sidewall implant 384, which merge in a region designated 385. deep N layer 383 and sidewall implant 384 form a portion of an isolation region that encloses a region 382 of P substrate 381.

Figure 17B:
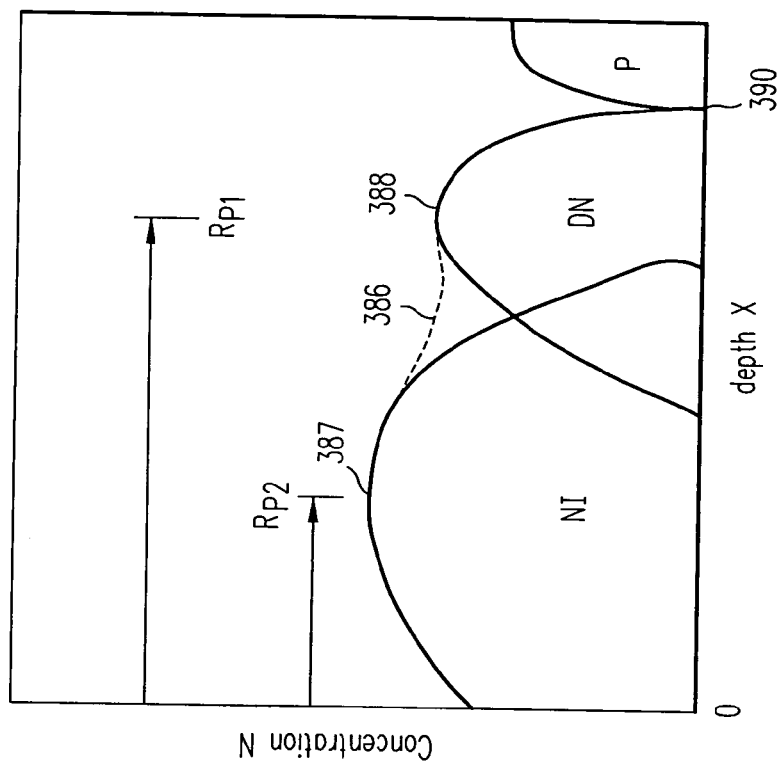
FIGS. 17A–17E illustrate how the range of the implant used to form the sidewall of the isolation region must be controlled to provide an effective isolation region.
Figure 17A:
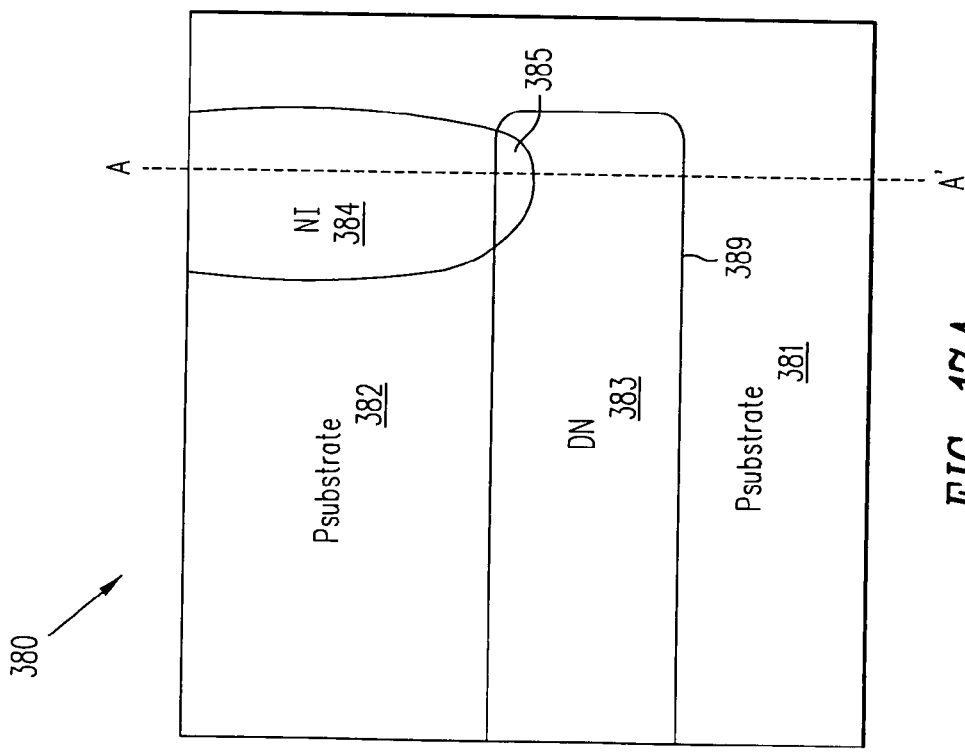

FIG. 17B, is a graph of the dopant profile taken at a section A–A' of FIG. 17A. Sidewall 384 has a range R$_{P2}$ with a peak concentration 387, and deep N layer has a range R$_{P1}$ with a peak dopant concentration 388. In the overlap region 385, the profiles of deep N layer 383 and sidewall 384 are superimposed, and the dopant concentration falls gradually in a curve 386 from the peak 387 to the peak 388. At the bottom of deep N layer 383 the net dopant concentration falls to zero at the junction between deep N layer 383 and P substrate 381. The doping concentration in the region of curve 386 should be as high as possible to achieve good isolation.

Figure 17C:
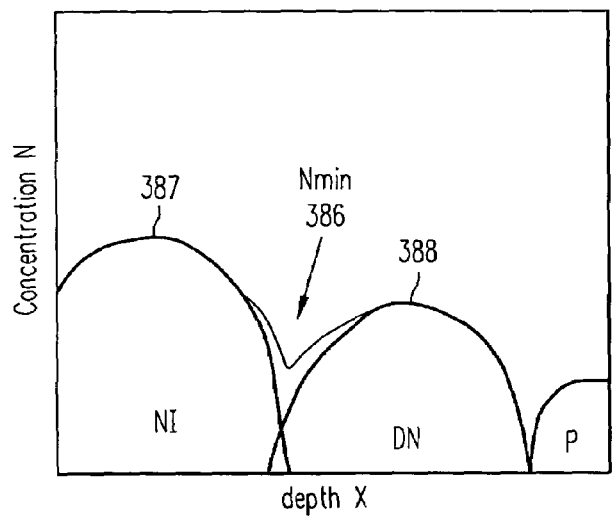
Figure 17D:
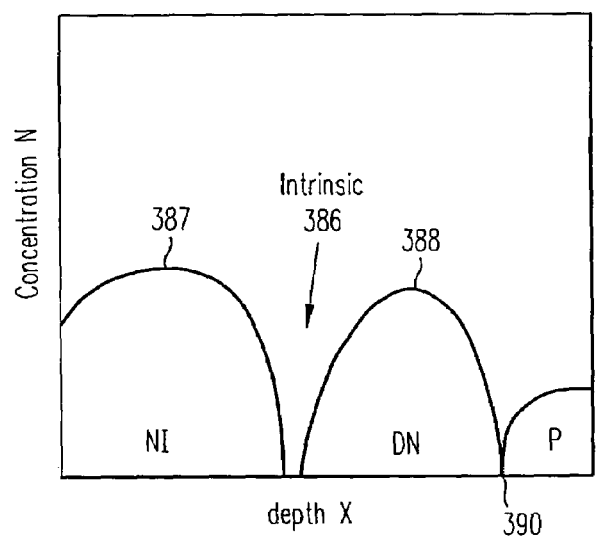

FIGS. 17C and 17D show two other possibilities. In FIG. 17C, the respective ranges of sidewall 384 and N buried region 383 are more widely separated, and as a result the dopant concentration represented by curve 386 falls to a minimum that is below the peak concentration 388 of deep N layer 383. This is a less desirable profile than the one shown in FIG. 17B. And FIG. 17D shows an embodiment wherein deep N layer 383 and sidewall 384 are separated by an intrinsic P region (as shown as a cross-section in FIG. 17E). This is an even less desirable embodiment as the isolation region is very leaky and the electrical behavior of the device is unpredictable.

Figure 17E:
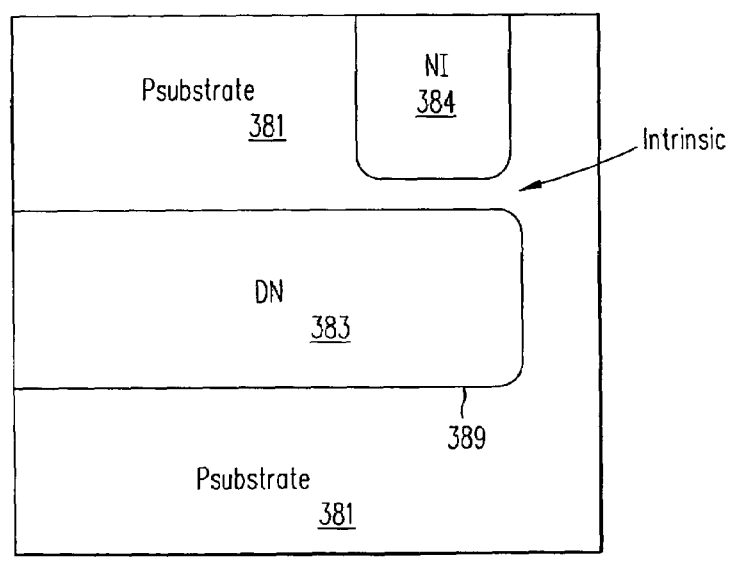
Figure 18D:
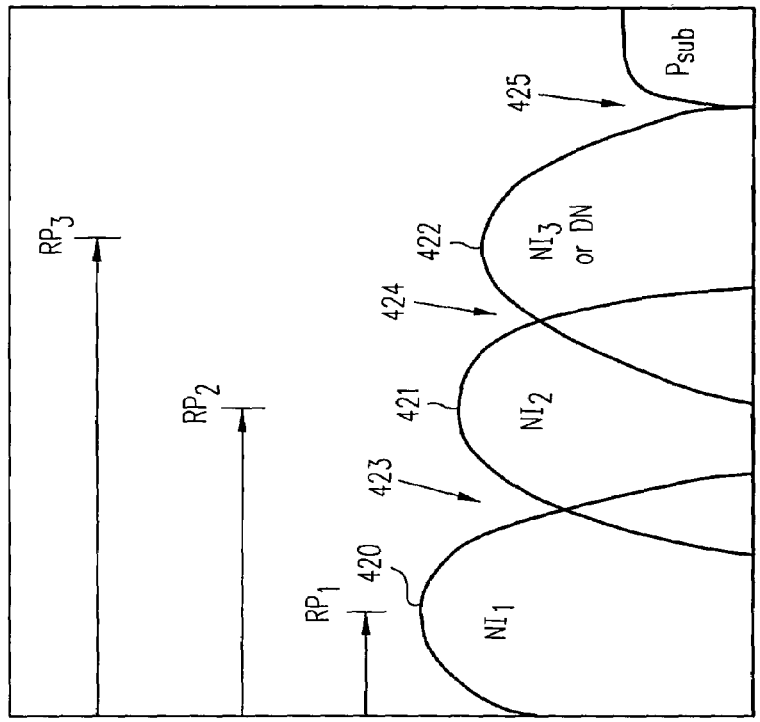

FIGS. 18A–18D illustrate a solution to the problem defined in FIGS. 17D and 17E, where the deep N layer is so deep that a gap is left between it and the sidewall. In FIG. 18A, a device 400 contains two overlapping implants 404 and 405 that have been made at different energies and depths to form a sidewall 406. The lower implant 404 also overlaps with the deep N layer 403. Together sidewall 406 and deep N layer 403 enclose a region 402 of a P substrate 401.

In FIG. 18B, four implants 411, 412, 413 and 414 have been made at successively greater energies and depths. Each of the implants 411-414 overlaps with the overlying and/or underlying implant to form a continuous vertical sidewall 419. The regions of overlap are designated 415–418.

Figure 18C:
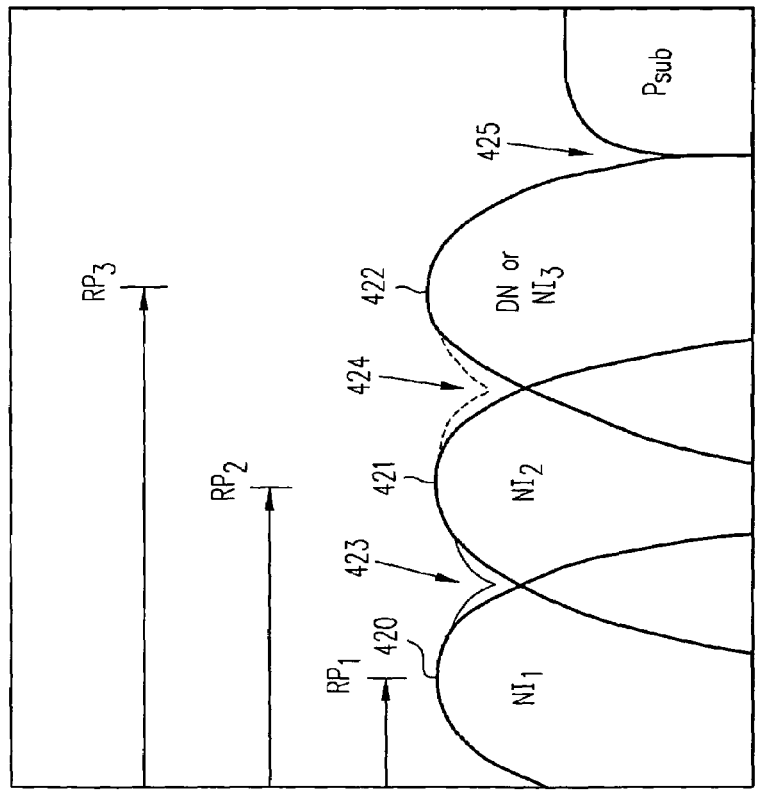

Similarly, depending on the height of the required sidewall, any number of implants can be used. Typically, each implant lasts only a fraction of a second and thus the entire wall can be formed quickly with a rapid succession of pulsed implants. FIGS. 18C and 18D are graphs of dopant profiles taken at vertical cross-sections through a sidewalls formed by a succession of pulsed implants. In both cases the implants $NI_1$, $NI_2$ and $NI_3$ (or deep N layer DN) have projected ranges of $RP_1$, $RP_2$ and $RP_3$ and peak dopant concentrations of 420, 421 and 422, respectively. In FIG. 18D, the dose of each implant is the same and as a result the peak concentration falls as the implant becomes deeper. This occurs because the straggle ($\Delta RP$) increases as the range increases; thus if the dose is the same the same number of impurity atoms are spread over a greater vertical distance and the peak doping concentration must necessarily become lower. This effect is overcome in the embodiment of FIG. 18C by increase the dose as the implant becomes deeper. As a result, the peak dopant concentration remains about the same in each implant.

Figure 19C:
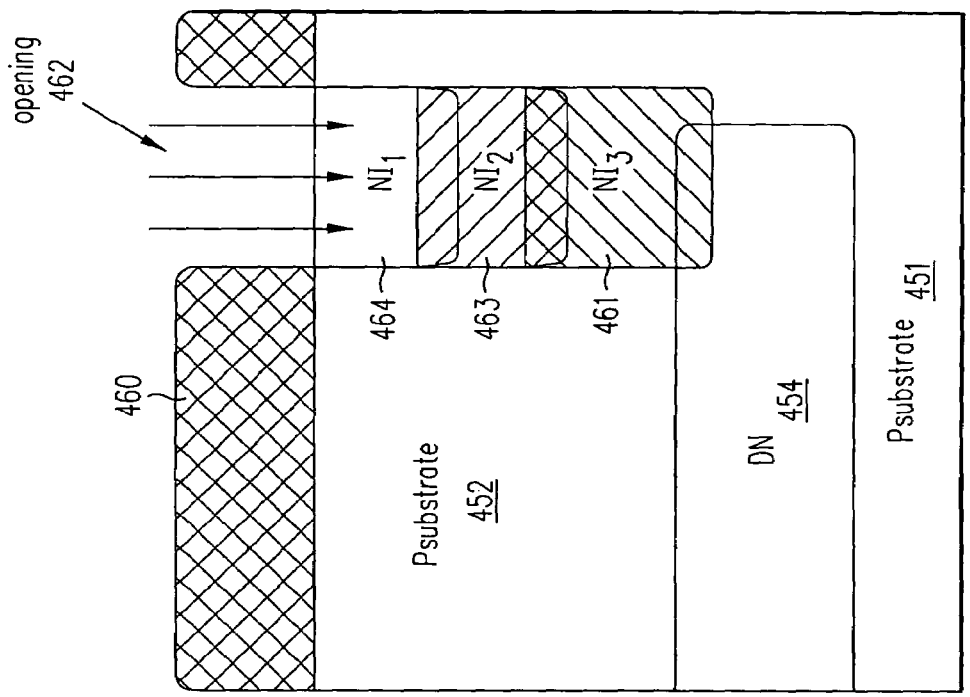
Figure 19D:
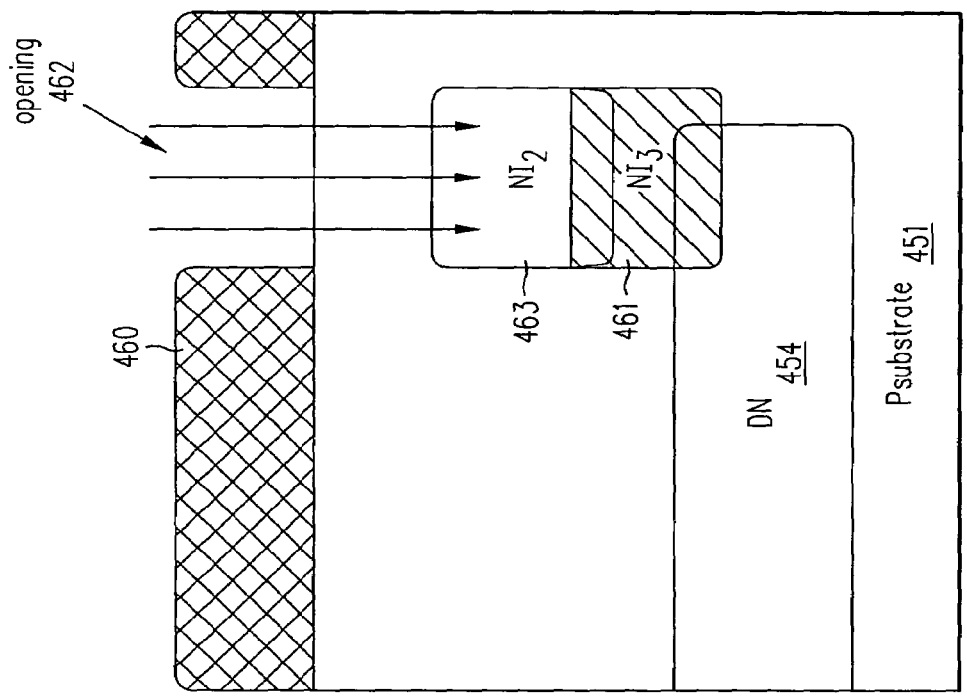

FIGS. 19A–19D illustrate the steps of a process for fabricating an isolation region having a sidewall of the kind shown in FIGS. 18A–18D. FIG. 19A shows the implanting of a deep N layer 454 in a P substrate 451 through an opening 450 in a photoresist layer 453. Photoresist layer 453 is removed and replaced by a photoresist layer 460. As shown in FIG. 19B, an opening 462 is formed in photoresist layer 460 and an implant 461 is made at an energy somewhat less than the energy used for deep N layer 454. This is followed by an implant 463 (FIG. 19C) and an implant 464 (FIG. 19D), each of which is made at a successively lower energy through the same opening 462 in photoresist layer 460. Since this process is carried out at a low temperature, there is very little horizontal spreading of the implants 461, 463 and 464, yielding a sharply defined, vertical sidewall. The result is an isolation structure that encloses a region 452 of P substrate 451.

Figure 20B:
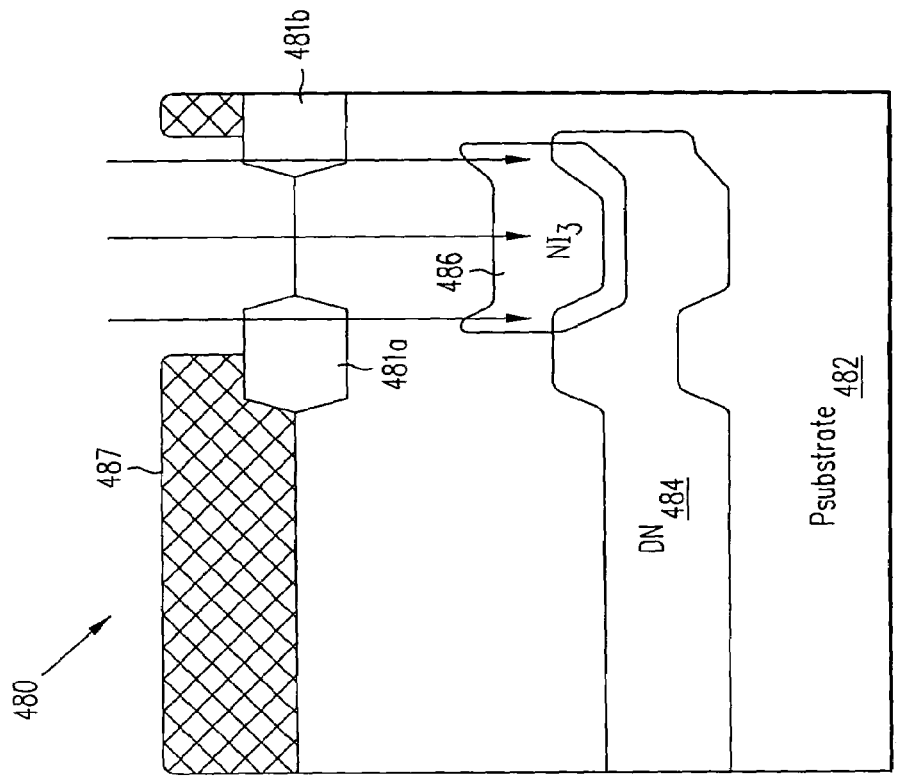
FIGS. 20A–20D show the steps of a similar process similar to that shown in FIGS. 19A–19D performed after field oxide regions have been grown on the surface of the substrate.
Figure 20A:
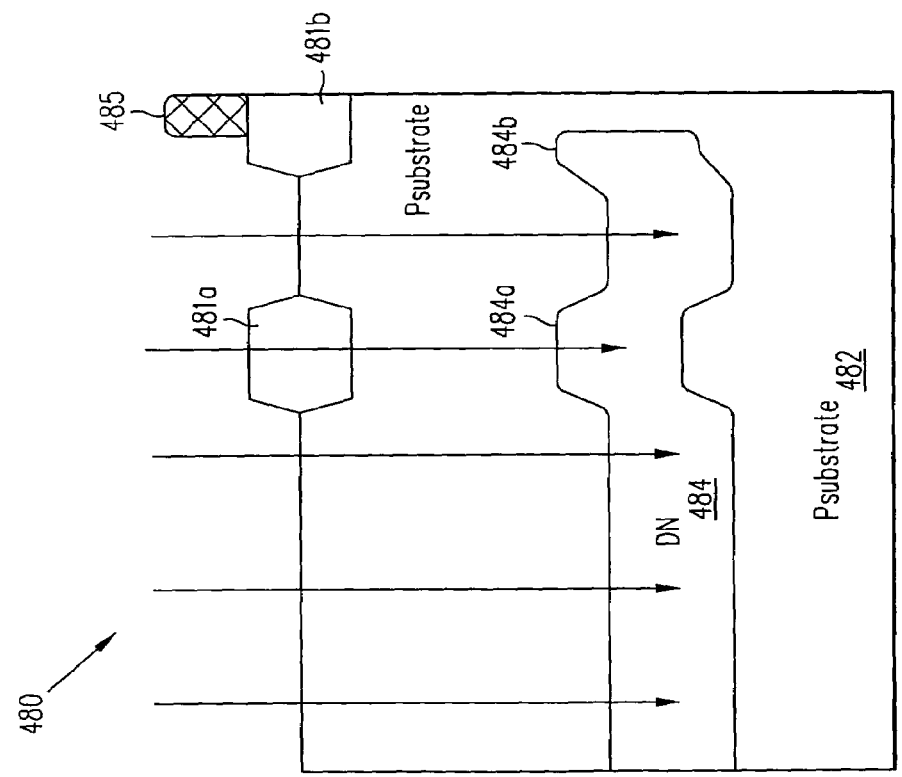
Figure 20D:
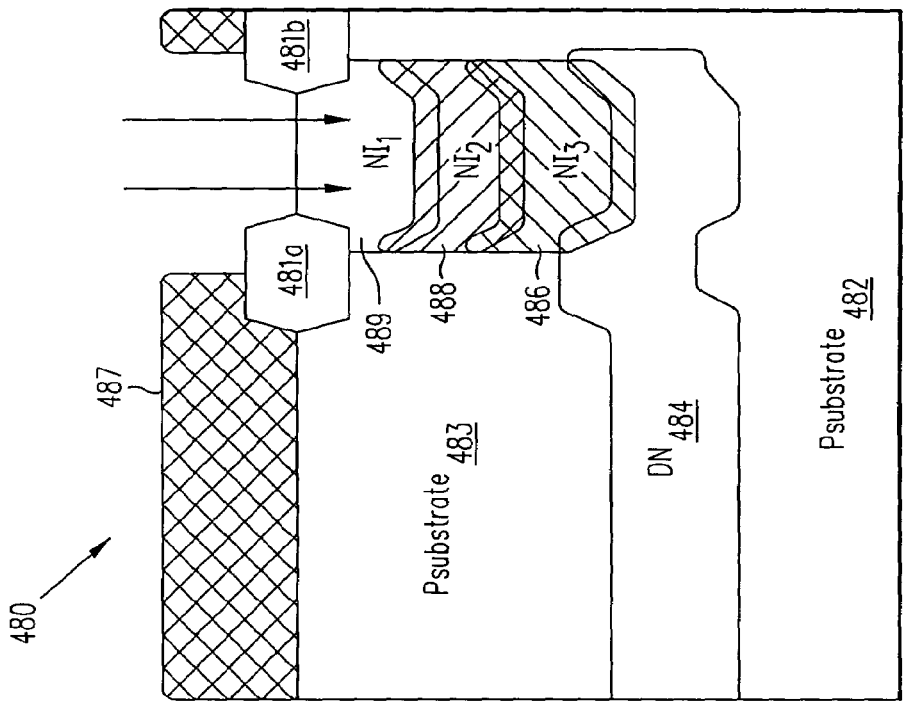
Figure 20C:
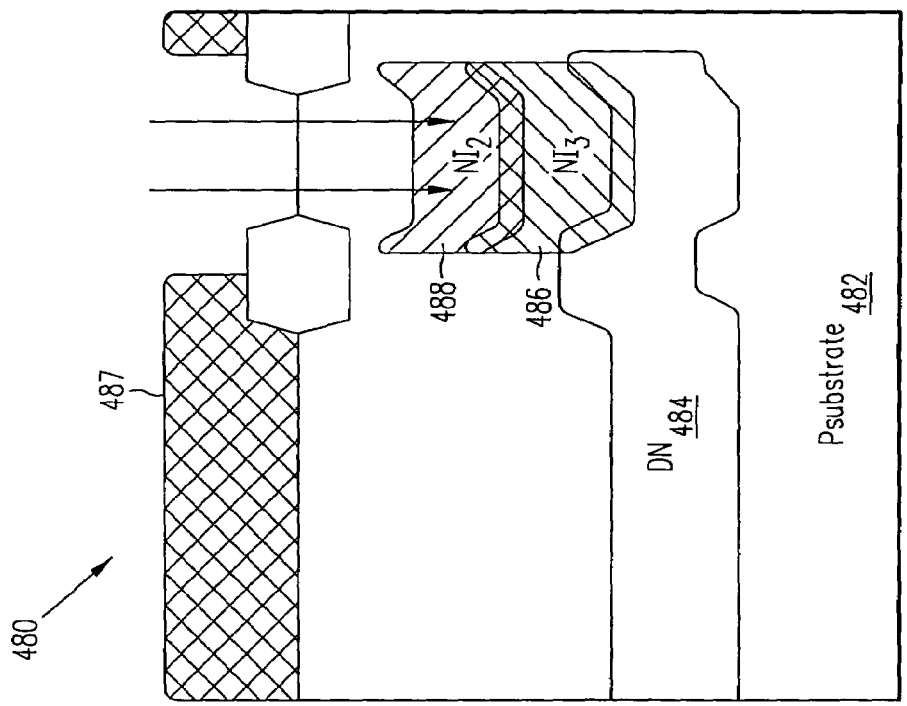

FIGS. 20A–20D show the corresponding steps of a similar process performed after field oxide regions 481a and 481b have been grown on the surface of P substrate 482. When deep N layer 484 is implanted through an opening in photoresist layer 485, field oxide regions 481a and 481b cause raised portions 484a and 484b to form in deep isolating layer 484. However, field oxide regions 481a and 481b cause implant 486 to have a saucer-shaped contour which compensates for the raised portions 484a and 484b of deep N layer 484 (FIG. 20B). Similarly, implants 488 and 489 also have a saucer shape that compensates for the shape of the underlying implant (FIGS. 20C and 20D). As a result, the sidewall shown in FIG. 20D which encloses a region 483 of P substrate 482, has essentially the same compact, vertical profile as the sidewall shown in FIG. 19D.

The number of implants can, in effect, be increased to infinity by providing an implant with a continually increasing energy instead of pulsed implants. If the concentration is to remain the same throughout the sidewall, the dose can also be increased with the energy.

Even though, as described above, a sidewall formed by this process has a very compact, vertical shape, there is some unavoidable horizontal diffusion of the dopant. This is shown in FIG. 21A, where despite an opening 507 in a photoresist layer 506 having a horizontal dimension $Y_{PR}$, the implants 504 and 505 have diffused laterally to dimensions $Y_{NI1}$ and $Y_{NI2}$, respectively, both of which are slightly greater than $Y_{PR}$. In fact the deeper the implant, the greater the extent of horizontal diffusion or "straggle", i.e. $Y_{NI2}$ would typically be greater than $Y_{NI1}$. Thus, if it is necessary to form a very deep isolation region, the amount of horizontal straggle that inherently results from the deep implants may exceed what is acceptable to achieve the desired minimum feature size of the device.

Figure 21B:
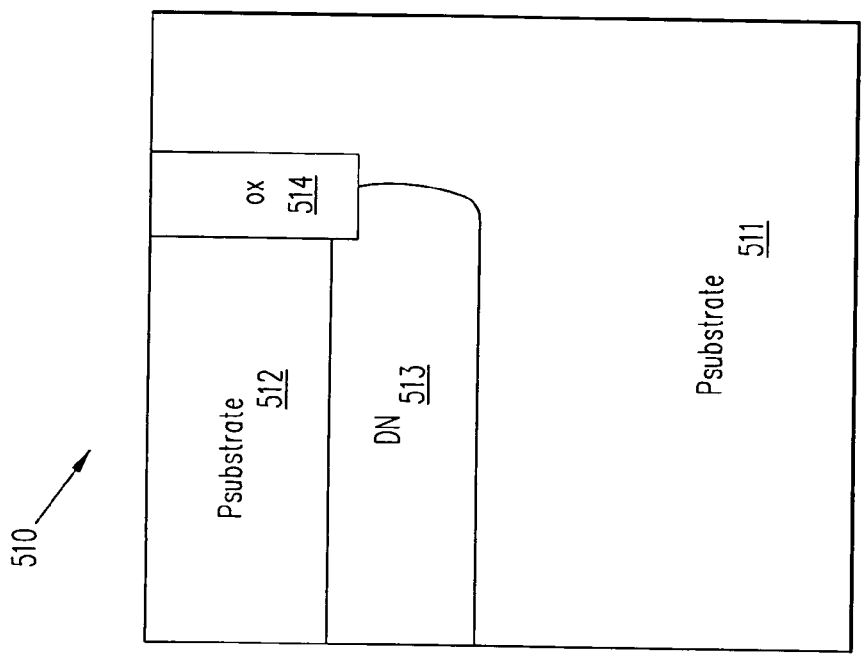
FIG. 21B illustrates an isolation structure formed by a deep isolating layer and an oxide-filled trench.
Figure 21A:
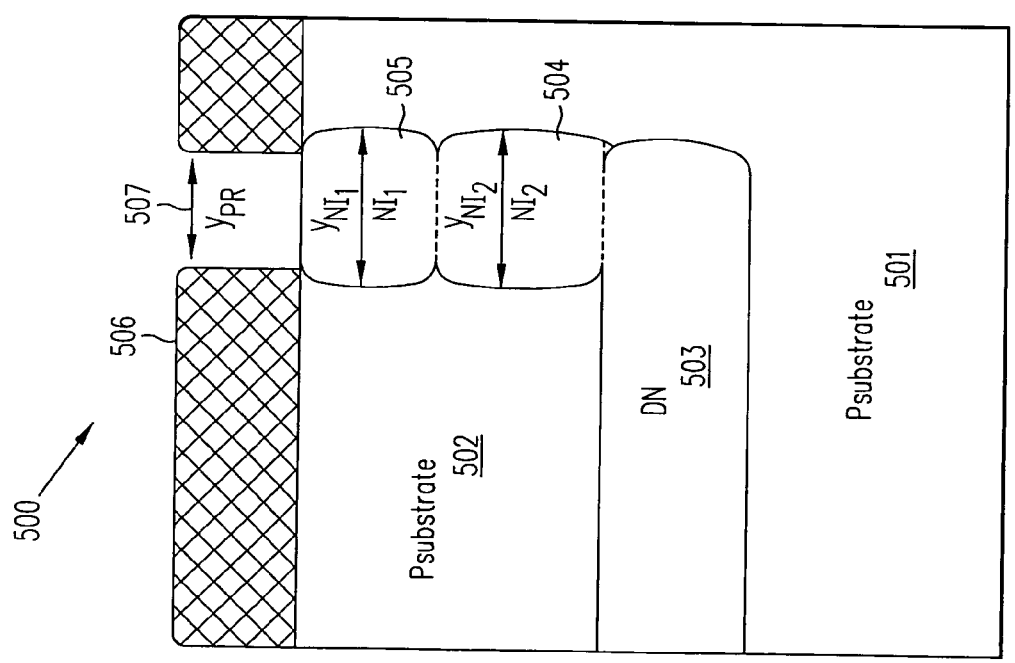
FIG. 21A illustrates the horizontal diffusion of implants in a sidewall of an isolation region.

One solution to this problem is illustrated in FIG. 21B, where an oxide-filled trench 514 is formed in a P substrate 511. Oxide-filled trench 514 abuts an deep N layer 513 to form an isolation region that encloses a region 512 of P substrate 511. This structure could be formed by implanting deep N layer 513, etching the trench, depositing an oxide in the trench (e.g., by a CVD process), and planarizing the top surface of the oxide fill.

Figure 21D:
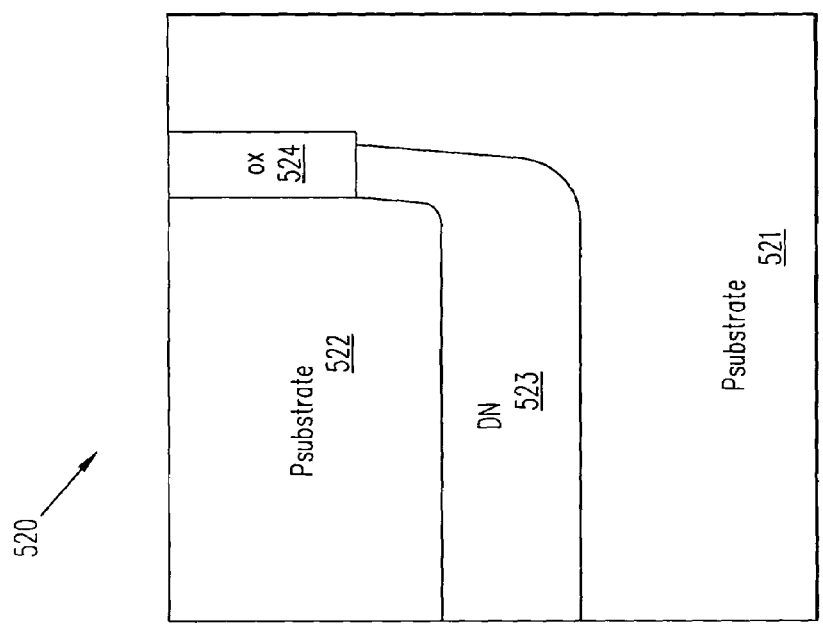
FIGS. 21C and 21D illustrate an isolation structure formed by implanting through an oxide-filled trench.
Figure 21C:
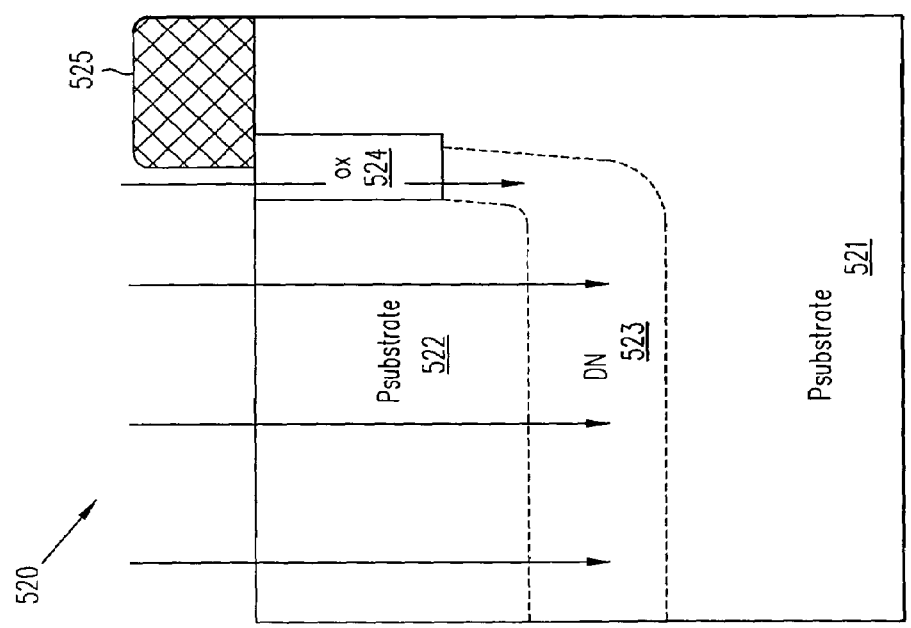

In some situations it may be difficult to achieve the proper overlap between the oxide-filled trench and the deep buried layer. This problem can be overcome using the technique illustrated in FIG. 21C, where an N-type dopant such as phosphorus is implanted through an oxide-filled trench 524, i.e., after the trench has been filled with the dielectric. The surface of P substrate 521 is masked with a photoresist layer 525. Because the oxide in trench 524 is slightly more resistant to the passage of the dopant than the substrate, a deep N layer 523 having a slight cup or saucer shape is formed, extending downward from the bottom of trench 524 and turning in a horizontal direction and then turning upwards towards the bottom of a neighboring trench (not shown). Photoresist layer 525 is removed, yielding the structure shown in FIG. 21D. Note that for clarity the curvature of deep N 523 is exaggerated.

Figure 22B:
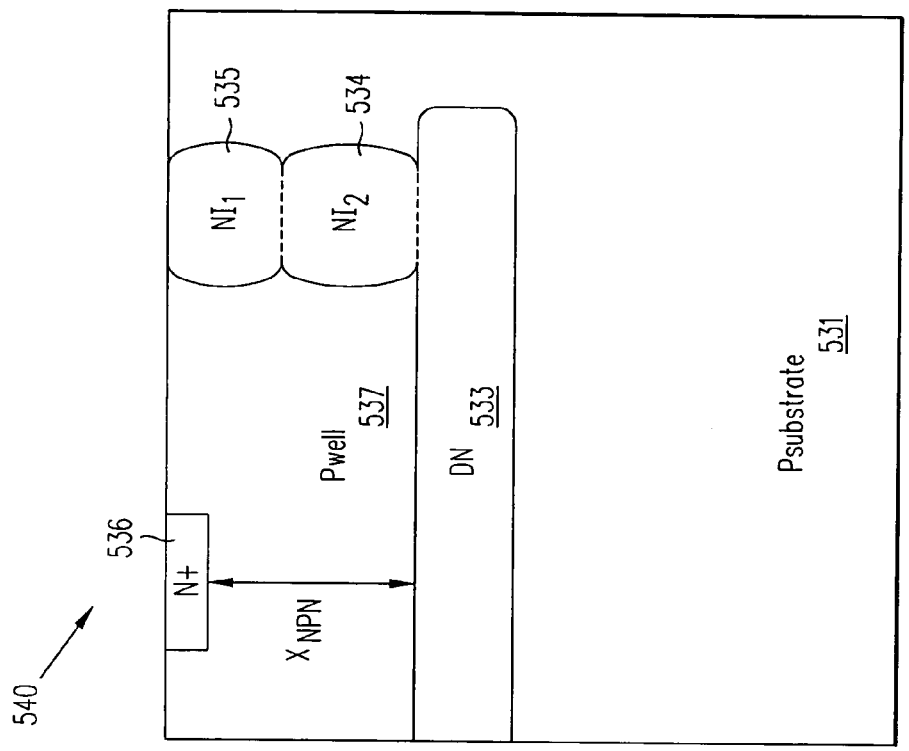
FIGS. 22A and 22B show isolation structures and the vertical separation between a deep isolating layer and a heavily-doped region at the surface of the substrate in each structure.
Figure 22A:
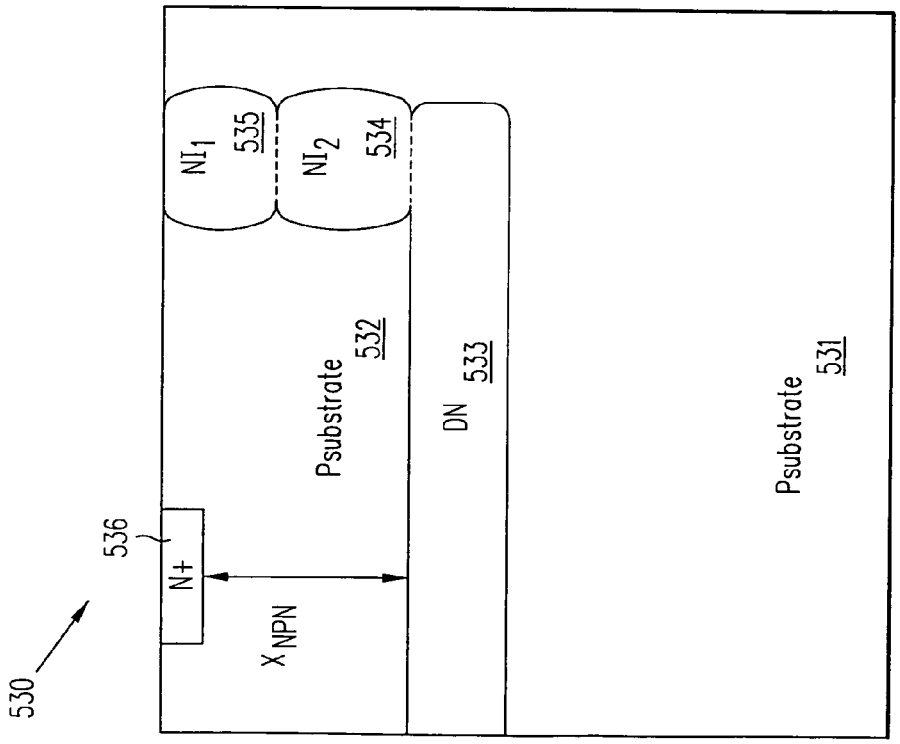

Another criterion that the designer must be concerned about is the possibility of punchthrough breakdown between a deep layer and a heavily-doped region at the surface of the substrate. This problem is illustrated in FIGS. 22A and 22B. FIG. 22A shows a device 530 with a region 532 of P substrate 531 enclosed by a deep N layer 533 and sidewall implants 534 and 535. Deep N layer 533 is separated by a vertical distance $X_{NIN}$ from an N+ region 536 at the surface of P substrate 531. Contrast this with device 540 shown in FIG. 22B, which is the same except that a more heavily-doped P well 537 has been formed in the enclosed region, and deep N layer 533 is separated from N+ region 536 by a vertical distance $X_{NPN}$.

Figure 22C:
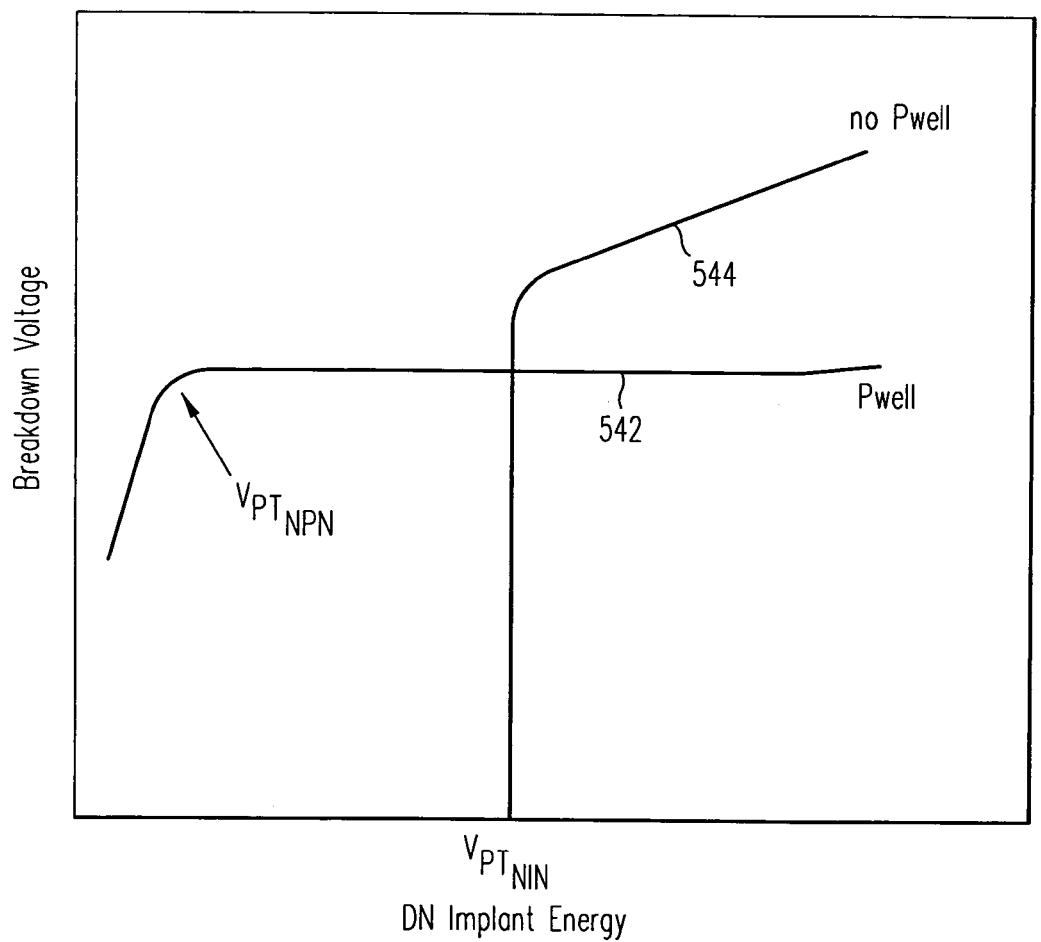
FIG. 22C is a graph of the breakdown voltage between the deep isolating layer and the heavily-doped region in each of the structures shown in FIGS. 22A and 22B.

FIG. 22C is a graph showing the variation of the breakdown voltage between N+ region 536 and deep N layer 533 as a function of the implant energy used to form deep N layer 533 (which is directly related to the vertical distances $X_{NIN}$ and $X_{NPN}$ shown in FIGS. 22A and 22B). As indicated, in device 540 (curve 542) the breakdown voltage remains essentially constant until the deep N layer becomes quite shallow, where punchthrough occurs at $V_{PT}$ (NPN). In device 530 (curve 544) the breakdown voltage varies directly with the implant energy of the deep N layer until punchthrough occurs at $V_{PT}$ (NIN), which is considerably higher than $V_{PT}$ (NPN). Thus providing a P well reduces the breakdown voltage generally but makes the breakdown voltage relatively insensitive to the vertical distance $X_{NPN}$ until punchthrough occurs. Leaving the P substrate "as is" in the enclosed region increases the breakdown voltage when the vertical distance $X_{NIN}$ is relatively large, but the breakdown voltage is sensitive to $X_{NIN}$ and punchthrough occurs at a larger value of $X_{NIN}$.

Processes that rely on high temperature diffusions result in the diffusion and redistribution of all dopants present in the silicon during the high temperature processes. The total "hot time", i.e. the time during which the substrate is subjected to high temperature, is commonly referred to as the "thermal budget" of a process. Since IC and transistor fabrication processes generally use a sequence of steps that may involve different temperature diffusions of various durations, it is generally not easy to compare the cumulative thermal budget of widely dissimilar processes using only temperature and time. The first dopants introduced into the silicon in any process however, do in fact experience diffusion during the entire thermal budget of the processes, and therefore the "thermal budget" of a process is measured from the time that the first dopants are introduced into the substrate. The movement of these dopants during thermal processing is governed by Fick's law of diffusion as described in A. S. Grove, *Physics and Technology of Semiconductor Devices* (1967), p. 50, as an equation describing a Gaussian dopant profile of concentration N(x) as a function of time, diffusivity, and implant dose Q, as given by the equation $$N(x) = No \cdot e^{-\frac{x^2}{4Dt}}$$

where D is the diffusivity of the dopant in the substrate, t is time, and No is the surface concentration at any given time in the diffusion expressed in terms of the implant dose Q by the relation $$No = \frac{Q}{\sqrt{\pi(Dt)}}$$

The two equations together reveal that an increase in the thermal budget Dt lowers both the surface concentration No and the concentration of the dopant at any depth N(x) in proportion. Rearranging the equation for junction depth xj of any diffusion yields $$x_j = \sqrt{-4(Dt)\ln\left(\frac{N(x_j)}{No}\right)}$$

where N(xj) is the concentration of the background doping of the opposite conductivity type layer into which the diffusion occurs. So the depth of a junction is roughly proportional to the square root of its "Dt" thermal budget. Dt can therefore be used to describe a single diffusion or a sequence of many diffusions of differing time and temperature simply by summing the Dt value for each portion into a total Dt for the entire process.

The diffusivity D is a function of temperature T, the dopant species (e.g. boron B, phosphorus P, arsenic As or antimony Sb) and in some cases like phosphorus depends slightly on concentration. The diffusivity of these dopants is given in O. D. Trapp et al., *Semiconductor Technology Handbook*, (1980 Ed.), p. 4–6, or by simulation.

A process in accordance with this invention may use a very low thermal budget process such as the one shown in Table I below, for example, wherein the majority of the diffusion, i.e. the largest Dt, occurs during the formation of the gate oxide and the S/D implant oxidation. The motivation for higher temperature gate oxidation (850° C.) is to obtain high quality oxide. The S/D implant oxidation is used to densify the sidewall oxide of the gate's sidewall spacers, which originally is deposited.

TABLE III

Example of Low Thermal Process

| Process Step | Temp (C) | Time (min) | Boron Dt (step) | Boron Dt (sum) | Phosphorus Dt (step) | Phosphorus Dt (sum) |
|---|---|---|---|---|---|---|
| Gate Ox 1 | 850 | 75 | 0.000340 | 0.000340 | 0.00451 | 0.00451 |
| Gate Ox 2 | 850 | 52 | 0.000236 | 0.000576 | 0.00313 | 0.00764 |
| S/D Ox | 850 | 56 | 0.000254 | 0.000830 | 0.00337 | 0.01101 |
| RTA | 960 | 0.4 | 0.000017 | 0.000847 | 0.00005 | 0.01106 |
| RTA | 900 | 0.3 | 0.000003 | 0.000850 | 0.00004 | 0.01110 |

Thus the cumulative thermal budget is the sum of all the Dt values of all the individual steps. In the exemplary process described above, the total Dt for boron is 0.00085 $\mu m^2$ and for phosphorus is 0.01110 $\mu m^2$. In general, a low thermal budget can be considered as one where the majority of its thermal budget occurs in less than 4 total hours at 850° C., or (considering a variety of process flows) where the total Dt thermal budget is under 0.03 $\mu m^2$ for boron or 0.05 $\mu m^2$ for phosphorus.

An alternative embodiment uses a medium thermal budget for a field oxidation, or partial well diffusions, that may comprise two to three hours of hot time, at temperatures of 1000° C. or higher, but not above 1100° C. (see Table II). During this period, substantial but not intolerable dopant redistribution of dopant may occur, especially in deep implanted layers. Medium thermal budgets can be approximated by those with Dt values under 0.3 $\mu m^2$ for boron and under 0.5 $\mu m^2$ for phosphorus, or roughly one order of magnitude higher than a low thermal budget process flow.

TABLE IV

Medium Thermal Budget Steps

| Process Step | Temp (C.) | Time (min) | Boron Dt (step) | Phosphorus Dt (step) |
|---|---|---|---|---|
| Field Oxidation | 1000 | 120 | 0.0141 | 0.0212 |
| | 1050 | 120 | 0.0481 | 0.0707 |
| | 1100 | 120 | 0.1458 | 0.2380 |

In contrast, conventional high thermal budget processes used for deep high voltage wells, deep isolation junctions, high voltage bipolar base diffusions, and DMOS transistor body diffusions as exemplified in Table III may comprise very long diffusions, typically from 3 hours to 15 hours depending on the required depths. These diffusions cause significant redistribution of all dopants, especially deep buried layers or junctions.

TABLE V

High Thermal Budget Process Steps

| Process Step | Temp (C.) | Time (hrs) | Boron Dt (step) | Phosphorus Dt (step) |
|---|---|---|---|---|
| Conventional Base Diffusion | 1100 | 6 | 0.4374 | 0.714 |
| DMOS Body Diffusion | 1100 | 10 | 0.729 | 1.190 |
| Junction Isolation Diffusion | 1100 | 15 | 1.094 | 1.785 |

The foregoing embodiments are to be treated as illustrative and not limiting. Many additional embodiments in accordance with the broad principles of this invention will be apparent to person skilled in the art.

We claim:

1. A process of fabricating a semiconductor device comprising:

providing a semiconductor substrate of a first conductivity type, the substrate not containing an epitaxial layer;

implanting a dopant of a second conductivity type so as to form an annular region of the second conductivity type, the annular region enclosing an enclosed region of the substrate;

heating the substrate so as to diffuse the annular region;

implanting a dopant of the first conductivity type so as to form a well of the first conductivity type in the enclosed region;

heating the substrate so as to diffuse the well; and implanting a dopant of the second conductivity type so as to form a deep layer, the deep layer overlapping the annular region so as to form an isolation region.

* * * * *